(12) United States Patent　　(10) Patent No.: US 11,245,040 B2
Yamazaki et al.　　(45) Date of Patent: Feb. 8, 2022

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Katsuaki Tochibayashi, Kanagawa (JP); Satoru Okamoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/970,567

(22) PCT Filed: Feb. 21, 2019

(86) PCT No.: PCT/IB2019/051398
§ 371 (c)(1),
(2) Date: Aug. 17, 2020

(87) PCT Pub. No.: WO2019/166921
PCT Pub. Date: Sep. 6, 2019

(65) Prior Publication Data
US 2021/0119053 A1　Apr. 22, 2021

(30) Foreign Application Priority Data
Mar. 2, 2018　(JP) ............... JP2018-037162

(51) Int. Cl.
*H01L 29/786* (2006.01)
*H01L 29/22* (2006.01)
*H01L 29/51* (2006.01)

(52) U.S. Cl.
CPC .......... *H01L 29/7869* (2013.01); *H01L 29/22* (2013.01); *H01L 29/517* (2013.01)

(58) Field of Classification Search
CPC ....... H01L 29/22; H01L 29/51; H01L 29/517; H01L 29/78; H01L 29/786; H01L 29/7869
(Continued)

(56) References Cited

U.S. PATENT DOCUMENTS 8,501,564 B2 * 8/2013 Suzawa ............... H01L 27/1255
438/266
8,823,074 B2　9/2014 Suzawa et al.
(Continued)

FOREIGN PATENT DOCUMENTS

CN　　107210227 A　　9/2017
JP　　2011-139055 A　　7/2011
(Continued)

OTHER PUBLICATIONS

International Search Report (Application No. PCT/IB2019/051398) dated Jun. 4, 2019.
(Continued)

*Primary Examiner* — Monica D Harrison
(74) *Attorney, Agent, or Firm* — Fish & Richardson P.C.

(57) ABSTRACT

A semiconductor device having a high on-state current is provided. The semiconductor device includes a first insulator; a first oxide over the first insulator; a first conductor and a second conductor that are apart from each other over the first oxide; a second insulator covering the first insulator, the first oxide, the first conductor, and the second conductor; a third insulator over the second insulator; a fourth insulator in contact with a first conductor, a side surface of the second conductor, a side surface of the second insulator, and a side surface of the third insulator; a fifth insulator that is over the first oxide and on an inner side of the fourth insulator; a third conductor on an inner side of the fifth insulator; and a sixth insulator that is in contact with a top surface of the fourth
(Continued)

insulator and over the third insulator, the fifth insulator, and the third conductor. The fourth insulator is divided to be apart from each other over the first oxide.

16 Claims, 28 Drawing Sheets

(58) Field of Classification Search
USPC .......................................................... 257/43
See application file for complete search history.

(56) References Cited

U.S. PATENT DOCUMENTS

| | | |
|---|---|---|
| 9,064,967 B2 | 6/2015 | Suzawa et al. |
| 10,186,614 B2 | 1/2019 | Asami |
| 2011/0133177 A1 | 6/2011 | Suzawa et al. |
| 2018/0019343 A1 | 1/2018 | Asami |
| 2018/0033892 A1 | 2/2018 | Yamane et al. |

FOREIGN PATENT DOCUMENTS

| | | |
|---|---|---|
| JP | 2013-179289 A | 9/2013 |
| KR | 2017-0107997 A | 9/2017 |
| TW | 201137987 | 11/2011 |
| WO | WO-2011/068028 | 6/2011 |
| WO | WO-2016/125052 | 8/2016 |

OTHER PUBLICATIONS

Written Opinion (Application No. PCT/IB2019/051398) dated Jun. 4, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC—IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2019/051398, filed on Feb. 21, 2019, which is incorporated by reference and claims the benefit of a foreign priority application filed in Japan on Mar. 2, 2018, as Application No. 2018-037162.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor that has lower crystallinity than an oxide semiconductor having the CAAC structure or the nc structure.

In addition, a transistor using IGZO for an active layer has an extremely low off-state current (see Non-Patent Document 6), and an LSI and a display utilizing the characteristics have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Another object of one embodiment of the present invention is to provide a semiconductor device having high frequency characteristics. Another object of one embodiment of the present invention is to provide a semiconductor device with favorable reliability. Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device that can retain data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the descriptions of these objects do not disturb the existence of other objects. One embodiment of the present invention does not have to achieve all the objects. Other objects are apparent from and can be derived from the description of the specification, the drawings, the claims, and the like.

Means for Solving the Problems

One embodiment of the present invention is a semiconductor device including a first insulator; a first oxide over the first insulator; a first conductor and a second conductor that are apart from each other over the first oxide; a second insulator covering the first insulator, the first oxide, the first conductor, and the second conductor; a third insulator over the second insulator; a fourth insulator in contact with a first conductor, a side surface of the second conductor, a side surface of the second insulator, and a side surface of the third insulator; a fifth insulator that is over the first oxide and on an inner side of the fourth insulator; a third conductor on an inner side of the fifth insulator; and a sixth insulator that is in contact with a top surface of the fourth insulator and over the third insulator, the fifth insulator, and the third conductor. The fourth insulator is divided to be apart from each other over the first oxide.

Another embodiment of the present invention is a semiconductor device including a first insulator; a first oxide over the first insulator; a first conductor and a second conductor that are apart from each other over the first oxide; a second insulator covering the first insulator, the first oxide, the first conductor, and the second conductor; a third insulator over the second insulator; a fourth insulator in contact with a first conductor, a side surface of the second conductor, a side surface of the second insulator, and a side surface of the third insulator; a second oxide in contact with the first oxide and an inner side of the fourth insulator; a fifth insulator on an inner side of the second oxide; a third conductor on an inner side of the fifth insulator; and a sixth insulator that is in contact with a top surface of the fourth insulator and over the third insulator, the second oxide, the fifth insulator, and the third conductor.

In the above, the fourth insulator is preferably in contact with a side surface of the first conductor and the side surface of the second conductor.

In the above, the fourth insulator is preferably in contact with the first oxide.

In the above, the first oxide preferably contains In, an element M (M is Al, Ga, Y, or Sn), and Zn.

In the above, the fourth insulator preferably contains one or both of hafnium and aluminum.

In the above, the sixth insulator is preferably in contact with the third conductor.

In the above, the second insulator preferably has a stacked-layer structure including a first layer and a second layer. The first layer is preferably in contact with the first insulator, and the second layer is preferably in contact with the third insulator.

In the above, the first layer preferably contains silicon nitride, and the second layer preferably contains aluminum oxide.

Effect of the Invention

According to one embodiment of the present invention, a semiconductor device having a high on-state current can be provided. According to one embodiment of the present invention, a semiconductor device having high frequency characteristics can be provided. According to one embodiment of the present invention, a semiconductor device with favorable reliability can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with high productivity can be provided.

A semiconductor device that can retain data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of the effects do not disturb the existence of other effects. One embodiment of the present invention does not have to have all of these effects. Effects other than these are apparent from the description of the specification, the drawings, the claims, and the like and effects other than these can be derived from the description of the specification, the drawings, the claims, and the like.

MODE FOR CARRYING OUT THE INVENTION

Figure 1A:
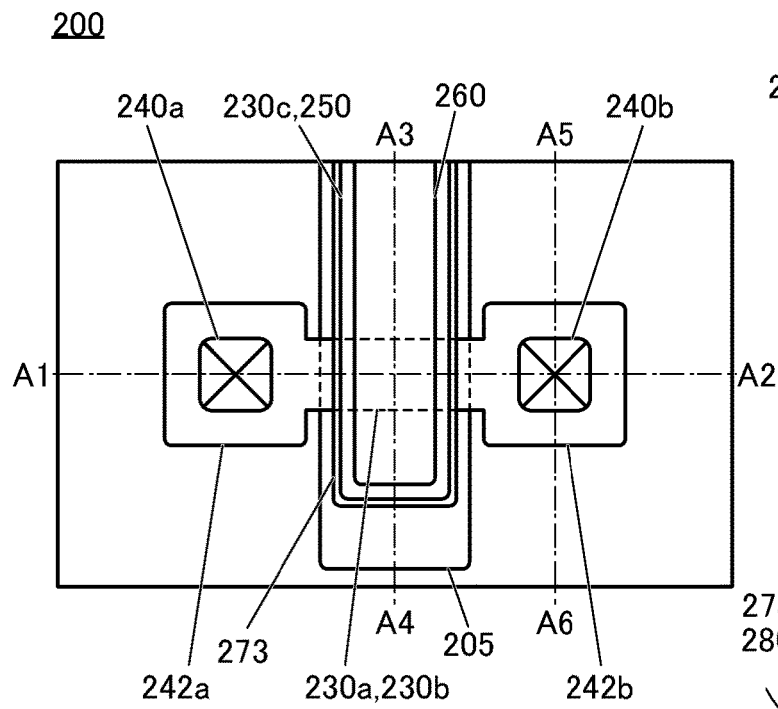
FIGS. 1A to 1D A top view and cross-sectional views of a semiconductor device of one embodiment of the present invention.

Hereinafter, embodiments are described with reference to the drawings. Note that the embodiments can be implemented with many different modes, and it is readily appreciated by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

Particularly in a top view (also referred to as a plan view), a perspective view, or the like, the description of some components might be omitted for easy understanding of the invention. Furthermore, the description of some hidden lines and the like might be omitted.

In this specification and the like, ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, the terms for explaining arrangement, such as "over" and "under", are used for convenience to describe the positional relation between components with reference to drawings. The positional relation between components is changed as appropriate in accordance with a direction in which the components are described. Thus, terms for the description are not limited to those used in this specification, and description can be made appropriately depending on the situation.

For example, when this specification and the like explicitly state that X and Y are connected, the case where X and Y are directly connected, the case where X and Y are functionally connected, and the case where X and Y are electrically connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be used interchangeably in this specification and the like.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies may be formed by entry of impurities, for example. Furthermore, when the semiconductor is silicon, examples of an impurity that changes the characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with insulating film or insulating layer. Moreover, the term "conductor" can be replaced with conductive film or conductive layer. Furthermore, the term "semiconductor" can be replaced with semiconductor film or semiconductor layer.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. In addition, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as water and hydrogen, and the barrier film having conductivity is sometimes referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is $1\times10^{-20}$ A or lower at room temperature, $1\times10^{-18}$ A or lower at 85° C., or $1\times10^{-16}$ A or lower at 125° C.

Embodiment 1

An example of a semiconductor device including a transistor 200 of one embodiment of the present invention is described below.

<Configuration Example of Semiconductor Device>

FIG. 1(A), FIG. 1(B), FIG. 1(C), and FIG. 1(D) are a top view and cross-sectional views of the transistor 200 of one embodiment of the present invention and the periphery of the transistor 200.

Figure 1B:
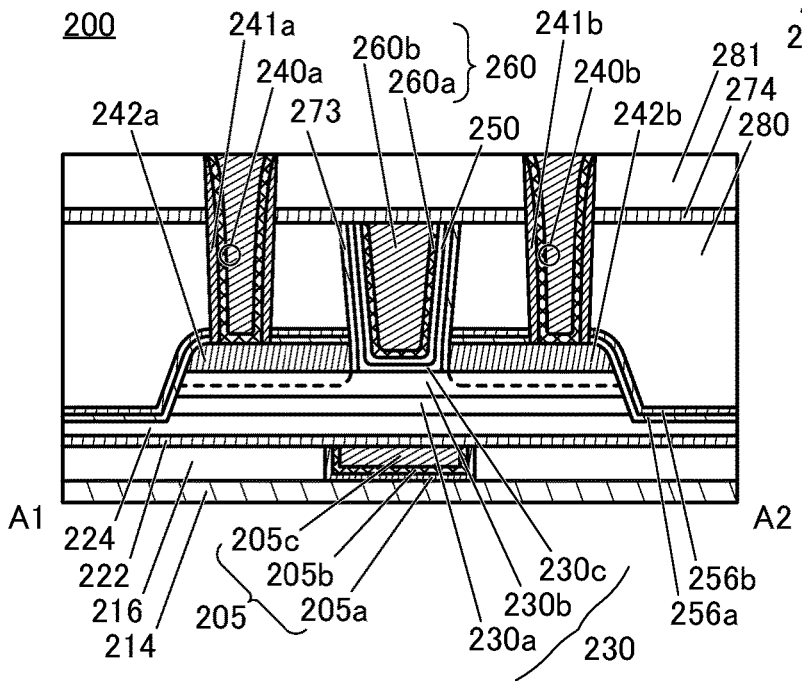
Figure 1C:
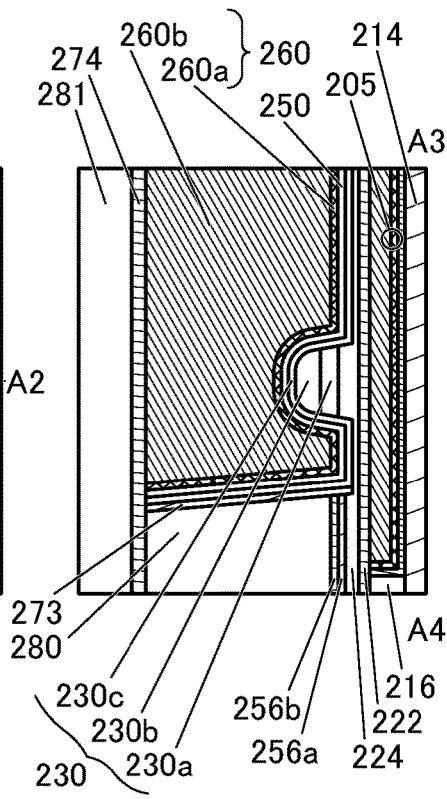
Figure 1D:
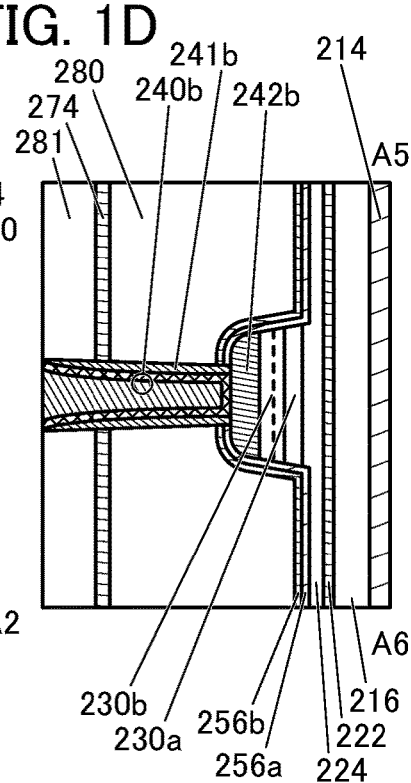

FIG. 1(A) is a top view of a semiconductor device including the transistor 200. FIG. 1(B), FIG. 1(C), and FIG. 1(D) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. FIG. 1(D) is a cross-sectional view of a portion indicated by a dashed-dotted line A5-A6 in FIG. 1(A), and is also a cross-sectional view of a portion where the transistor 200 is connected to a conductor 240b. Note that for clarity of the drawing, some components are not illustrated in the top view of FIG. 1(A).

The semiconductor device of one embodiment of the present invention includes the transistor 200 and an insulator 274 and an insulator 281 that are over the transistor 200. A conductor 240 (a conductor 240a and the conductor 240b) functioning as a plug and being electrically connected to the transistor 200 is also included.

Moreover, as the conductor 240, a first conductor of the conductor 240 is formed in contact with an inner wall of an opening formed in an insulator 256 (an insulator 256a and an insulator 256b), an insulator 280, the insulator 274, and the insulator 281, and a second conductor of the conductor 240 is formed on an inner side of the first conductor. Here, a top surface of the conductor 240 can be substantially level with a top surface of the insulator 281. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a structure body has a stacked-layer structure, layers may be distinguished by ordinal numbers corresponding to the formation order.

[Transistor 200]

As illustrated in FIG. 1, the transistor 200 includes an insulator 214 over a substrate (not illustrated); an insulator 216 over the insulator 214; a conductor 205 embedded in the insulator 216; an insulator 222 over the insulator 216 and the conductor 205; an insulator 224 over the insulator 222; an oxide 230a over the insulator 224; an oxide 230b over the oxide 230a; a conductor 242 (a conductor 242a and a conductor 242b) over the oxide 230b; the insulator 256 covering the insulator 224, the oxide 230a, the oxide 230b, and the conductor 242; the insulator 280 that is over the insulator 256 and includes an opening; an insulator 273 that is in contact with the oxide 230b, a side surface of the conductor 242, a side surface of the insulator 256, and a side surface of the insulator 280 in the opening; an oxide 230c that is in contact with the oxide 230b and on the inner side of the insulator 273; an insulator 250 on the inner side of the oxide 230c; a conductor 260a on the inner side of the insulator 250; and a conductor 260b to be embedded in the opening on the inner side of the conductor 260a. The insulator 274 is provided over the insulator 280, the insulator 273, the oxide 230c, the insulator 250, the conductor 260a, and the conductor 260b, and the insulator 281 is provided over the insulator 274.

Note that the insulator 256 is preferably provided to cover the insulator 224, a side surface of the oxide 230a, a side surface of the oxide 230b, and a top surface and the side surface of the conductor 242. Moreover, the insulator 256 and the insulator 273 are preferably in contact with each other. The insulator 273 and the insulator 274 are preferably in contact with each other. In such a structure, the insulator 280 is surrounded by the insulator 256, the insulator 273, and the insulator 274, and thus diffusion of impurities such as hydrogen or water included in the insulator 280 to an oxide 230 (the oxide 230a, the oxide 230b, and the oxide 230c) and the insulator 224 and the insulator 250 each functioning as a gate insulating film can be inhibited.

Since the insulator 224, the oxide 230, and the insulator 250 included in the transistor 200 are surrounded by the insulator 222, the insulator 256, the insulator 273, and the insulator 274, diffusion of oxygen included in the insulator 224, the oxide 230, and the insulator 250 to the insulator 216, the insulator 280, the insulator 281, and the outside of the transistor 200 can be inhibited.

Note that although the structure of the transistor 200 in which three layers of the oxide 230a, the oxide 230b, and the oxide 230c are stacked in a region where a channel is formed (hereinafter also referred to as a channel formation region) and in its vicinity is illustrated, the present invention is not limited thereto. For example, a single layer of the oxide 230b, a two-layer structure of the oxide 230a and the oxide 230b, or a stacked-layer structure of four or more layers may be provided. Although a conductor 260 is shown to have a stacked-layer structure of two layers in the transistor 200, the present invention is not limited thereto. For example, the conductor 260 may have a single-layer structure or a stacked-layer structure of three or more layers.

Here, the conductor 260 (the conductor 260a, and the conductor 260b) functions as a gate electrode of the transistor, and the conductor 242a and the conductor 242b function as a source electrode and a drain electrode. As described above, the conductor 260 is formed to be embedded in the opening of the insulator 280 and a region between the conductor 242a and the conductor 242b, with the insulator 273, the oxide 230c, and the insulator 250 therebetween. Here, the positions of the conductor 260, the conductor 242a, and the conductor 242b with respect to the opening of the insulator 280 are selected in a self-aligned manner. That is, in the transistor 200, the gate electrode can be positioned between the source electrode and the drain electrode in a self-aligned manner. Therefore, the conductor 260 can be formed without an alignment margin, resulting in a reduction in the area occupied by the transistor 200. Accordingly, miniaturization and high integration of the semiconductor device can be achieved.

In addition, since the conductor 260 is formed in the region between the conductor 242a and the conductor 242b in a self-aligned manner, the conductor 260 does not have a region overlapping the conductor 242a or the conductor 242b. Thus, parasitic capacitance formed between the conductor 260 and each of the conductor 242a and the conductor 242b can be reduced. As a result, the switching speed of the transistor 200 can be increased, and the transistor 200 can have high frequency characteristics.

In addition, in the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used.

The transistor 200 using an oxide semiconductor in a channel formation region has an extremely low leakage current in a non-conduction state; thus, a semiconductor device with low power consumption can be provided. An oxide semiconductor can be deposited by a sputtering method or the like, and can be used for the transistor 200 constituting a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 230, an In—Ga oxide or an In—Zn oxide may be used.

Here, when the oxide 230 contains impurities such as hydrogen, nitrogen, and a metal element, the carrier density may increase and the resistance may be lowered. Furthermore, when the oxygen concentration of the oxide 230 decreases, the carrier density may increase and the resistance may be lowered.

When the conductor 242 (the conductor 242a and the conductor 242b) that is provided on and in contact with the oxide 230 and functions as the source electrode and the drain electrode has a function of absorbing oxygen in the oxide 230 or has a function of supplying impurities such as hydrogen, nitrogen, and a metal element to the oxide 230, a low-resistance region is partly formed in the oxide 230 in some cases.

It is preferable that the side surface of the conductor 242 on the channel formation region side be covered with the insulator 273, in which case oxidation of the side surface of the conductor 242 can be inhibited. When the resistance of the conductor 242 is increased due to its oxidation, the region of the conductor 242 that functions as the source electrode or the drain electrode is reduced. In other words, the distance between the source electrode and the drain electrode is longer than the intended distance. By providing the insulator 273 on the sidewall of the conductor 242, oxidation of the conductor 242 can be inhibited, and a reduction of the region of the conductor 242 that functions as the source electrode or the drain electrode can be inhibited.

By providing the insulator 273, the distance between the conductor 242 and the conductor 260 can be large compared to the distance between the oxide 230b and the conductor 260. In such a structure, the parasitic capacitance between the conductor 260 and the conductor 242 can be further reduced and the transistor 200 having high frequency characteristics can be provided. In addition, since the distance between the oxide 230b and the conductor 260 is small, the electric field from the gate electrode is not weakened, so that the transistor 200 having favorable electrical characteristics can be provided.

The insulator 256 is provided so that a side surface of the oxide 230 is not directly in contact with the insulator 280. Moreover, the insulator 256 is provided to inhibit oxidation of the conductor 242. Note that in the case where the conductor 242 is an oxidation-resistance material or in the case where the conductivity of the conductor 242 is not significantly decreased even when the conductor 242 absorbs oxygen, the insulator 256 does not need to have an effect of inhibiting oxidation of the conductor 242.

The insulator 256 can inhibit injection of oxygen included in the insulator 280 from the side surface of the oxide 230.

Figure 4:
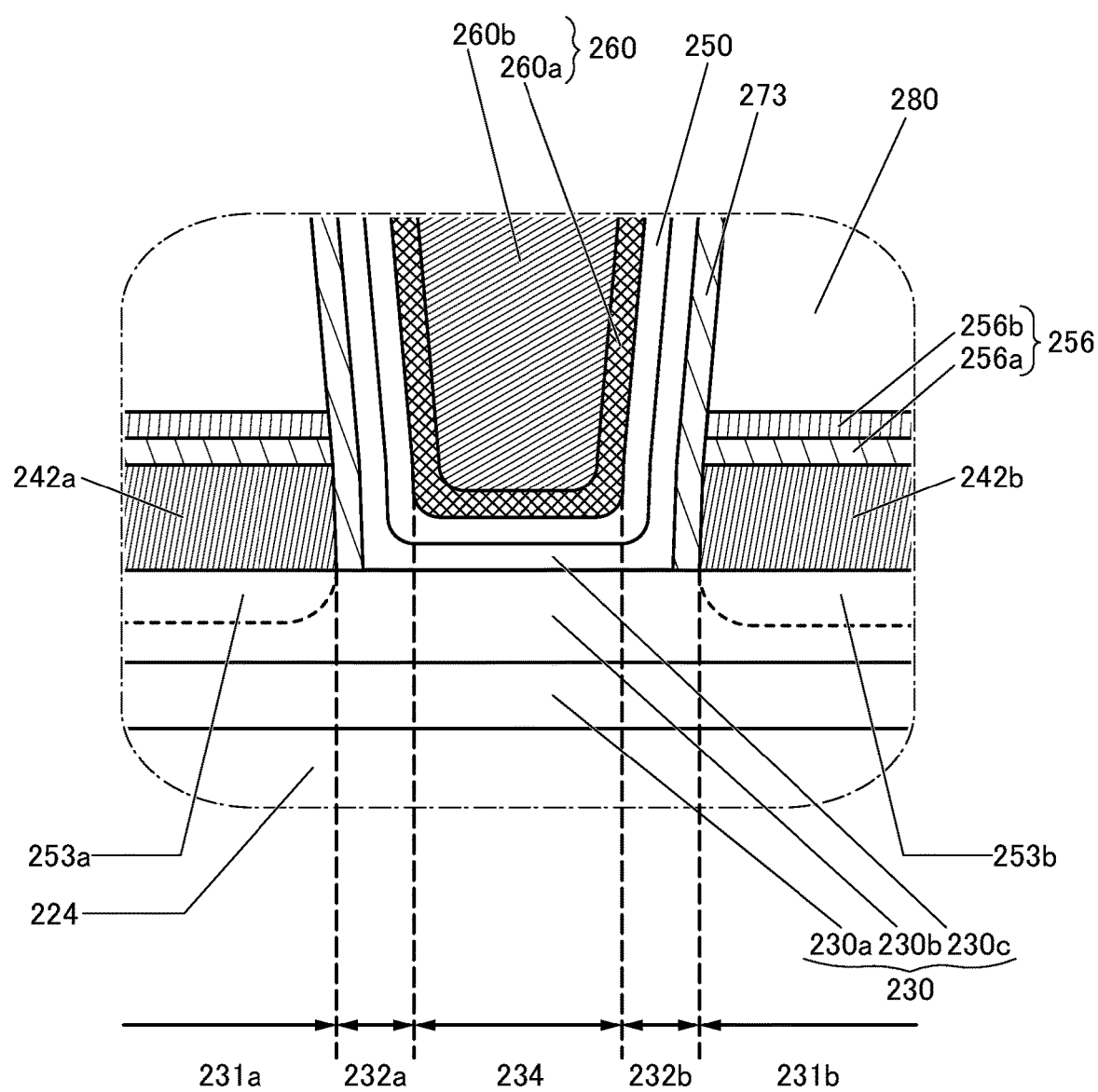
FIG. 4 A cross-sectional view of a semiconductor device of one embodiment of the present invention.
Figure 5A:
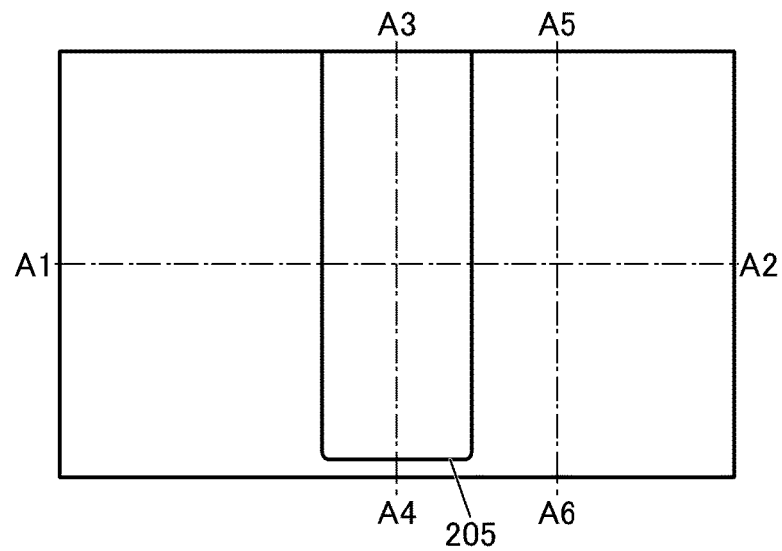
FIGS. 5A to 5D A top view and cross-sectional views illustrating a method for manufacturing a semiconductor device of one embodiment of the present invention.
Figure 5C:
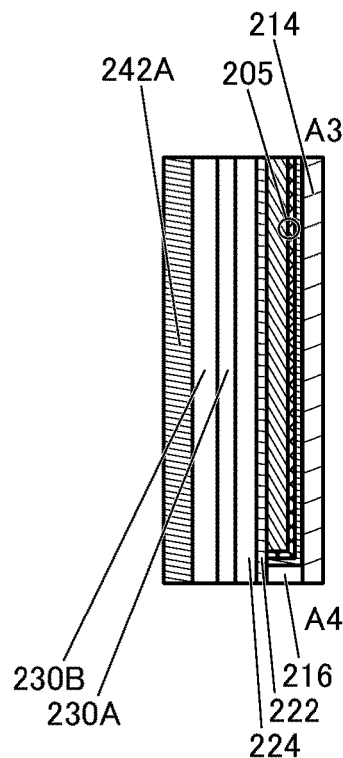
Figure 5B:
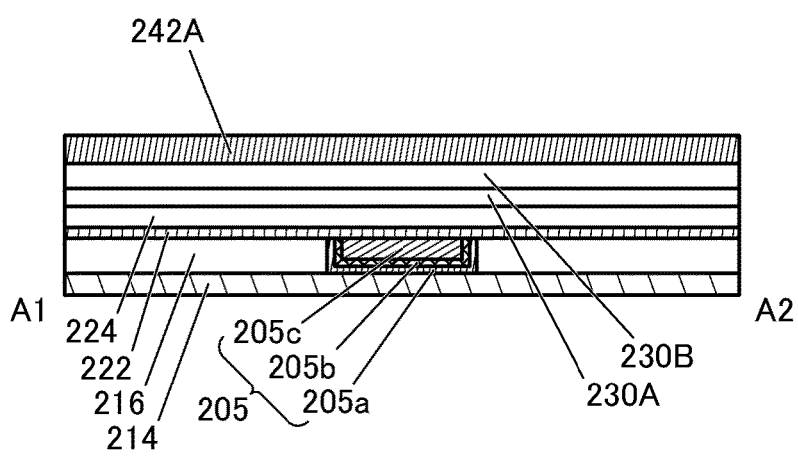
Figure 5D:
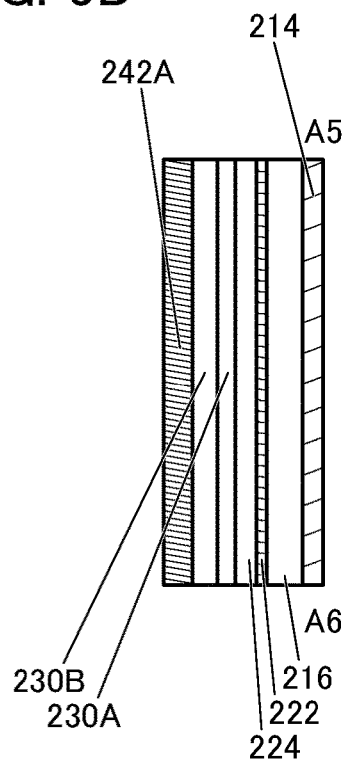
Figure 6A:
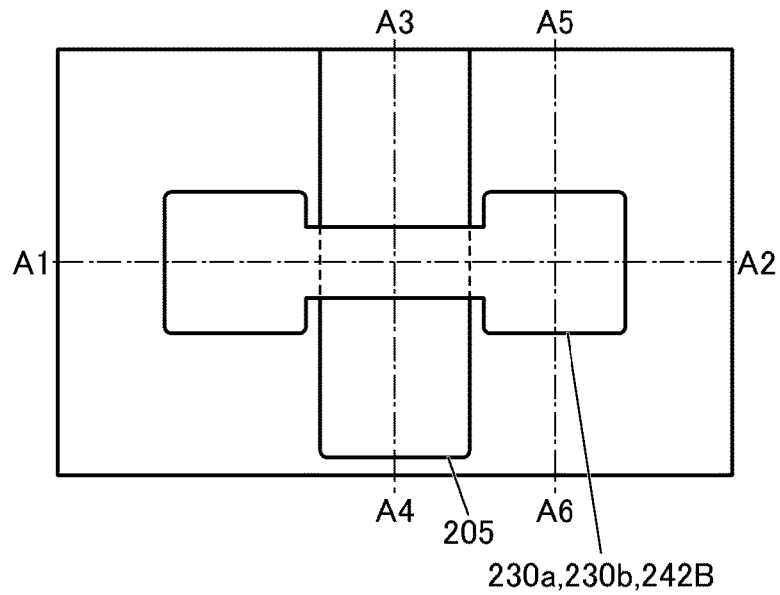
FIGS. 6A to 6D A top view and cross-sectional views illustrating a method for manufacturing a semiconductor device of one embodiment of the present invention.
Figure 6C:
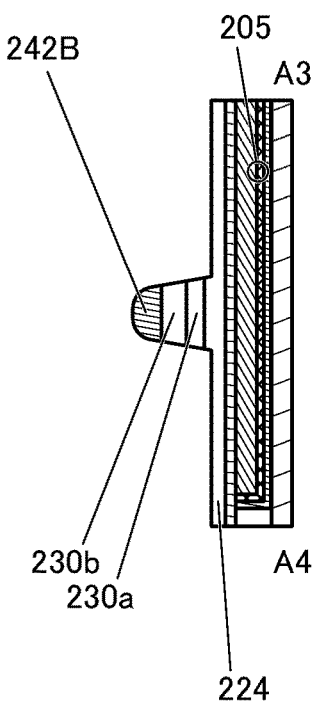
Figure 6B:
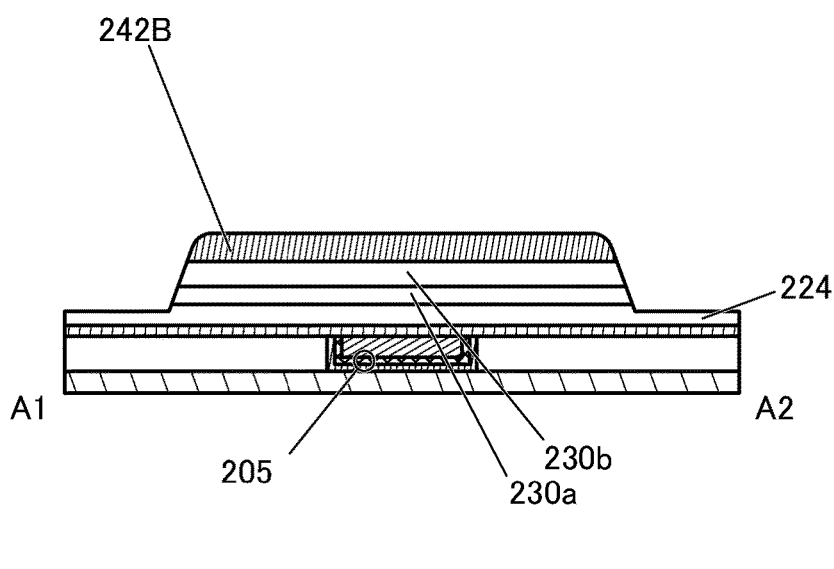
Figure 6D:
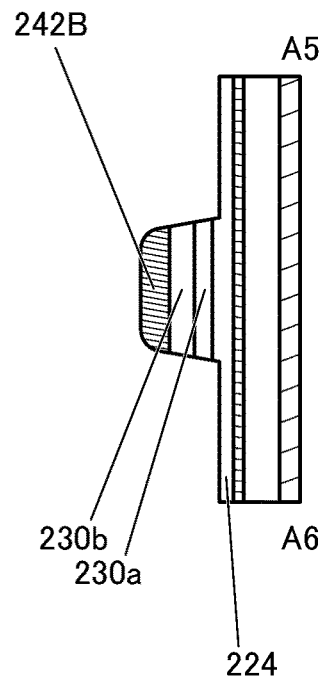
Figure 7A:
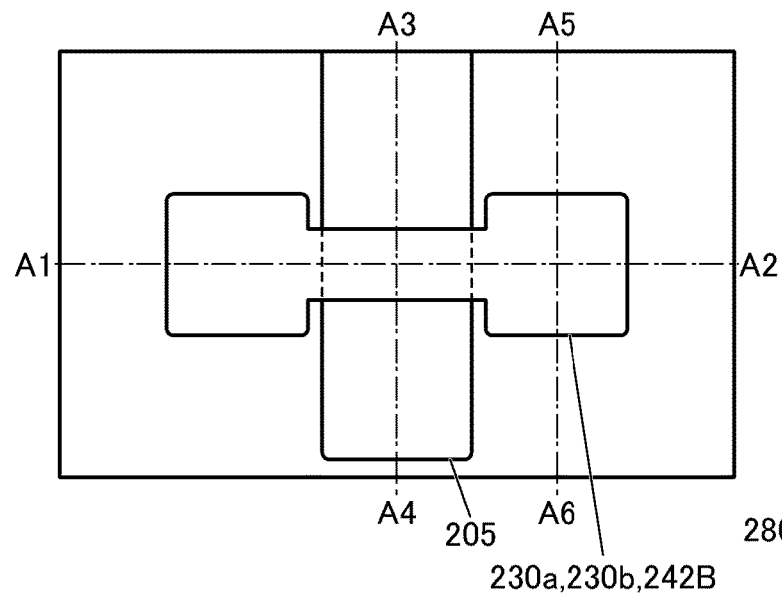
FIGS. 7A to 7D A top view and cross-sectional views illustrating a method for manufacturing a semiconductor device of one embodiment of the present invention.
Figure 7C:
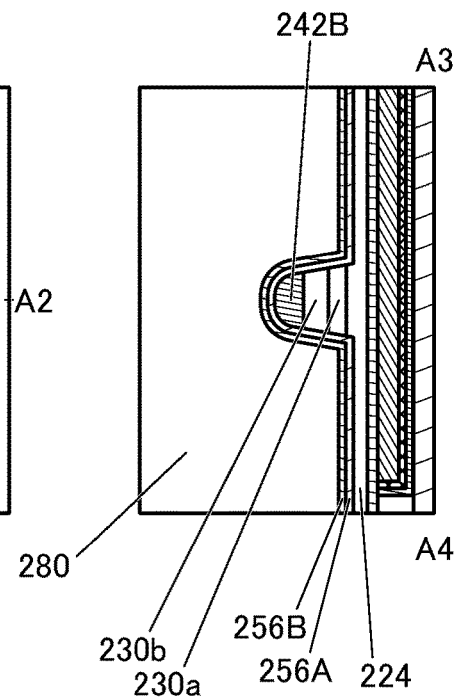
Figure 7B:
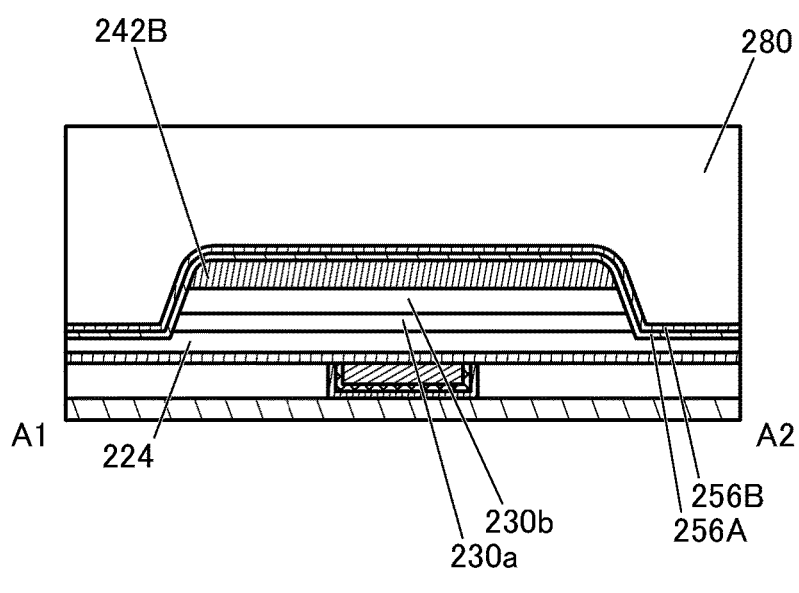
Figure 7D:
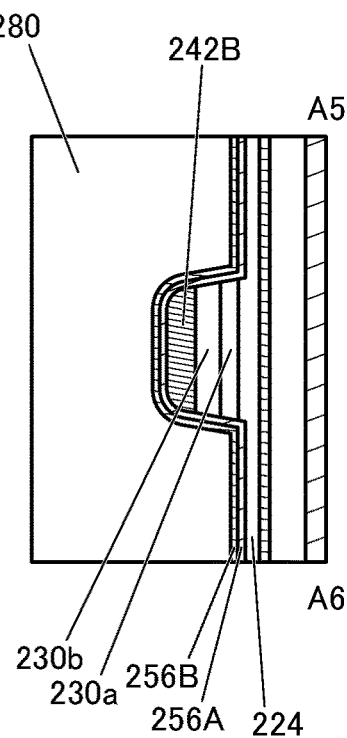
Figure 8A:
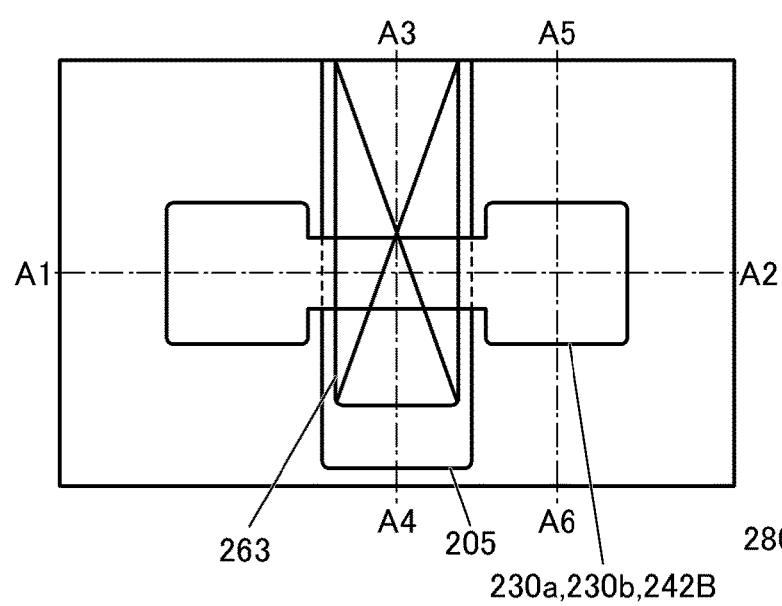
FIGS. 8A to 8D A top view and cross-sectional views illustrating a method for manufacturing a semiconductor device of one embodiment of the present invention.
Figure 8C:
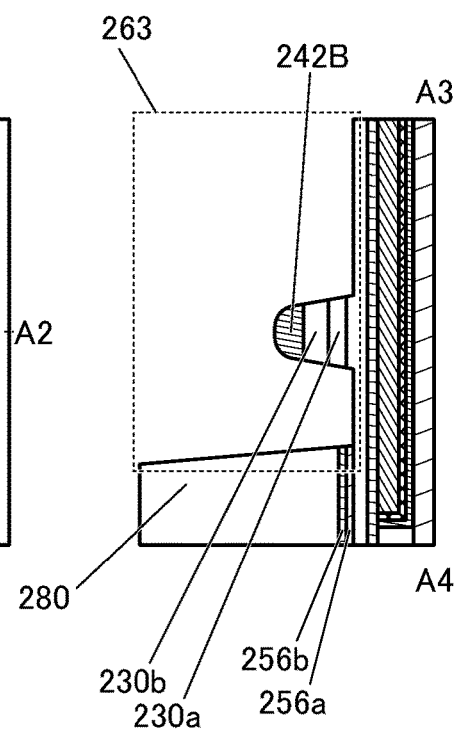
Figure 8B:
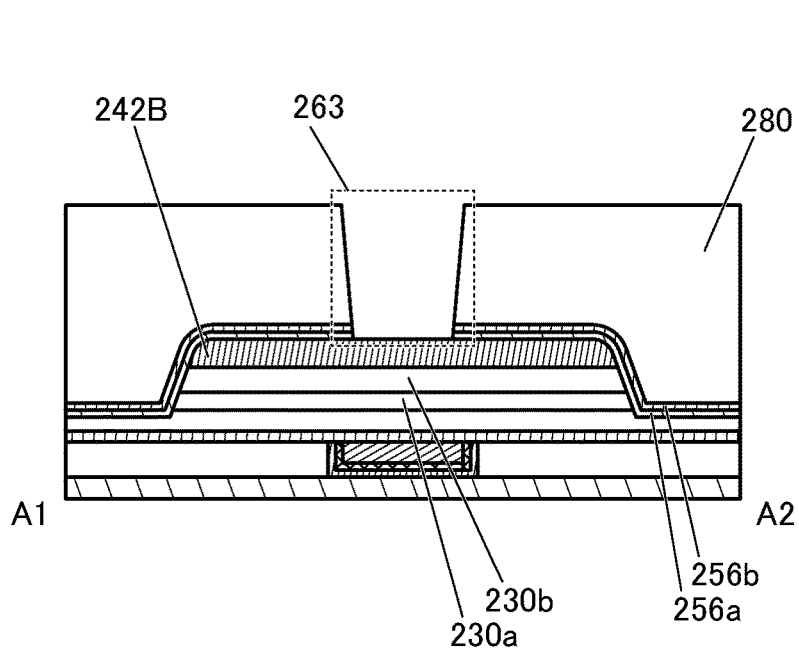
Figure 8D:
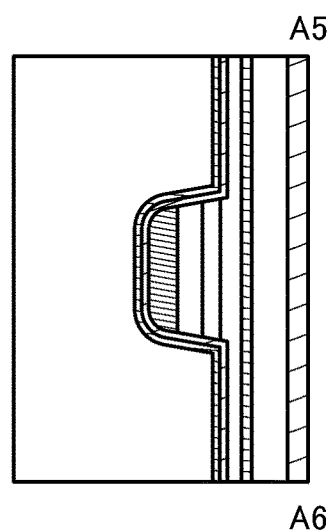
Figure 9A:
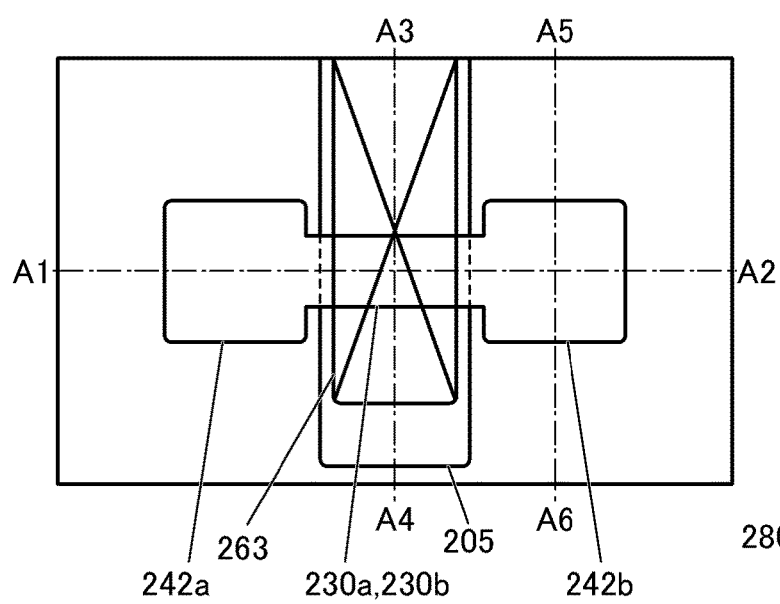
FIGS. 9A to 9D A top view and cross-sectional views illustrating a method for manufacturing a semiconductor device of one embodiment of the present invention.
Figure 9C:
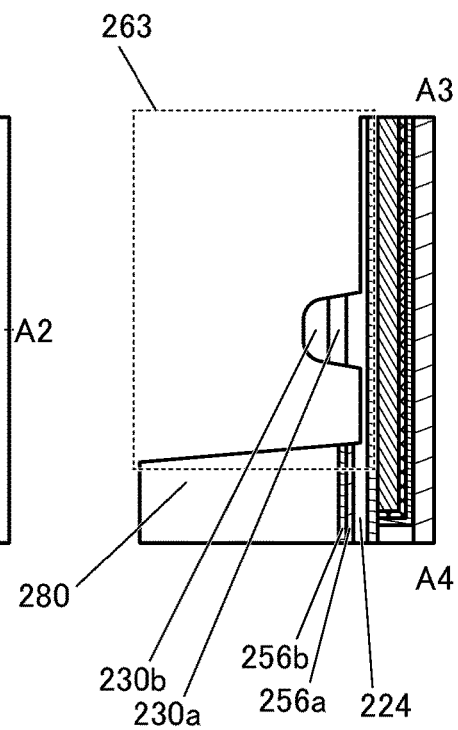
Figure 9B:
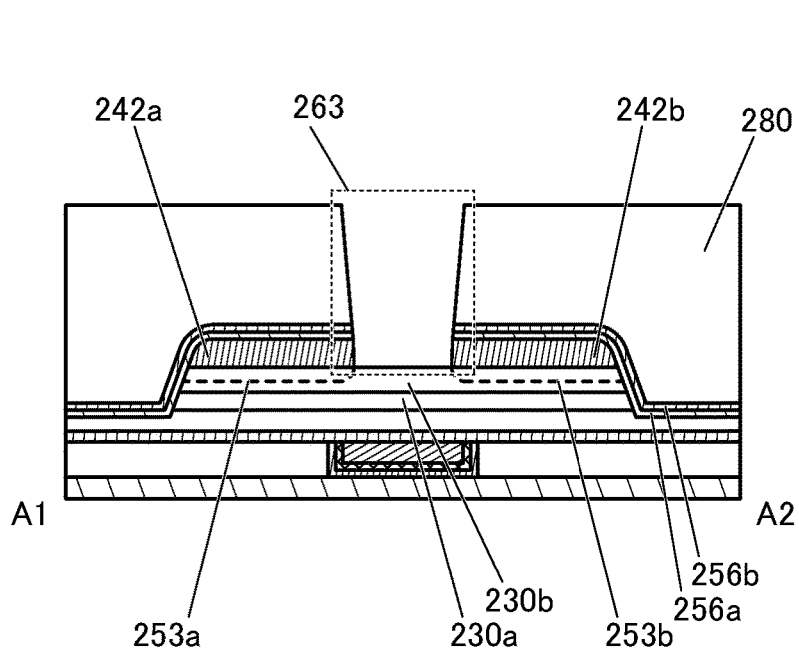
Figure 9D:
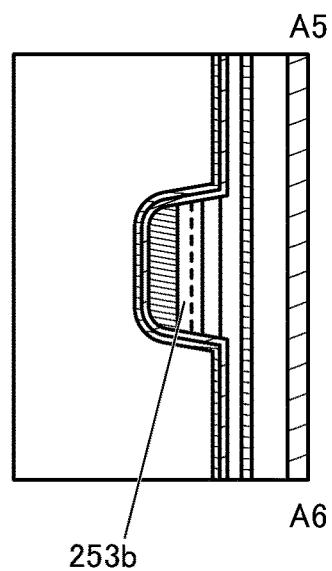
Figure 10A:
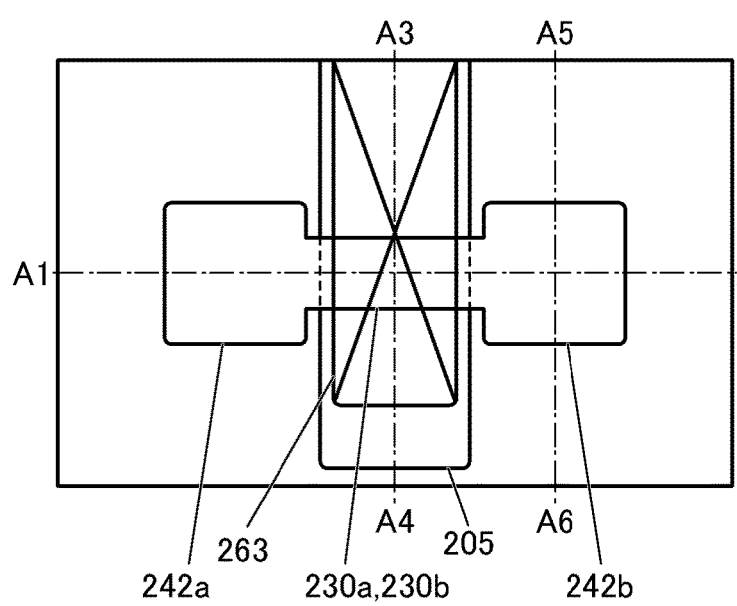
FIGS. 10A to 10D A top view and cross-sectional views illustrating a method for manufacturing a semiconductor device of one embodiment of the present invention.
Figure 10C:
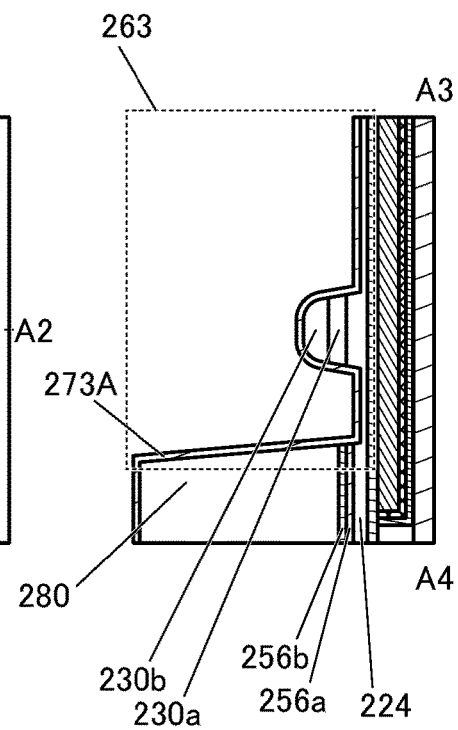
Figure 10B:
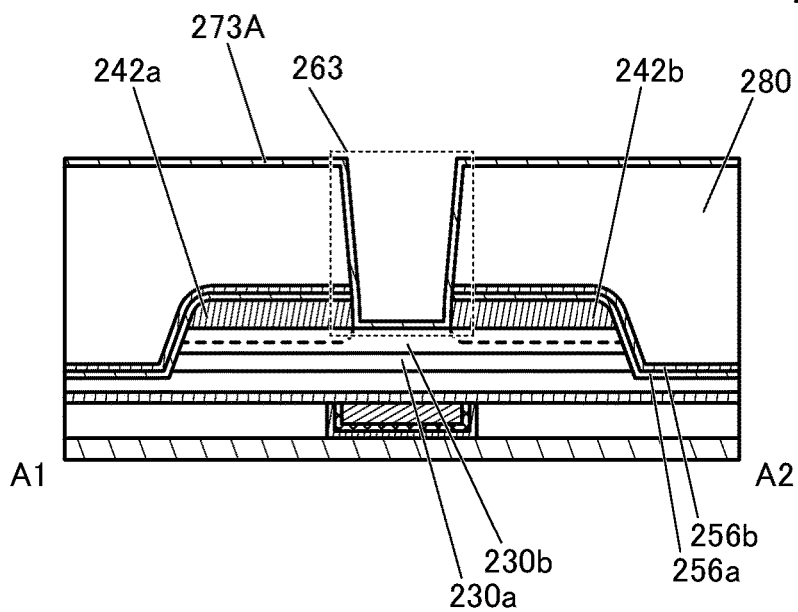
Figure 10D:
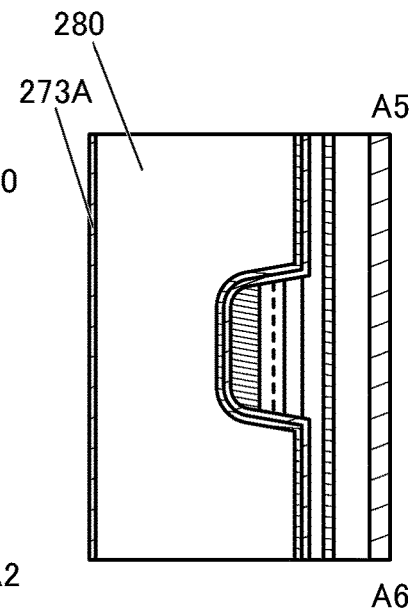
Figure 11A:
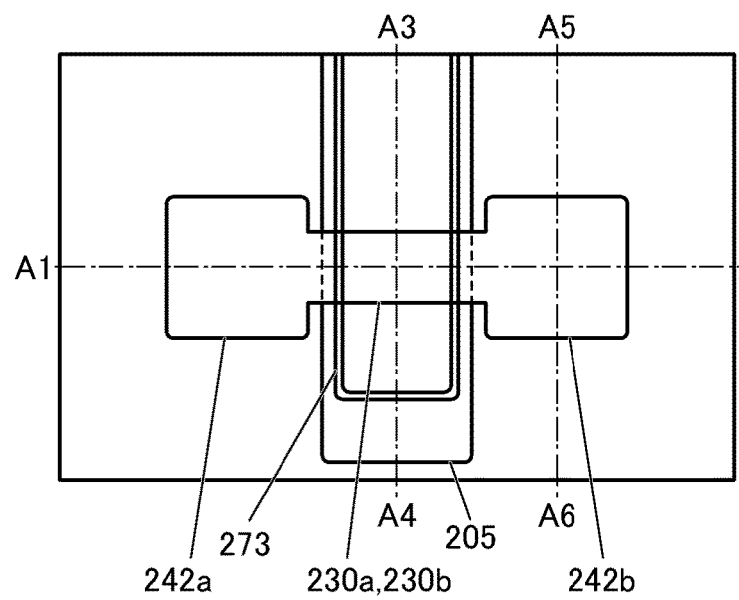
FIGS. 11A to 11D A top view and cross-sectional views illustrating a method for manufacturing a semiconductor device of one embodiment of the present invention.
Figure 11C:
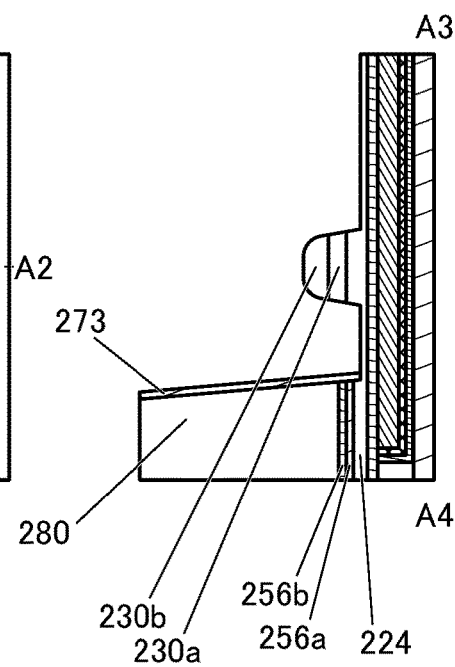
Figure 11B:
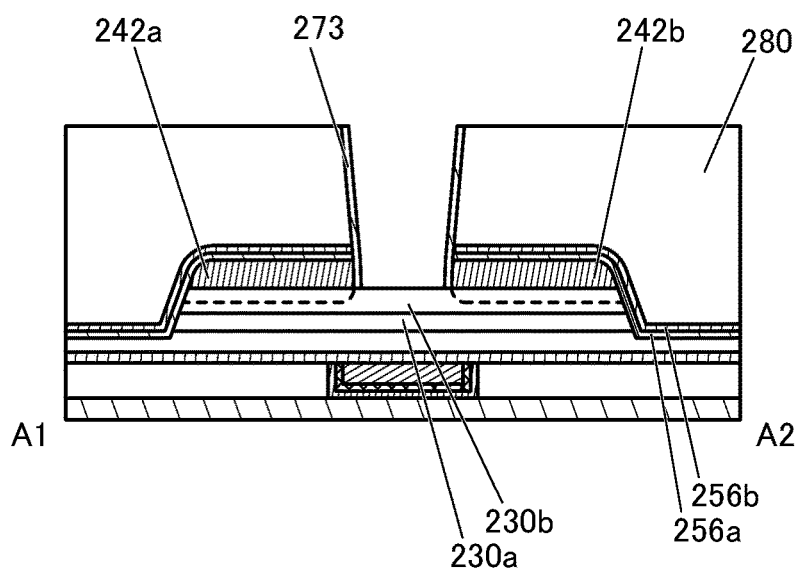
Figure 11D:
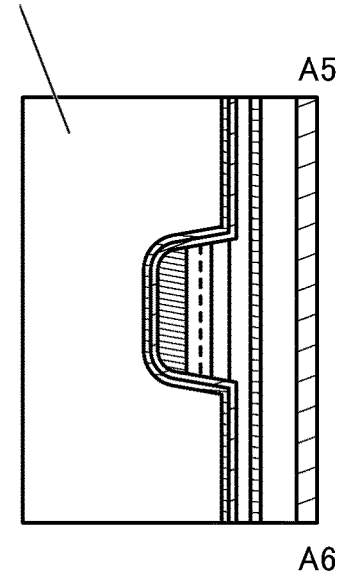
Figure 12A:
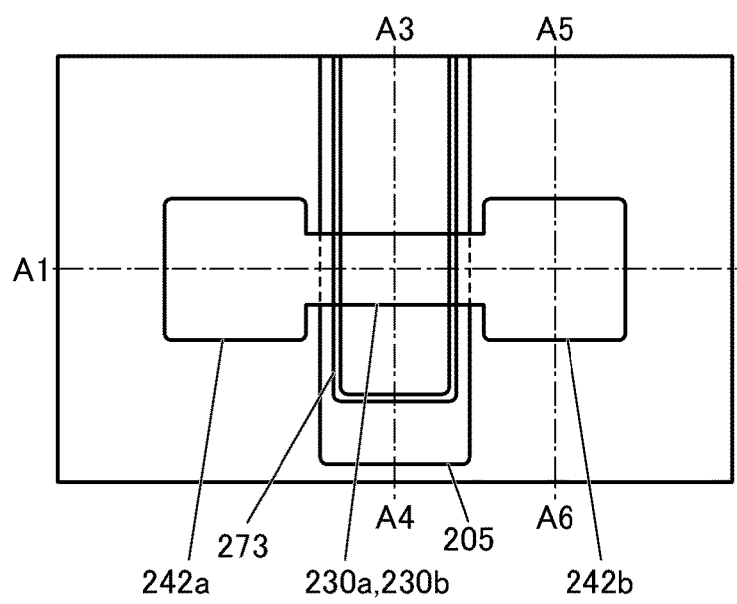
FIGS. 12A to 12D A top view and cross-sectional views illustrating a method for manufacturing a semiconductor device of one embodiment of the present invention.
Figure 12B:
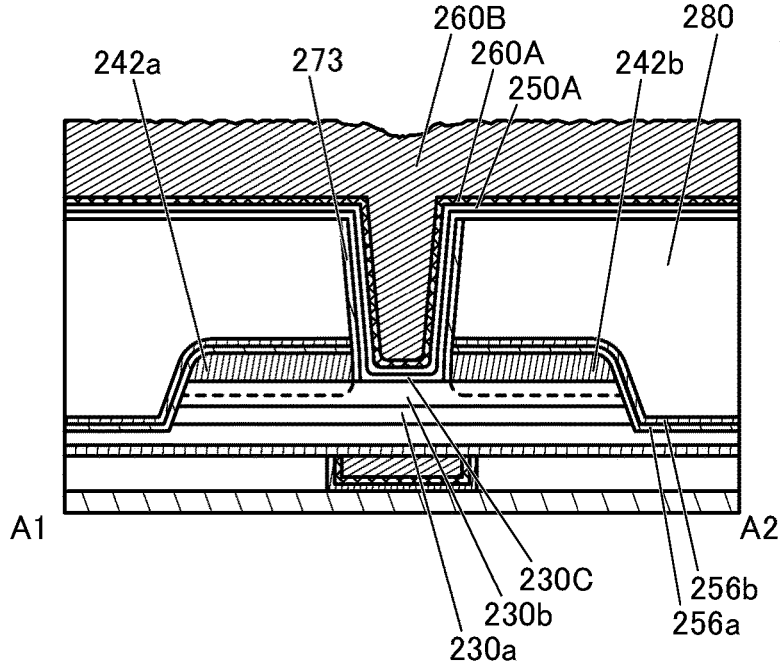
Figure 12C:
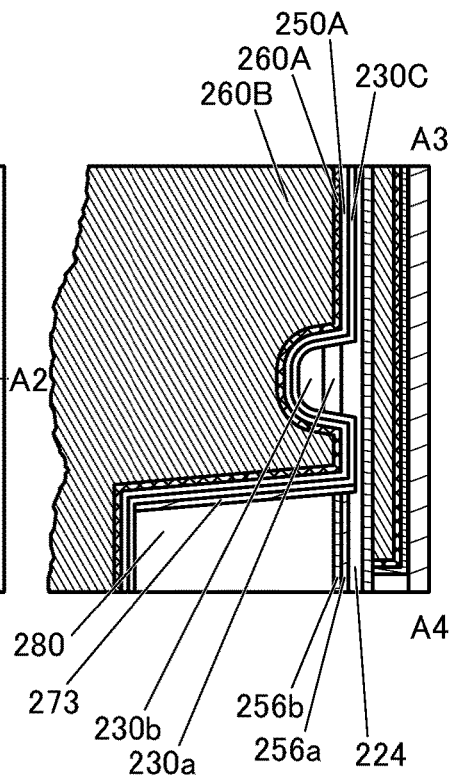
Figure 12D:
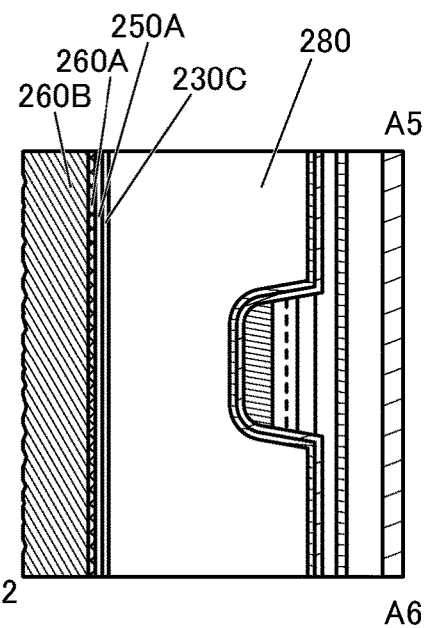
Figure 13A:
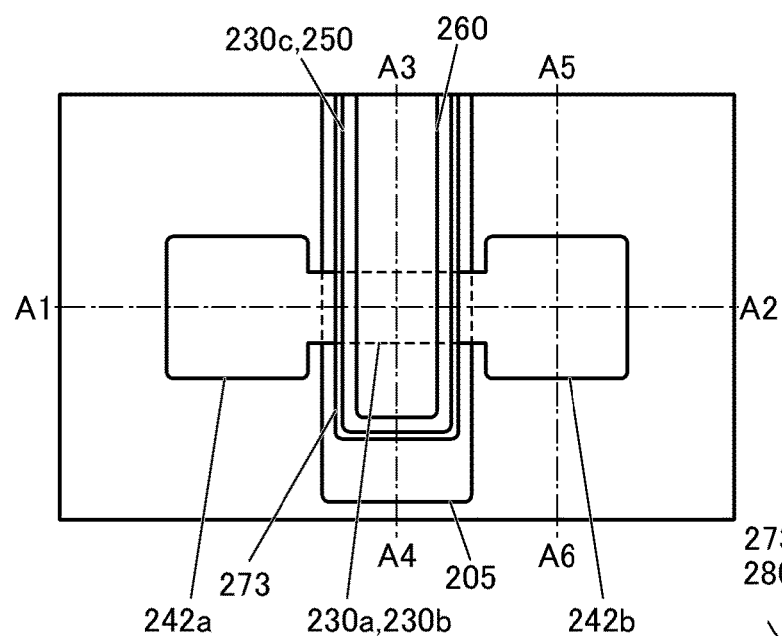
FIGS. 13A to 13D A top view and cross-sectional views illustrating a method for manufacturing a semiconductor device of one embodiment of the present invention.
Figure 13C:
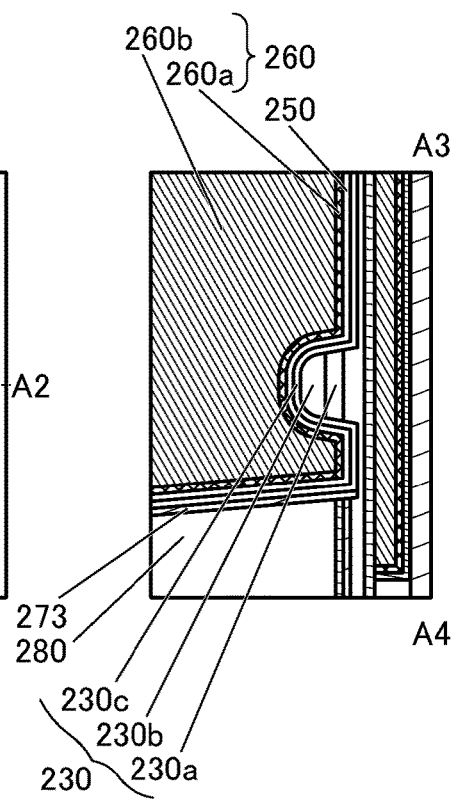
Figure 13B:
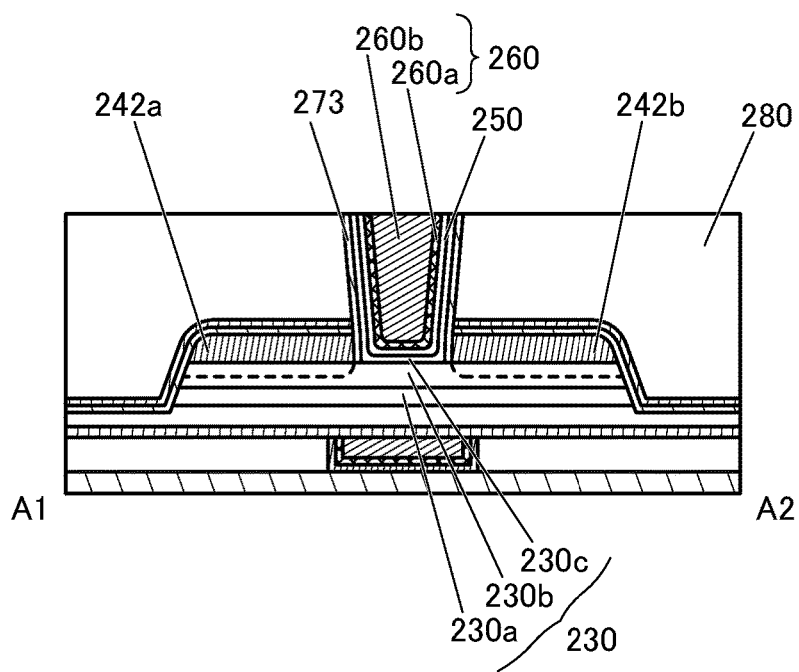
Figure 13D:
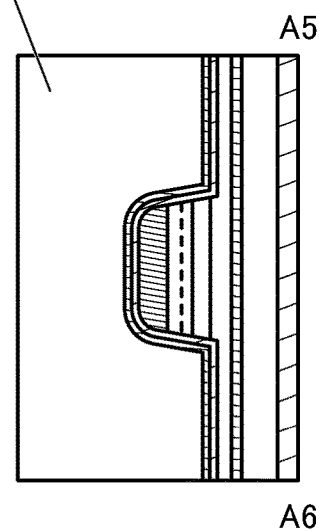
Figure 14A:
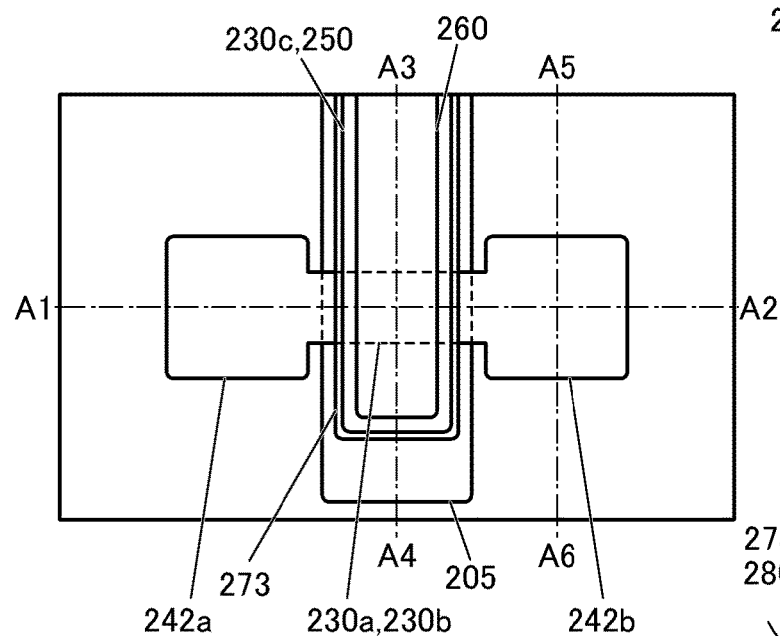
FIGS. 14A to 14D A top view and cross-sectional views illustrating a method for manufacturing a semiconductor device of one embodiment of the present invention.
Figure 14C:
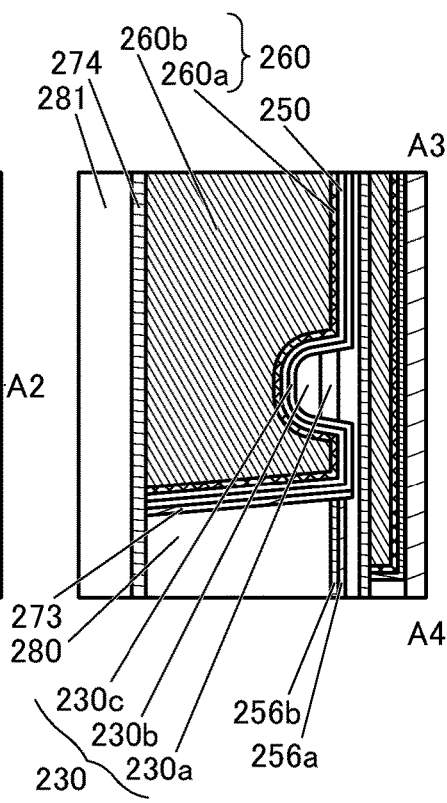
Figure 14B:
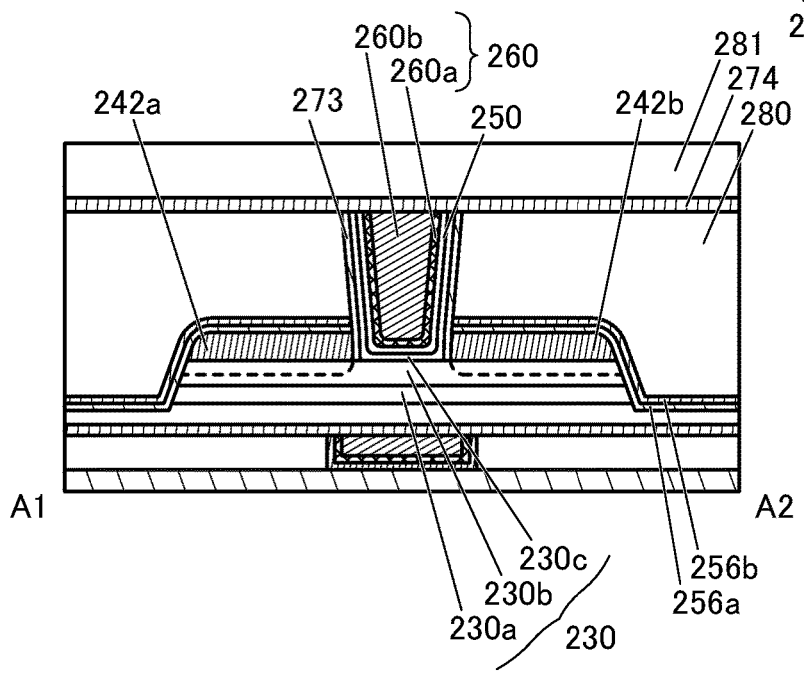
Figure 14D:
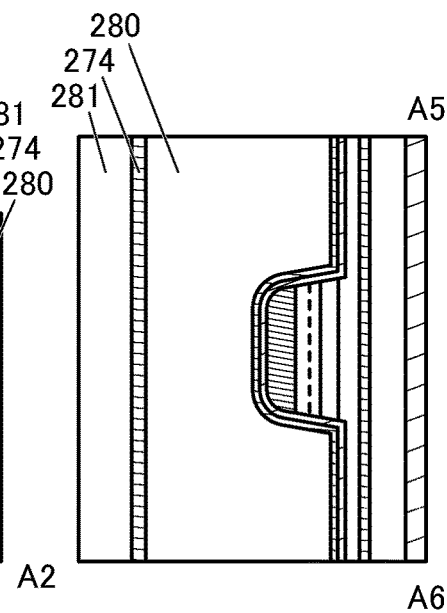
Figure 15A:
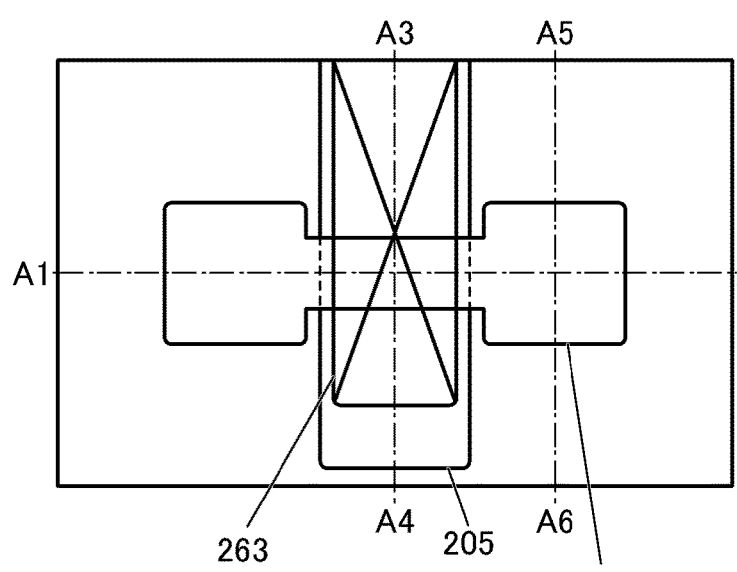
FIGS. 15A to 15D A top view and cross-sectional views illustrating a method for manufacturing a semiconductor device of one embodiment of the present invention.
Figure 15C:
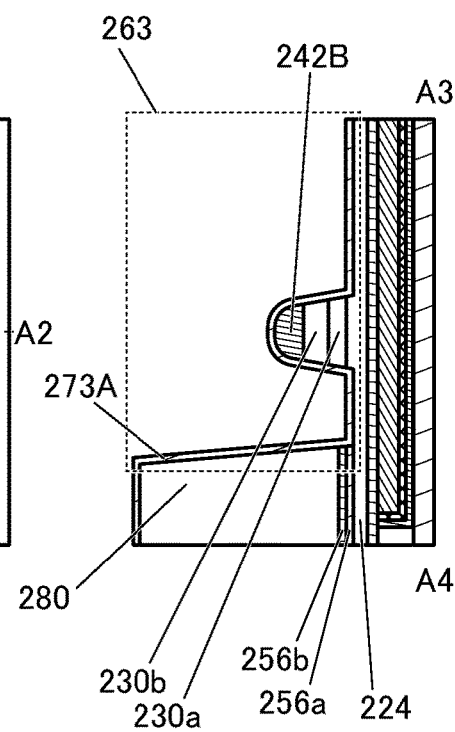
Figure 15B:
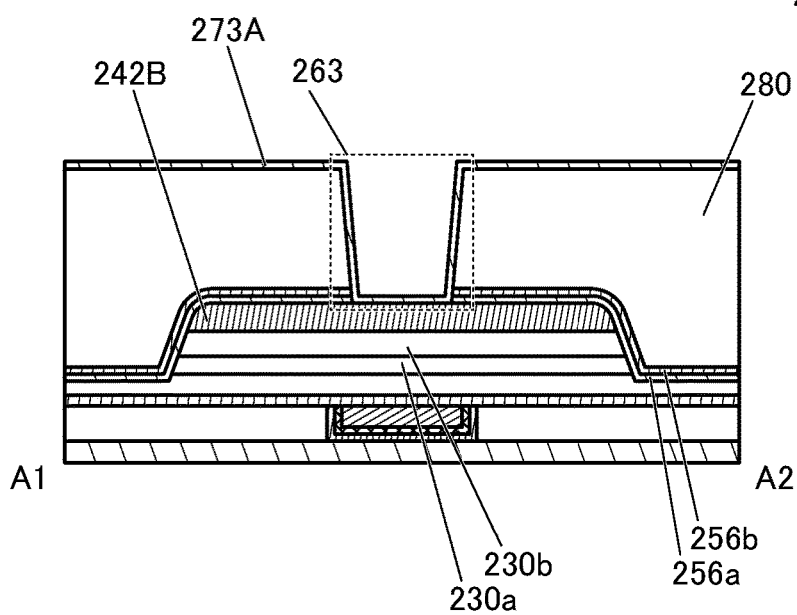
Figure 15D:
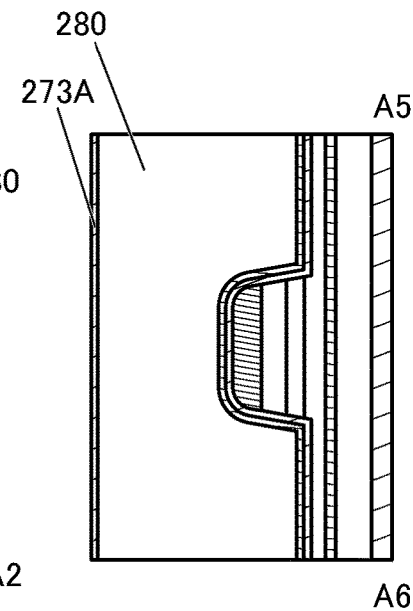
Figure 16A:
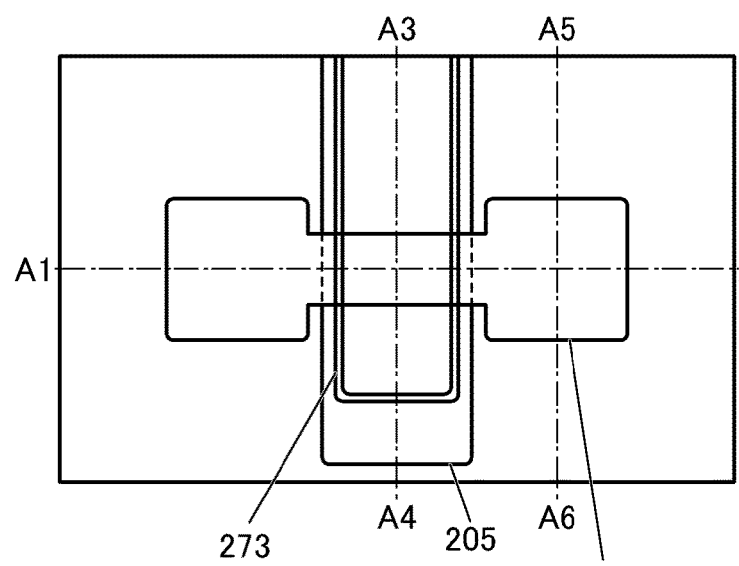
FIGS. 16A to 16D A top view and cross-sectional views illustrating a method for manufacturing a semiconductor device of one embodiment of the present invention.
Figure 16C:
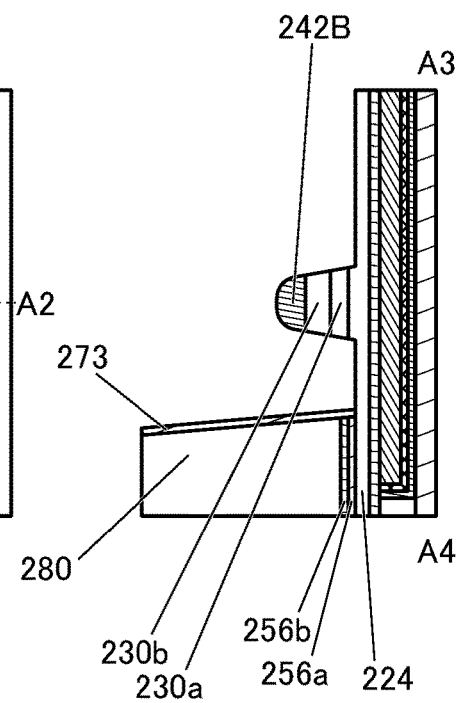
Figure 16B:
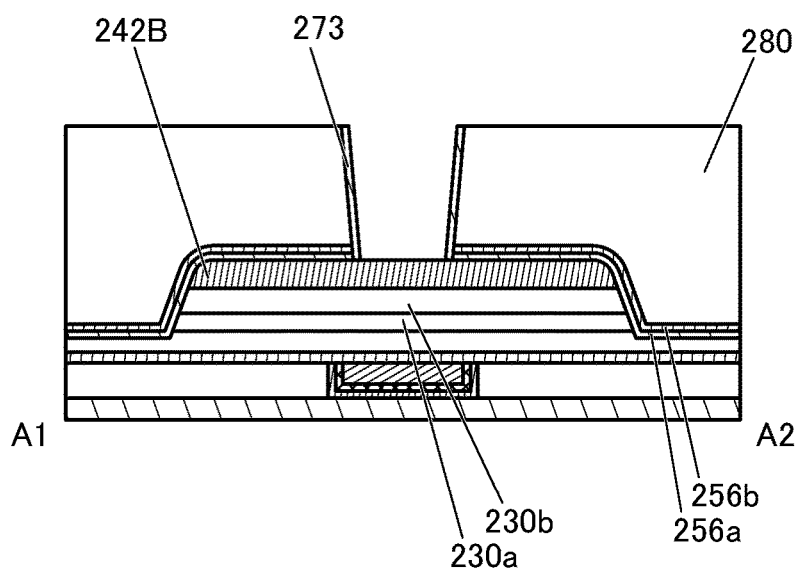
Figure 16D:
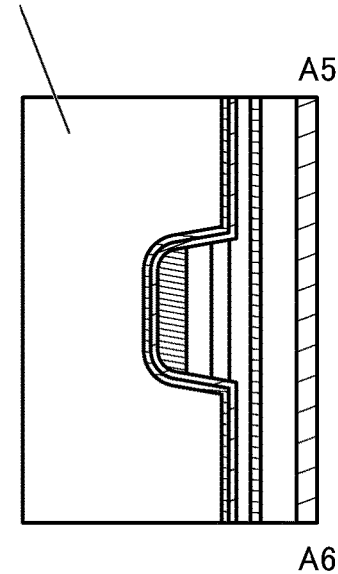
Figure 17A:
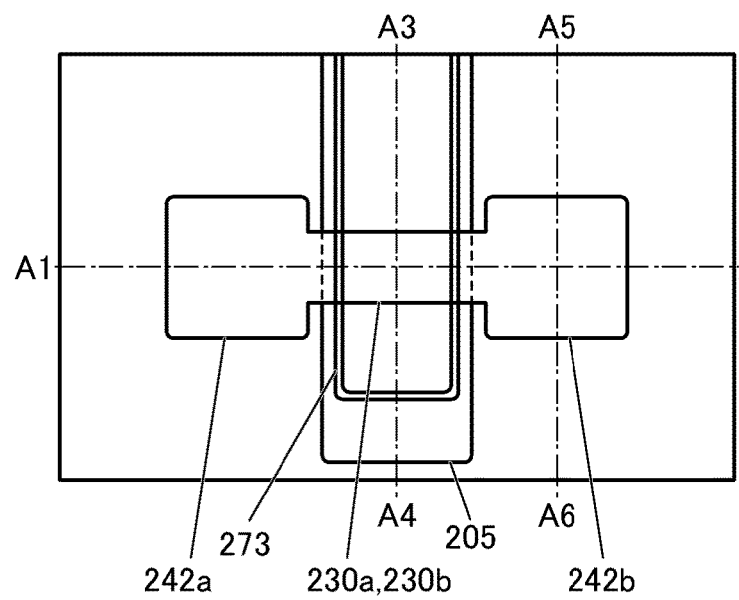
FIGS. 17A to 17D A top view and cross-sectional views illustrating a method for manufacturing a semiconductor device of one embodiment of the present invention.
Figure 17C:
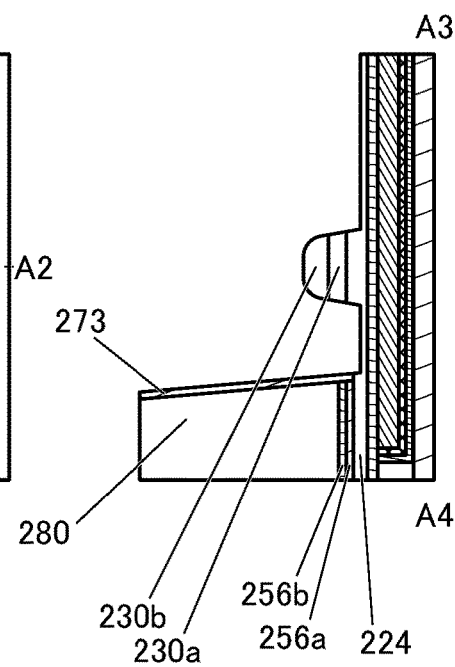
Figure 17B:
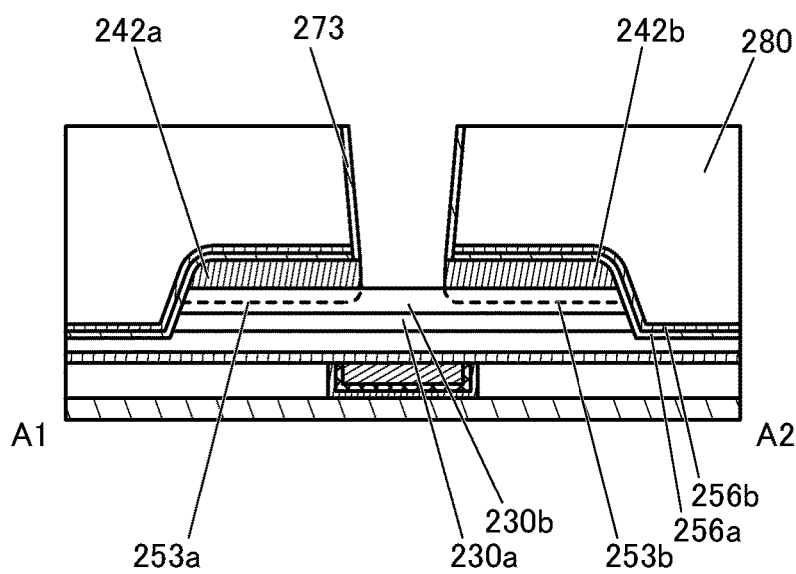
Figure 17D:
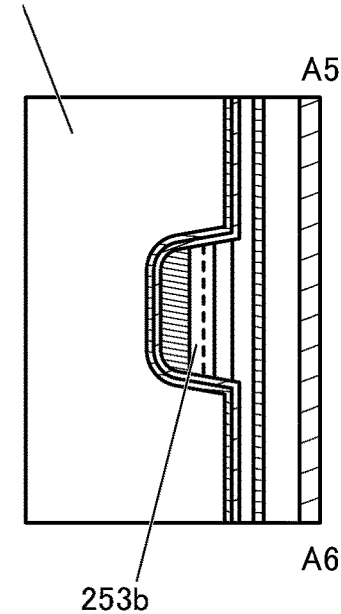
Figure 18A:
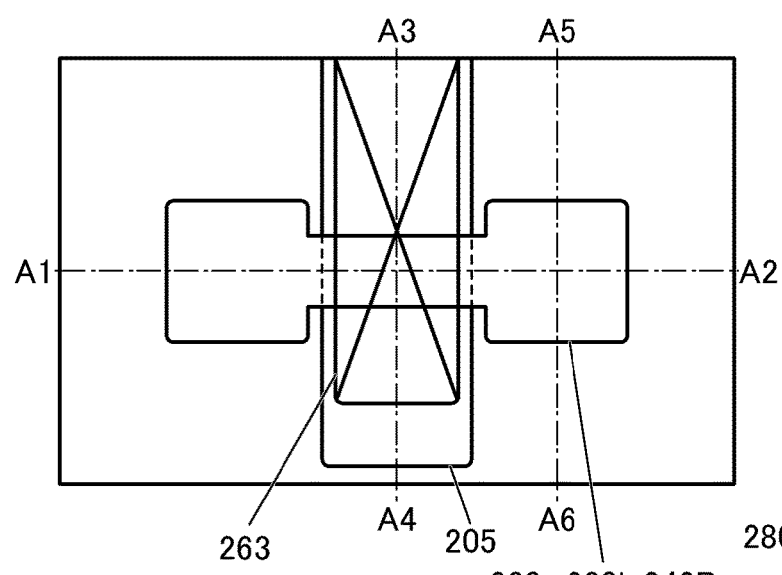
FIGS. 18A to 18D A top view and cross-sectional views illustrating a method for manufacturing a semiconductor device of one embodiment of the present invention.
Figure 18C:
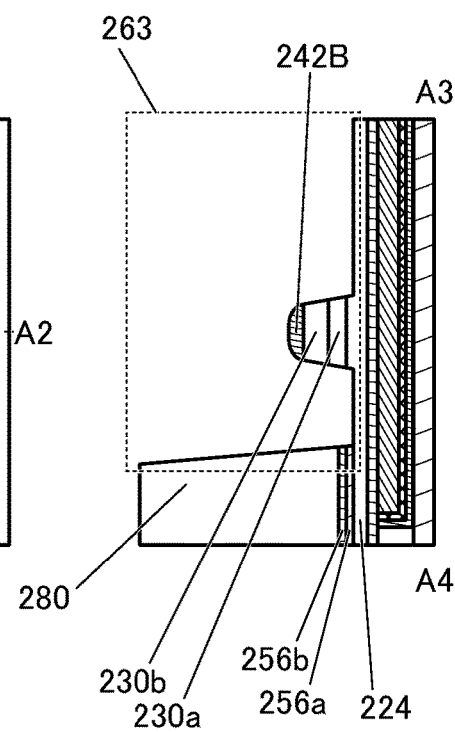
Figure 18B:
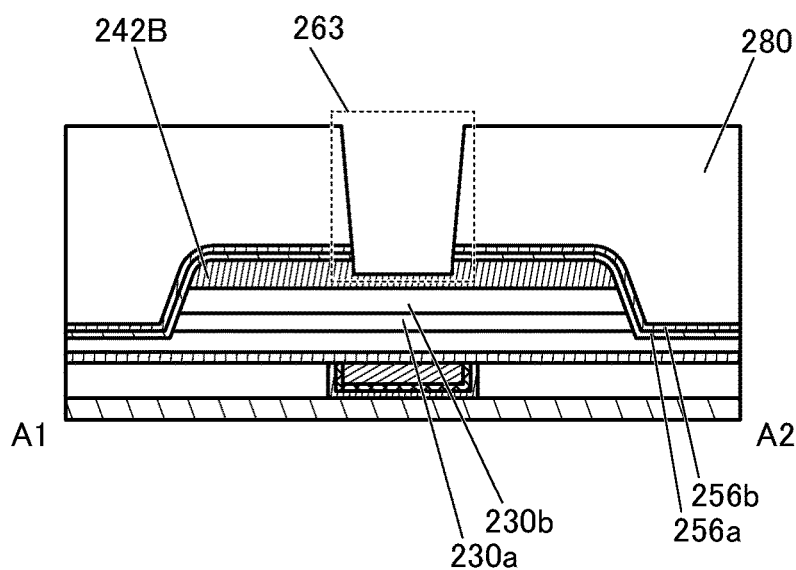
Figure 18D:
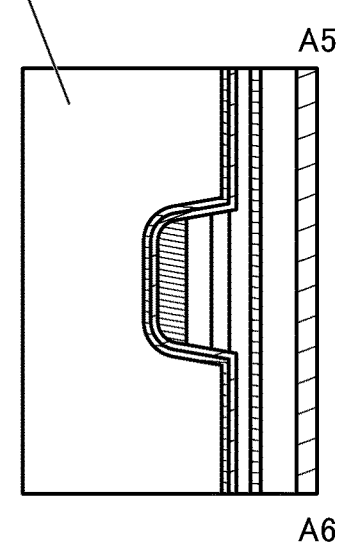
Figure 19A:
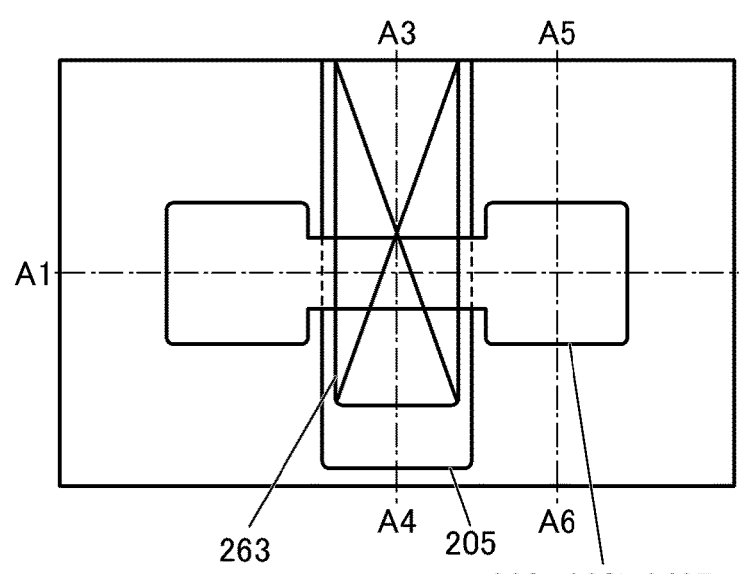
FIGS. 19A to 19D A top view and cross-sectional views illustrating a method for manufacturing a semiconductor device of one embodiment of the present invention.
Figure 19C:
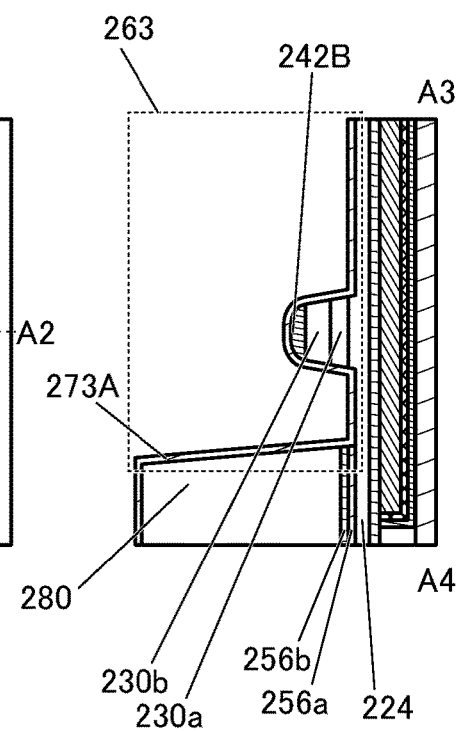
Figure 19B:
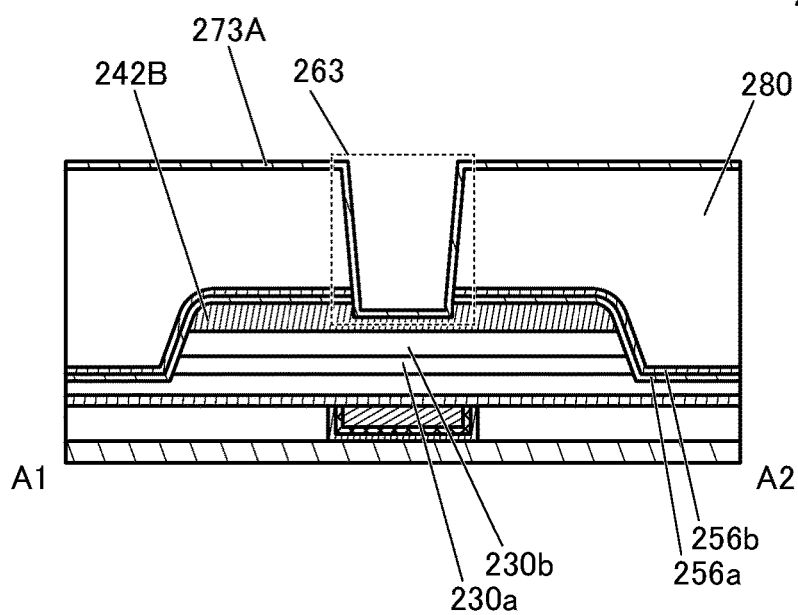
Figure 19D:
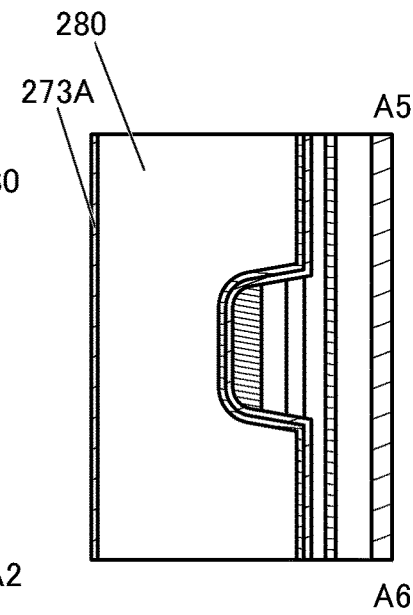
Figure 20A:
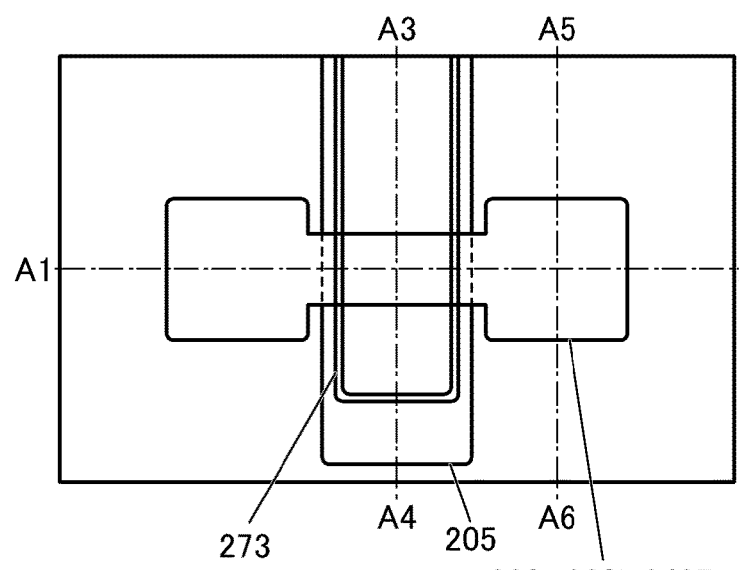
FIGS. 20A to 20D A top view and cross-sectional views illustrating a method for manufacturing a semiconductor device of one embodiment of the present invention.
Figure 20C:
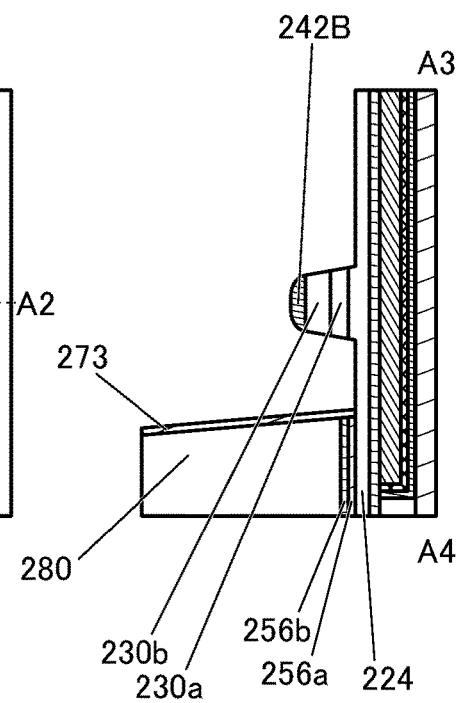
Figure 20B:
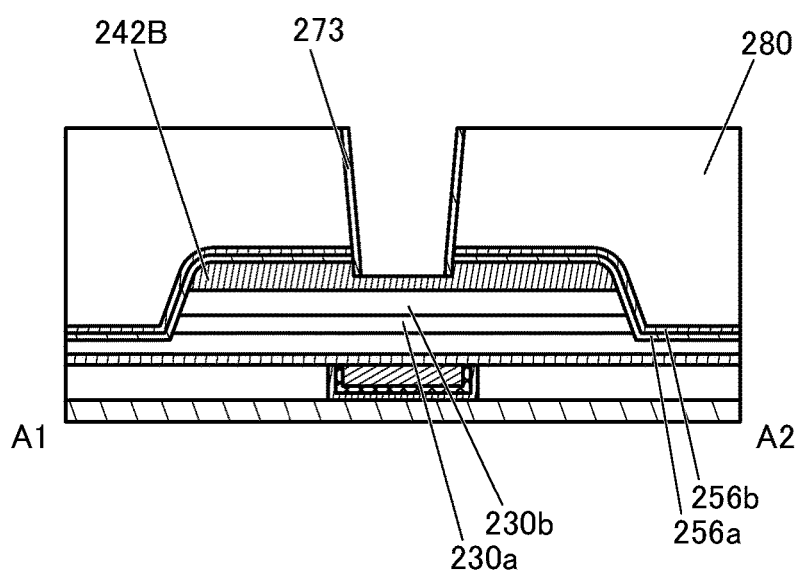
Figure 20D:
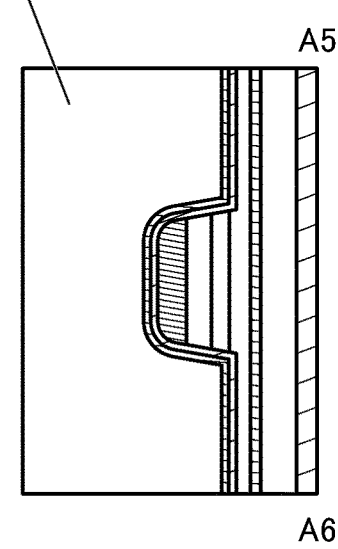
Figure 21A:
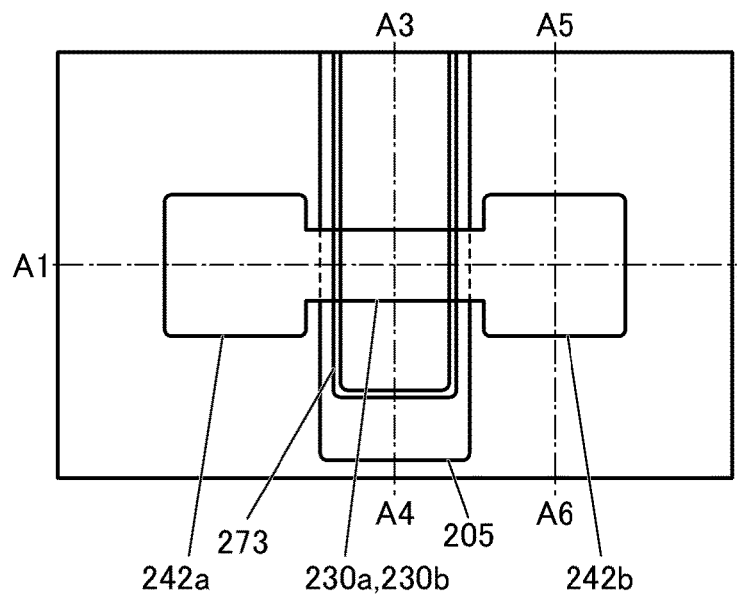
FIGS. 21A to 21D A top view and cross-sectional views illustrating a method for manufacturing a semiconductor device of one embodiment of the present invention.
Figure 21C:
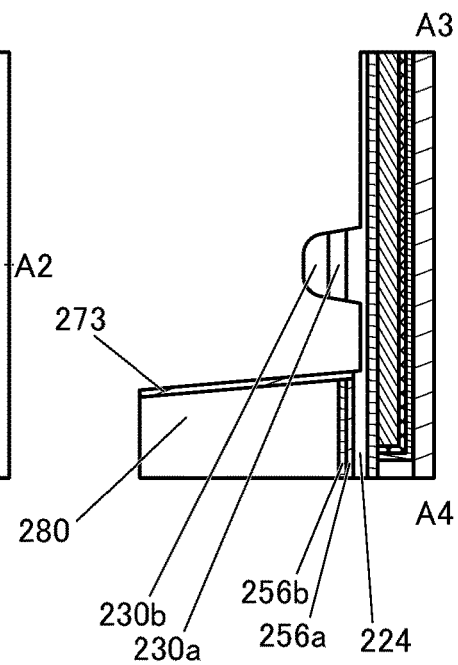
Figure 21B:
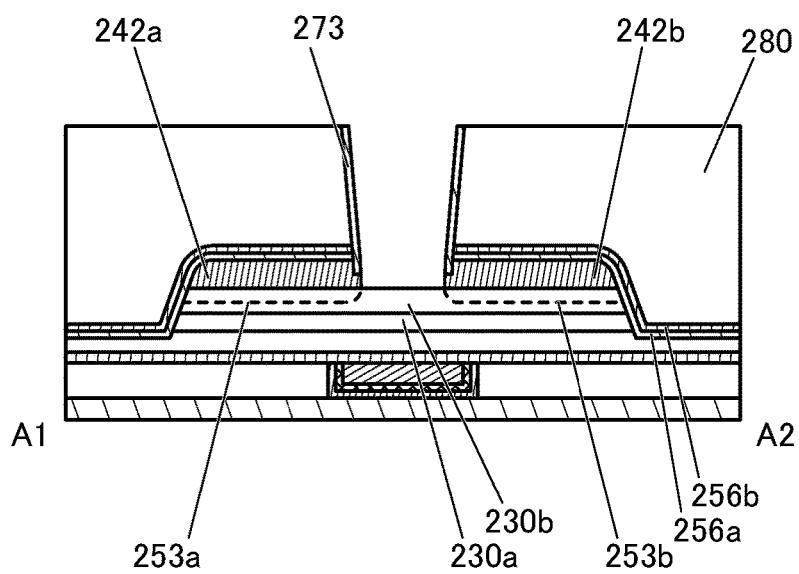
Figure 21D:
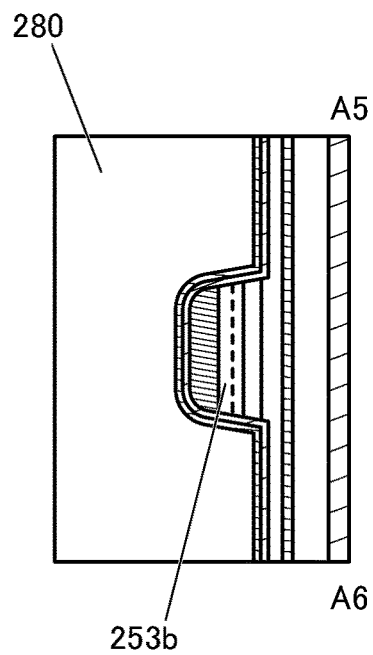

FIG. 4 is an enlarged view of the vicinity of the channel formation region in FIG. 1(B).

As illustrated in FIG. 4, the conductor 242 is provided on and in contact with the oxide 230, and a region 253 (a region 253a and a region 253b) is formed as a low-resistance region at and near the interface between the oxide 230 and the conductor 242. The oxide 230 includes a region 234 functioning as a channel formation region of the transistor 200, a region 231 (a region 231a and a region 231b) including the region 253 and functioning as a source region or a drain region, and a region 232 (a region 232a and a region 232b) between the region 234 and the region 231.

In the region 231 functioning as the source region or the drain region, particularly the region 253 has reduced resistance by having an increased carrier concentration due to a low oxygen concentration or contained impurities such as hydrogen, nitrogen, or a metal element. In other words, the region 231 has higher carrier density and lower resistance than the region 234. Furthermore, the region 234 functioning as the channel formation region is a high-resistance region with a low carrier density because it has a higher oxygen concentration or a lower impurity concentration than specifically the region 253 of the region 231. It is preferable that the oxygen concentration in the region 232 be higher than or equal to the oxygen concentration in the region 231 and lower than or equal to the oxygen concentration in the region 234. Instead, it is preferable that the impurity concentration in the region 232 be lower than or equal to the impurity concentration in the region 231 and higher than or equal to the impurity concentration in the region 234.

That is, depending on the concentration of oxygen or impurities that are contained in the region 232, the region 232 may function as a low-resistance region having resistance substantially equal to that of the region 231, an off-set region having resistance substantially equal to that of the region 234, or a low-resistance region that has higher resistance than the region 231 and lower resistance than the region 234. In particular, in the case where part of the oxide 230 includes a CAAC-OS described later, impurities contained in the region 231 are easily diffused in the a-b plane direction and the resistance of the region 232 is reduced in some cases.

When the region 253, which is a low-resistance region, contains a metal element, the region 253 preferably contains, in addition to the oxide 230, one or a plurality of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like.

Although the region 253 is formed near the interface of the oxide 230b with the conductor 242 in the thickness direction of the oxide 230b in FIG. 4, one embodiment of the present invention is not limited thereto. For example, the region 253 may have substantially the same thickness as the oxide 230b or may also be formed in the oxide 230a. Although the region 253 is formed only in the region 231 in FIG. 4, this embodiment is not limited thereto. In the case where impurities are diffused in the a-b plane direction as described above, the region 253 may be formed in the region 231 and the region 232, in the region 231 and part of the region 232, or in the region 231, the region 232, and part of the region 234.

In the oxide 230, the boundaries between the regions are difficult to detect clearly in some cases. The concentration of a metal element and an impurity element such as hydrogen and nitrogen, which are detected in each region, may be not only gradually changed between the regions, but also continuously changed (also referred to as gradation) in each region. That is, the region closer to the channel formation region has a lower concentration of a metal element and an impurity element such as hydrogen and nitrogen.

To selectively reduce the resistance of the oxide 230, the conductor 242 is preferably formed using, for example, a material containing at least one of impurities and metal elements that increase conductivity, such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum. Alternatively, a conductive film 242A to be the conductor 242 is formed using a material, a deposition method, or the like that injects impurities such as an element that forms oxygen vacancies or an element trapped by oxygen vacancies into the oxide 230. Examples of the elements include hydrogen, boron, carbon, nitrogen, fluorine, phosphorus, sulfur, chlorine, and a rare gas. Typical examples of the rare gas include helium, neon, argon, krypton, and xenon.

A transistor using an oxide semiconductor is likely to have its electrical characteristics changed by impurities and oxygen vacancies in a channel formation region of the oxide semiconductor, which may affect the reliability. Moreover, if the channel formation region of the oxide semiconductor includes oxygen vacancies, the transistor tends to have normally on characteristics. Thus, oxygen vacancies in the region 234 where a channel is formed are preferably reduced as much as possible.

To inhibit the transistor from becoming normally on, the insulator 250 near the oxide 230 preferably contains oxygen more than oxygen in the stoichiometric composition (also referred to as excess oxygen). Oxygen in the insulator 250 is diffused into the oxide 230 to reduce oxygen vacancies in the oxide 230 and prevent the transistor from becoming normally-on.

That is, oxygen contained in the insulator 250 is diffused into the region 234 of the oxide 230, whereby oxygen vacancies in the region 234 of the oxide 230 can be reduced. At this time, the insulator 273 is provided at least on the side surface of the insulator 280, preferably on the side surface of the insulator 280 and the side surface of the conductor 242, whereby the diffusion of oxygen included in the insulator 250 to the insulator 280 or the conductor 242 can be inhibited, so that oxygen can be efficiency supplied to the region 234 in the oxide 230.

With the above-described structure, the amount of oxygen supplied to the oxide 230 can be controlled, so that the transistor which has high reliability and in which normally-on characteristics are inhibited is obtained.

It is preferable to provide the insulator 222, the insulator 256, the insulator 273, the insulator 274, and the like to inhibit diffusion of oxygen contained in the oxide 230, the insulator 250, and the insulator 224 to the outside of the transistor 200. For those insulators, a material that does not easily pass oxygen is preferably used. For example, an oxide containing one of aluminum and hafnium or a nitride of silicon can be used. Furthermore, those insulating films are preferably a material that does not easily pass impurities such as hydrogen, water, nitrogen, and a metal element. The use of such a material can inhibit entry of impurities from the outside of the transistor 200 into the transistor 200.

An oxide semiconductor can be deposited by a sputtering method or the like, and thus can be used for a transistor included in a highly integrated semiconductor device. The transistor using an oxide semiconductor in a channel formation region has an extremely low leakage current (off-state current) in a non-conduction state; thus, a semiconductor device with low power consumption can be provided.

Accordingly, a semiconductor device including a transistor with a high on-state current can be provided. Alternatively, a semiconductor device including a transistor with low off-state current can be provided. Alternatively, a semiconductor device that has stable electrical characteristics with reduced variations in electrical characteristics and higher reliability can be provided.

The detailed structure of the semiconductor device including the transistor 200 of one embodiment of the present invention is described below.

The conductor 260 sometimes functions as a first gate (also referred to as top gate) electrode. The conductor 205 sometimes functions as a second gate (also referred to as bottom gate) electrode. In that case, $V_{th}$ of the transistor 200 can be controlled by changing a potential applied to the conductor 205 independently from a potential applied to the conductor 260. In particular, $V_{th}$ of the transistor 200 can be higher than 0 V and the off-state current can be reduced by applying a negative potential to the conductor 205. Thus, drain current when a potential applied to the conductor 260 is 0 V can be lower in the case where a negative potential is applied to the conductor 205 than in the case where the negative potential is not applied to the conductor 205.

Note that as shown in FIG. 1(A), the conductor 205 is provided to overlap with the oxide 230 and the conductor 260. Furthermore, the conductor 205 is preferably provided to be embedded in the insulator 216. The conductor 205 is preferably larger than the region 234 of the oxide 230. As illustrated in FIG. 1(C), it is particularly preferable that the conductor 205 extend to an outer region than an end portion of the region 234 of the oxide 230 in the channel width direction. That is, the conductor 205 and the conductor 260 preferably overlap with each other with the insulators therebetween on an outer side of the side surface of the oxide 230 in the channel width direction.

With the above structure, when potentials are applied to the conductor 260 and the conductor 205, an electric field generated from the conductor 260 and an electric field generated from the conductor 205 are connected, thereby covering the channel formation region formed in the oxide 230.

That is, the channel formation region in the region 234 can be electrically surrounded by the electric field of the conductor 260 having a function of the first gate electrode and the electric field of the conductor 205 having a function of the second gate electrode. In this specification, a transistor structure in which a channel formation region is electrically surrounded by electric fields of a first gate electrode and a second gate electrode is referred to as a surrounded channel (S-channel) structure.

In the conductor 205, a conductor 205a is formed in contact with the insulator 214 and an inner wall of an opening of the insulator 216, a conductor 205b is formed on an inner side of the conductor 205a, and a conductor 205c is formed on an inner side of the conductor 205b. Here, the top surfaces of the conductor 205a, the conductor 205b, and the conductor 205c can be substantially level with the top surface of the insulator 216. Although the transistor 200 having a structure in which the conductor 205a, the conductor 205b, and the conductor 205c are stacked is described, the present invention is not limited thereto. For example, the conductor 205 may have a single-layer structure, a stacked-layer structure of two layers, or a stacked-layer structure of four or more layers. When a structure body has a stacked-layer structure, layers may be distinguished by ordinal numbers corresponding to the formation order.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (a conductive material through which the above impurities are less likely to pass) is preferably used. Alternatively, it is preferable to use a conductive material that has a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and oxygen.

When the conductor 205a has a function of inhibiting diffusion of oxygen, the conductivity of the conductor 205c can be prevented from being reduced because of oxidation. As a conductive material having a function of inhibiting diffusion of oxygen, for example, tantalum, tantalum nitride, ruthenium, or ruthenium oxide is preferably used. Accordingly, the conductor 205a is a single layer or a stacked layer of the above conductive materials. Thus, impurities, such as hydrogen and water, contained in the layer under the insulator 216 or the insulator 214 can be prevented from being diffused into the transistor 200 side through the conductor 205.

Furthermore, a conductive material containing titanium or titanium nitride as its main component is preferably used for the conductor 205b, and a conductive material containing tungsten, copper, or aluminum as its main component is preferably used for the conductor 205c.

The insulator 214 preferably functions as a barrier insulating film that inhibits the mixing of impurities such as water or hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass).

For example, it is preferable that aluminum oxide, silicon nitride, or the like be used for the insulator 214. Accordingly, impurities such as hydrogen and water can be inhibited from diffusing into the transistor 200 side from the side closer to the substrate than the insulator 214. Alternatively, oxygen contained in the insulator 224 and the like can be inhibited from being diffused into the substrate side beyond the insulator 214.

In addition, the permittivity of the insulator 216, the insulator 280, and the insulator 281 each functioning as an interlayer film is preferably lower than that of the insulator 214. When a material with a low permittivity is used for an interlayer film, the parasitic capacitance generated between wirings can be reduced.

For example, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 216, the insulator 280, and the insulator 281. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 222, the insulator 224, and the insulator 250 have a function of a gate insulator.

Here, it is preferable to use, for the insulator 224, an insulator containing more oxygen than oxygen in the stoichiometric composition. When an insulator containing oxygen is provided in contact with the oxide 230 in such a manner, oxygen vacancies in the oxide 230 can be reduced, so that the reliability of the transistor 200 can be prevented from being lowered and normally-on characteristics are inhibited.

As the insulator containing oxygen, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 224 contains oxygen, it is preferable that the insulator 222 have a function of inhibiting diffusion of oxygen (e.g., at least one of an oxygen atom, an oxygen molecule, and the like) (or that the insulator 222 do not easily transmit the above oxygen).

When the insulator 222 has a function of inhibiting diffusion of oxygen or impurities, oxygen contained in the oxide 230 is not diffused into the insulator 216 side, which is preferable. Furthermore, the conductor 205 can be inhibited from reacting with oxygen contained in the insulator 224 or the oxide 230.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (or an insulating material through which the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 224 be thermally stable. For example, silicon oxide and silicon oxynitride, which have thermal stability, are suitable. When an insulator that is a high-k material is combined with silicon oxide or silicon oxynitride, the insulator 224 having a stacked-layer structure that has thermal stability and a high relative permittivity can be obtained.

Note that the insulator 222 and the insulator 224 may each have a stacked-layer structure of two or more layers. In that case, without limitation to a stacked-layer structure formed of the same material, a stacked-layer structure formed of different materials may be employed. For example, the insulator 222 may have a stacked-layer structure of a material that can be used for the insulator 224 and an insulating material having a function of inhibiting diffusion of impurities, oxygen, and the like.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 230, an In—Ga oxide or an In—Zn oxide may be used. Specifically, the atomic ratio of the element M to the constituent elements in the metal oxide used for the oxide 230a and the oxide 230c is preferably greater than the atomic ratio of the element M to the constituent elements in the metal oxide used for the oxide 230b. Moreover, the atomic ratio of the element M to In in the metal oxide used for the oxide 230a and the oxide 230c is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a and the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at a junction portion of each of the oxide 230a, the oxide 230b, and the oxide 230c. In other words, the energy level of the conduction band minimum continuously changes or is continuously connected at the junction portion of the oxide 230a and the oxide 230b, and the energy level of the conduction band minimum continuously changes or is continuously connected at the junction portion of the oxide 230b and the oxide 230c. To obtain this, the density of defect states in a mixed layer formed at an interface between the oxide 230a and the oxide 230b and an interface between the oxide 230b and the oxide 230c is preferably made low.

Specifically, when the oxide 230a, the oxide 230b, and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used for the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

The oxide 230 includes the region 231 and the region 234. At least part of the region 231 includes a region in contact with the conductor 242.

When the transistor 200 is turned on, the region 231a or the region 231b functions as the source region or the drain region. At least part of the region 234 functions as the region where a channel is formed.

For the oxide 230, a metal oxide functioning as an oxide semiconductor (hereinafter also referred to as an oxide semiconductor) is preferably used. For example, as the metal oxide to be the region 234, it is preferable to use a metal oxide having a band gap of 2 eV or more, preferably 2.5 eV or more. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor included in a highly integrated semiconductor device.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration in the region 231 sometimes decreases. In addition, a metal compound layer that contains the metal contained in the conductor 242 and the component of the oxide 230 is sometimes formed in the region 231. In such a case, the carrier density of the region 231 increases, and the region 231 becomes a low-resistance region.

Here, the region between the conductor 242a and the conductor 242b is formed to overlap with the opening of the insulator 280. Accordingly, the conductor 260 can be provided between the conductor 242a and the conductor 242b in a self-aligned manner.

The insulator 256 is provided to cover the conductor 242 and the oxide 230 and prevents the side surface of the oxide 230 in contact with the insulator 280. The insulator 256 inhibits oxidation of the conductor 242. At this time, the insulator 256 is preferably provided in contact with the insulator 224.

A metal oxide containing one or more kinds selected from hafnium, aluminum, gallium, yttrium, zirconium, tungsten, titanium, tantalum, nickel, germanium, magnesium, and the like can be used as the insulator 256. An oxide or a nitride containing silicon can be used for the insulator 256.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. The insulator 256 inhibits diffusion of oxygen contained in the insulator 280 from the side surface of the oxide 230 to the inside of the oxide 230. Note that in the case where the conductor 242 is an oxidation-resistance material or in the case where the conductivity of the conductor 242 is not significantly decreased even when the conductor 242 absorbs oxygen, the insulator 256 does not necessarily have a function of inhibiting oxidation of the conductor 242.

The insulator 256 may have a stacked-layer structure including the insulator 256a and the insulator 256b. For example, silicon nitride or silicon oxide is preferably used for the insulator 256a, and aluminum oxide or hafnium oxide is preferably used for the insulator 256b.

The insulator 273 is provided in contact with the side surface of the oxide 230a, the side surface and a top surface of the oxide 230b, the side surface of the conductor 242, the side surface of the insulator 256, and the side surface of the insulator 280. In the processing of the insulator 280, the insulator 256, and the conductor 242, the insulator 224 is also processed in some cases. At this time, as illustrated in FIG. 1(C), the insulator 273 is in contact with a side surface of the insulator 224 in some cases. The insulator 273 is in contact with the insulator 222 in some cases. The insulator 273 has a function of inhibiting the passage of oxygen and an impurity such as hydrogen, water, a metal element. A metal oxide containing one kind or two or more kinds selected from hafnium, aluminum, gallium, yttrium, zirconium, tungsten, titanium, tantalum, nickel, germanium, magnesium, and the like can be used for the insulator 273. Alternatively, a nitride of silicon, such as silicon nitride or silicon nitride oxide, can be used.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step.

The insulator 273 in contact with at least the side surface of the conductor 242, the side surface of the insulator 256, and the side surface of the insulator 280 can be provided in such a manner that an insulating film is provided in the opening formed in the insulator 280 and the insulator 256, on the side surface of the conductor 242, and over the insulator 280, and then anisotropic etching is performed on the insulating film, so that the insulator 273 can be provided on the inner wall of the opening and at the side surface of the conductor 242.

The oxide 230c is preferably positioned in contact with the inner side of the insulator 273. Materials that can be used for the oxide 230a or the oxide 230b can be used for the oxide 230c. The oxide 230c may have a stacked-layer structure, and the oxide 230c may be formed by stacking the material that can be used for the oxide 230a over the material that can be used for the oxide 230b.

The insulator 250 is preferably positioned in contact with the inner side of the oxide 230c.

For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulator 224, the concentration of impurities such as water or hydrogen in the insulator 250 is preferably lowered. The thickness of the insulator 250 is preferably greater than or equal to 1 nm and less than or equal to 20 nm.

Although the conductor 260 functioning as the first gate electrode has a two-layer structure in FIG. 1, a single-layer structure or a stacked-layer structure of three or more layers may be employed. For example, when the conductor 260 has a two-layer structure, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, like the conductor 205a. Alternatively, it is preferable to use a conductive material having a function of inhibiting diffusion of oxygen (e.g., at least one of an oxygen atom, an oxygen molecule, and the like). Alternatively, a conductive material similar to that of the conductor 205b is preferably used.

When the conductor 260a has a function of inhibiting oxygen diffusion, it is possible to prevent a reduction in conductivity of the conductor 260b due to oxidation caused by oxygen contained in the insulator 250. As a conductive material having a function of inhibiting oxygen diffusion, for example, tantalum, tantalum nitride, ruthenium, ruthenium oxide, or the like is preferably used. Alternatively, a conductive material containing titanium or titanium nitride as a main component is preferably used.

The conductor 260b is preferably formed using a conductive material containing tungsten, copper, or aluminum. The conductor 260 also functions as a wiring and thus is preferably formed using a conductor having high conductivity. For example, a conductive material containing tungsten, copper, or aluminum as its main component can be used.

In the case where the conductor 205 extends to a region outside the end portion of the oxide 230 in the channel width direction as shown in FIG. 1(C), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, when potentials are applied to the conductor 260 and the conductor 205, an electric field generated from the conductor 260 and an electric field generated from the conductor 205 are connected, thereby covering the channel formation region formed in the oxide 230.

That is, the channel formation region in the region 234 can be electrically surrounded by the electric field of the conductor 260 having a function of the first gate electrode and the electric field of the conductor 205 having a function of the second gate electrode.

The insulator 280 is provided over the conductor 242 with the insulator 256 therebetween. The insulator 280 preferably contains oxygen. For example, the insulator 280 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Note that the concentration of impurities such as water or hydrogen in the insulator 280 is preferably lowered.

The insulator 274 is preferably provided over the insulator 280. The insulator 274 preferably has a function of inhibiting diffusion of oxygen and impurities like the insulator 222, the insulator 256, and the like. When the insulator 274 is formed in an atmosphere containing oxygen, oxygen can be supplied to at least one of the oxide 230c, the insulator 250, and the insulator 280 in some cases. A sputtering method conducted in the atmosphere containing oxygen can be employed for formation of such an insulator. For example, in the case where aluminum oxide is used as the insulator 274, the insulator 274 can be formed by a sputtering method using a target containing aluminum in an atmosphere containing oxygen.

The insulator 281 functioning as an interlayer film is preferably provided over the insulator 274. As in the insulator 224, the insulator 280, and the like, the concentration of impurities such as water or hydrogen in the insulator 281 is preferably lowered.

As illustrated in FIG. 1(B) and FIG. 1(D), the conductor 240a and the conductor 240b are provided in the openings formed in the insulator 281, the insulator 280, and the insulator 256. The conductor 240a and the conductor 240b are provided to face each other with the conductor 260 therebetween. The conductor 240a and the conductor 240b are electrically connected to the conductor 242a and the conductor 242b, respectively. Note that top surfaces of the conductor 240a and the conductor 240b may be on the same plane as the top surface of the insulator 281.

The first conductor of the conductor 240a is formed in contact with the inner wall of the opening formed in the insulator 281, the insulator 280, and the insulator 256. The conductor 242a is located on at least part of the bottom portion of the opening, and thus the conductor 240a is in contact with the conductor 242a. Similarly, the first conductor of the conductor 240b is formed in contact with the inner wall of the opening formed in the insulator 281, the insulator 280, and the insulator 256. The conductor 242b is located on at least part of the bottom portion of the opening, and thus the conductor 240b is in contact with the conductor 242b. Note that an insulator 241 (an insulator 241a and an insulator 241b) may be provided in contact with the inner wall of the opening formed in the insulator 281, the insulator 280, and the insulator 256. For the insulator, a material similar to that of the insulator 256 or the insulator 273 can be used. The insulator 241 can be provided in such a manner that an insulating film is provided in the opening and over the insulator 281 and then anisotropic etching is performed on the insulating film, whereby the insulator 241 can be provided only on the inner wall of the opening. The insulator 241 can inhibit oxygen contained in the insulator 280 and the insulator 281 from being absorbed by the conductor 240.

For the conductor 240a and the conductor 240b, a conductive material containing tungsten, copper, or aluminum as its main component is preferably used. In addition, the conductor 240a and the conductor 240b may have a stacked-layer structure.

Moreover, when the conductor 240 has a stacked-layer structure, the conductor 240 preferably has the stacked-layer structure of a conductive material that has a function of inhibiting the passage of impurities such as water and hydrogen and the above conductive material. For example, a stacked-layer structure in which a conductive material containing tungsten, copper, or aluminum as a main component is provided over a conductive material such as tantalum, tantalum nitride, titanium, titanium nitride, ruthenium, or ruthenium oxide is preferably used. A single layer or a stacked layer of the conductive material having a function of inhibiting the passage of impurities such as hydrogen or water may be used. With the use of the conductive material, impurities such as water or hydrogen can be inhibited from entering the oxide 230 through the conductor 240a and the conductor 240b from a layer above the insulator 281.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that like the conductor 205 or the like, the conductor may be formed to be embedded in an opening provided in an insulator.

<Constituent Material for Semiconductor Device>

Constituent materials that can be used for the semiconductor device are described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is formed over a non-flexible substrate and then the transistor is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced, for example. That is, a durable semiconductor device can be provided.

For the substrate that is a flexible substrate, for example, a metal, an alloy, a resin, glass, or fiber thereof can be used. As the substrate, a sheet, a film, a foil or the like that contains a fiber may also be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K may be used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. In contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure, which is thermally stable and has a low relative permittivity, can be obtained by combination with a resin, for example. Examples of the resin include polyester, polyolefin, polyamide (nylon, aramid, or the like), polyimide, polycarbonate, and acrylic. Furthermore, a stacked-layer structure, which is thermally stable and has a high relative permittivity, can be obtained by combination of silicon oxide and silicon oxynitride with an insulator having a high relative permittivity, for example.

In addition, when a transistor using an oxide semiconductor is surrounded by an insulator having a function of inhibiting the passage of oxygen and impurities such as hydrogen, the transistor can have stable electrical characteristics.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds selected from hafnium, aluminum, gallium, yttrium, zirconium, tungsten, titanium, tantalum, nickel, germanium, magnesium, and the like can be used as the insulator 256 or the insulator 273. Moreover, a nitride of silicon or a nitride of silicon containing oxygen, that is, silicon nitride, silicon nitride oxide, or the like can be used.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property.

Note that the insulator 224 preferably contains oxygen. For example, when a structure is employed in which silicon oxide or silicon oxynitride is in contact with the oxide 230, oxygen vacancies included in the oxide 230 can be compensated.

For example, an insulator containing an oxide of one or more kinds of aluminum, hafnium, and gallium can be used as the insulator 222 functioning as part of the gate insulator. In particular, as the insulator containing an oxide of one or both of aluminum and hafnium, aluminum oxide, hafnium oxide, an oxide containing aluminum and hafnium (hafnium aluminate), or the like is preferably used.

The insulator 222 preferably has a function of inhibiting diffusion of oxygen included in the insulator 224 to the insulator 220 side.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited.

The insulator 216, the insulator 280, and the insulator 281 preferably include an insulator with a low relative permittivity. For example, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low relative permittivity. Examples of the resin include polyester, polyolefin, polyamide (nylon, aramid, or the like), polyimide, polycarbonate, and acrylic.

As the insulator 214, the insulator 256, the insulator 273, and the insulator 274, an insulator having a function of inhibiting the passage of oxygen and impurities such as hydrogen is used. For the insulator 214, the insulator 256, the insulator 273, and the insulator 274, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like is used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

For the conductor 260, the conductor 205, the conductor 242, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

<<Metal Oxide>>

As the oxide 230, a metal oxide functioning as an oxide semiconductor (hereinafter also referred to as an oxide semiconductor) is preferably used. A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention is described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers flow also in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even near distortion in the CAAC-OS. That is, formation of a crystal grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (oxygen vacancies (also referred to as Vo) or the like). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an indium-gallium-zinc oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (a metal oxide) can have various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used for a channel formation region of a transistor is described.

Note that when the above metal oxide is used for a channel formation region of a transistor, the transistor having high field-effect mobility can be achieved. In addition, the transistor having high reliability can be achieved.

Here, an example of the hypothesis about electric conduction of a metal oxide is described.

Electric conduction in a solid is inhibited by a scattering source called a scattering center. For example, it is known that in the case of single crystal silicon, lattice scattering and ionized impurity scattering are main scattering centers. In other words, in the elemental state with few lattice defects and impurities, the carrier mobility is high because there is no factor that inhibits the electric conduction in the solid.

The above presumably applies to a metal oxide. For example, it is probable that a metal oxide containing less oxygen than that in the stoichiometric composition has many oxygen vacancies. Atoms around the oxygen vacancies are located in places shifted from those in the elemental state. This distortion due to the oxygen vacancies might become a scattering center.

Furthermore, a metal oxide containing less oxygen than that in the stoichiometric composition contains excess oxygen, for example. Excess oxygen existing in a liberated state in the metal oxide becomes $O^-$ or $O^{2-}$ by receiving an electron. Excess oxygen that has become $O^-$ or $O^{2-}$ might be a scattering center.

According to the above, it is probable that in the case where the metal oxide has an elemental state containing oxygen in the stoichiometric composition, the carrier mobility is high.

Since crystals of an indium-gallium-zinc oxide (hereinafter, IGZO) that is a kind of metal oxide containing indium, gallium, and zinc tend not to grow particularly in the air and thus, a stable structure is obtained in some cases when IGZO is formed of smaller crystals (e.g., the above-described nanocrystals) rather than larger crystals (here, crystals with a size of several millimeters or several centimeters). This is probably because connection of small crystals, rather than formation of large crystals, leads to a reduction in distortion energy.

Note that in a region where small crystals are connected to each other, defects are formed in some cases to reduce the distortion energy of the region. Thus, when the distortion energy is reduced without formation of a defect in the region, the carrier mobility can be increased.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide is described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using a metal oxide containing hydrogen is likely to have normally-on characteristics.

Hydrogen contained in a metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amount of hydrogen contained in the region. That is, the high-density region is a region that contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition including indium, gallium, and zinc, the high-density region contains indium, gallium, and zinc and the low-density region contains indium and zinc in some cases. In other words, the proportion of gallium in the low-density region is lower than that in the high-density region in some cases.

Note that the above shallow defect states probably result from oxygen vacancies. When oxygen vacancies in the metal oxide increase, the density of deep defect states (dDOS: deep level Density of States) as well as the density of shallow defect states probably increase. This is probably because deep defect states also result from oxygen vacancies. Note that deep defect states refer to defect states that are located around the center of the band gap.

Therefore, a reduction in the number of oxygen vacancies in the metal oxide can lead to a reduction in the density of both shallow defect states and deep defect states. Furthermore, shallow defect states can probably be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby the density of shallow defect states can be reduced.

Shallow defect states in a metal oxide affect the electrical characteristics of a transistor using the metal oxide for a semiconductor layer. In other words, owing to shallow defect states, the drain current Id changes gently with respect to the gate voltage Vg in the drain current-gate voltage (Id-Vg) characteristics of the transistor, worsening the S value (also referred to as Subthreshold Swing or SS), which is one of criteria for judging the rising characteristics of a transistor from an off state to an on state. This is probably because of trapping of electrons by shallow defect states.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which impurities are sufficiently reduced is used in a channel formation region of a transistor, stable electrical characteristics can be imparted.

[Effect of Vacuum Baking]

Here, a weak Zn—O bond included in a metal oxide is described, and an example of a method for reducing the numbers of oxygen atoms and zinc atoms that form the bond is described.

In a transistor using a metal oxide, an oxygen vacancy is given as an example of a defect that leads to poor electrical characteristics of the transistor. For example, the threshold voltage of a transistor using a metal oxide including oxygen vacancies tends to shift in the negative direction, and thus the transistor tends to have normally-on characteristics. This is because a donor caused by oxygen vacancies in the metal oxide is generated and the carrier concentration is increased. The transistor having normally-on characteristics causes various problems where malfunction is likely to occur at the time of operation and power consumption is increased at the time of non-operation, for example.

Furthermore, a thermal budget in a step of forming a connection wiring for fabricating a module causes problems such as degradation of the electrical characteristics of the transistor, such as a variation in threshold voltage and an increase in parasitic resistance, and an increase in variation in the electrical characteristics due to the degradation of the electrical characteristics. Since such problems lead directly to a decrease in manufacturing yield, it is important to consider countermeasures. Moreover, the electrical characteristics degrade through a stress test, which can evaluate changes in transistor characteristics due to long-term use (changes over time) in a short time. The degradation of the electrical characteristics is presumably caused by oxygen vacancies in the metal oxide due to high-temperature treatment performed in the manufacturing process or electrical stress applied during the stress test.

In the metal oxide, there is an oxygen atom that has a weak bond to a metal atom and is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When a weak Zn—O bond exists in the metal oxide, the bond is broken by heat or current stress applied on the metal oxide, so that oxygen vacancies are formed. The formation of oxygen vacancies decreases the stability of the transistor, such as resistance to a thermal budget and resistance to the stress test.

A bond generated between an oxygen atom bonded to many zinc atoms and the zinc atoms is a weak Zn—O bond in some cases. A zinc atom is bonded to an oxygen atom more weakly than a gallium atom is. Thus, an oxygen atom bonded to many zinc atoms is likely to form a vacancy. That is, a bond generated between a zinc atom and an oxygen atom is probably weaker than a bond between an oxygen atom and another metal.

In addition, it is probable that a weak Zn—O bond is likely to be formed when impurities exist in the metal oxide. Examples of impurities in the metal oxide include a water molecule and hydrogen. When a water molecule or hydrogen exists in the metal oxide, a hydrogen atom is sometimes bonded to an oxygen atom forming the metal oxide (which is also referred to as an OH bond). In the case where the In—Ga—Zn oxide is single crystal, an oxygen atom forming the metal oxide is bonded to four metal atoms forming the metal oxide. However, an oxygen atom bonded to a hydrogen atom is bonded to two or three metal atoms in some cases. When the number of metal atoms bonded to an oxygen atom decreases, the oxygen atom is likely to form an oxygen vacancy. Note that when a zinc atom is bonded to an oxygen atom that forms an OH bond, the bond between the oxygen atom and the zinc atom is probably weak.

In addition, a weak Zn—O bond is sometimes formed in distortion in a region where a plurality of nanocrystals are connected. Although the shape of nanocrystals is basically a hexagon, they have pentagonal lattice arrangement, heptagonal lattice arrangement, or the like in the distortion. A weak Zn—O bond is formed in the distortion presumably because the bond distances between atoms are not uniform in the distortion.

In addition, it is probable that a weak Zn—O bond is likely to be formed when the crystallinity of the metal oxide is low. When the crystallinity of the metal oxide is high, a zinc atom forming the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom is likely to form a vacancy. That is, a bond generated between a zinc atom and an oxygen atom is presumably weaker than a bond generated in single crystal.

Reducing the number of oxygen atoms and zinc atoms that form the weak Zn—O bonds inhibits formation of oxygen vacancies due to heat treatment or current stress and can improve the stability of the transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the numbers of zinc atoms and oxygen atoms that form the weak Zn—O bonds.

As a method for reducing the numbers of oxygen atoms and zinc atoms that form the weak Zn—O bonds, a method in which vacuum baking is performed after a metal oxide is deposited can be given. Vacuum baking is heat treatment performed in a vacuum atmosphere. A vacuum atmosphere is kept by evacuation with a turbomolecular pump or the like. Note that pressure in a treatment chamber is lower than or equal to $1\times10^{-2}$ Pa, preferably lower than or equal to $1\times10^{-3}$ Pa. In addition, the substrate temperature in the heat treatment is higher than or equal to 300° C., preferably higher than or equal to 400° C.

Performing the vacuum baking can reduce the numbers of oxygen atoms and zinc atoms that form the weak Zn—O bonds. Furthermore, since the metal oxide is heated by the vacuum baking, atoms included in the metal oxide are rearranged after the numbers of oxygen atoms and zinc atoms that form the weak Zn—O bonds are reduced, so that the number of oxygen atoms each bonded to four metal atoms is increased. Consequently, the numbers of oxygen atoms and zinc atoms that form the weak Zn—O bonds can be reduced, and a weak Zn—O bond can be inhibited from being formed again.

In addition, when impurities exist in the metal oxide, performing the vacuum baking can release water molecules or hydrogen in the metal oxide and reduce the number of OH bonds. When the number of OH bonds in the metal oxide decreases, the proportion of the oxygen atoms each bonded to four metal atoms increases. Furthermore, the atoms forming the metal oxide are rearranged when water molecules or hydrogen is released, so that the number of oxygen atoms each bonded to four metal atoms increases. Thus, a weak Zn—O bond can be inhibited from being formed again.

As described above, when vacuum baking is performed after the metal oxide is deposited, the numbers of oxygen atoms and zinc atoms that form weak Zn—O bonds can be reduced. Thus, the stability of the transistor can be improved through the step. Furthermore, an improvement in stability of the transistor increases the degree of freedom in selecting materials and formation methods.

<Method for Manufacturing Semiconductor Device>

Next, a method for manufacturing a semiconductor device including the transistor 200 of the present invention is described with reference to FIG. 5 to FIG. 14. In FIG. 5 to FIG. 14, (A) in each drawing is a top view. Furthermore, (B) in each drawing is a cross-sectional view corresponding to a portion indicated by a dashed-dotted line A1-A2 in (A), and is also a cross-sectional view of the transistor 200 in the channel length direction. Moreover, (C) in each drawing is a cross-sectional view corresponding to a portion indicated by a dashed-dotted line A3-A4 in (A), and is also a cross-sectional view of the transistor 200 in the channel width direction. In addition, (D) in each drawing is a cross-sectional view corresponding to a portion indicated by a dashed-dotted line A5-A6 in (A), and is also a cross-sectional view of a portion where the transistor 200 is connected to the conductor 240b. Note that for clarity of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

An ALD method is also a deposition method that enables less plasma damage to an object. An ALD method also does not cause plasma damage during deposition, so that a film with few defects can be obtained. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared with the case where the film is formed using a plurality of deposition chambers, time taken for the film formation can be shortened because time taken for transfer and pressure adjustment is omitted. Thus, the productivity of the semiconductor device can be increased in some cases.

In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited by an ALD method over the aluminum oxide. Alternatively, a structure may be employed in which aluminum oxide is deposited by an ALD method and aluminum oxide is deposited by a sputtering method over the aluminum oxide.

Next, the insulator 216 is formed over the insulator 214. The insulator 216 can be formed by a sputtering method, a CVD method, an MBE method, a PLD method, an ALD method, or the like. In this embodiment, for the insulator 216, silicon oxide is deposited by a CVD method.

Then, an opening reaching the insulator 214 is formed in the insulator 216. Note that examples of the opening include a groove and a slit. A region where the opening is formed may be referred to as an opening portion. A wet etching method may be used for the formation of the opening; however, a dry etching method is preferably used for microfabrication. As the insulator 214, it is preferable to select an insulator that functions as an etching stopper used in forming the opening by etching the insulator 216. For example, in the case where silicon oxide is used for the insulator 216 in which the opening is formed, silicon nitride, aluminum oxide, or hafnium oxide is preferably used for the insulator 214 as the insulator that functions as an etching stopper.

After the formation of the opening, a conductive film to be the conductor 205a is deposited. The conductive film preferably includes a conductor having a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, for the conductive film to be the conductor 205a, tantalum nitride is deposited by a sputtering method. With the use of such a metal nitride as the conductor 205a, even when a metal that is easy to diffuse, such as copper, is used for the conductor 205c described later, the metal can be inhibited from being diffused outward through the conductor 205a.

Next, a conductive film to be the conductor 205b is formed over the conductive film to be the conductor 205a. The conductive film can be deposited by a sputtering method, a CVD method, an MBE method, a PLD method, an ALD method, or the like. In this embodiment, for the conductive film to be the conductor 205b, a conductive material such as titanium or titanium nitride is deposited.

Next, a conductive film to be the conductor 205c is deposited over the conductive film to be the conductor 205b. The conductive film can be deposited by a sputtering method, a CVD method, an MBE method, a PLD method, an ALD method, or the like. In this embodiment, as the conductive film to be the conductor 205c, a conductive material having lower resistance than the conductor 205a and the conductor 205b, such as tungsten, aluminum, or copper, is deposited.

Next, part of the conductive film to be the conductor 205a, part of the conductive film to be the conductor 205b, and part of the conductive film to be the conductor 205c are removed by CMP treatment to expose the insulator 216. As a result, the conductive film to be the conductive film to be the conductor 205a, the conductive film to be the conductor 205b, and the conductive film to be the conductor 205c remain only in the opening portion. Thus, the conductor 205 including the conductor 205a, the conductor 205b, and the conductor 205c, which has a flat top surface, can be formed (see FIG. 5). Note that the insulator 216 is partly removed by the CMP treatment in some cases.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. The insulator 222 having a barrier property against oxygen can inhibit diffusion of oxygen contained in and above the insulator 224 to the insulator 216 side; thus, oxygen can be supplied to the oxide 230 efficiently. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulator 224 is deposited over the insulator 222. The insulator 224 can be formed by a sputtering method, a CVD method, an MBE method, a PLD method, an ALD method, or the like. In this embodiment, for the insulator 224, silicon oxynitride is deposited by a CVD method.

Next, heat treatment is preferably performed. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at higher than or equal to 10 ppm, higher than or equal to 1%, or higher than or equal to 10%. Alternatively, the heat treatment may be performed under reduced pressure. Alternatively, the heat treatment may be performed by performing heat treatment in a nitrogen or inert gas atmosphere and then performing heat treatment in an atmosphere containing an oxidizing gas at higher than or equal to 10 ppm, higher than or equal to 1%, or higher than or equal to 10% to compensate for released oxygen.

In this embodiment, as the heat treatment, treatment is performed at 400° C. in a nitrogen atmosphere for one hour after deposition of the insulator 224. Through the above heat treatment, impurities such as hydrogen and water contained in the insulator 224 can be removed, for example.

The above heat treatment may be performed after the insulator 222 is deposited. For the heat treatment, the conditions for the above-described heat treatment can be used.

Here, in order to add oxygen to the insulator 224, plasma treatment containing oxygen may be performed under reduced pressure. The plasma treatment with oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as hydrogen and water contained in the insulator 224 can be removed by selecting the conditions for the plasma treatment appropriately. In that case, the heat treatment does not need to be performed.

Next, an oxide film 230A to be the oxide 230a and an oxide film 230B to be the oxide 230b are deposited in this order over the insulator 224 (see FIG. 5). Note that the oxide films are preferably formed successively without exposure to an air atmosphere. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, an In-M-Zn oxide target can be used, for example.

In particular, part of oxygen contained in the sputtering gas is supplied to the insulator 224 during the deposition of the oxide film 230A in some cases. Therefore, the proportion of oxygen contained in the sputtering gas for the oxide film 230A is higher than or equal to 70%, preferably higher than or equal to 80%, further preferably 100%.

In addition, in the case where the oxide film 230B is formed by a sputtering method, an oxygen-deficient oxide semiconductor is formed under a condition where the proportion of oxygen contained in the sputtering gas is higher than or equal to 1% and lower than or equal to 30%, preferably higher than or equal to 5% and lower than or equal to 20%. In a transistor in which an oxygen-deficient oxide semiconductor is used for its channel formation region, comparatively high field-effect mobility can be obtained.

In this embodiment, the oxide film 230A is deposited by a sputtering method using a target with In:Ga:Zn=1:3:4 [atomic ratio] or In:Ga:Zn=1:1:0.5 [atomic ratio] (2:2:1 [atomic ratio]). The oxide film 230B is deposited by a sputtering method using a target with In:Ga:Zn=4:2:4.1 [atomic ratio], In:Ga:Zn=4:2:2 [atomic ratio], 4:2:1 [atomic ratio], or 4:2:0 [atomic ratio] (In:Ga=4:2 [atomic ratio]). Note that each of the oxide films is formed to have characteristics required for the oxide 230 by selecting the deposition condition and the atomic ratio as appropriate.

Next, heat treatment may be performed. For the heat treatment, the conditions for the above heat treatment can be used. Through the heat treatment, impurities such as hydrogen and water in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Then, the conductive film 242A is formed over the oxide film 230B (see FIG. 5). For the conductive film 242A, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Note that the conductive film 242A can be formed by a sputtering method, a CVD method, an MBE method, a PLD method, an ALD method, or the like.

Then, the conductive film 242A is processed to form a hard mask for processing the oxide film 230A and the oxide film 230B.

Note that for the processing of the conductive film 242A, a lithography method can be employed. In addition, a dry etching method or a wet etching method can be used for the processing. Processing by a dry etching method is suitable for microfabrication.

In the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that the above mask for the exposure of the resist to light is unnecessary in the case of using an electron beam or an ion beam because direct writing is performed on the resist. Note that for removal of the resist mask, dry etching treatment such as ashing can be performed, wet etching treatment can be performed, wet etching treatment can be performed after dry etching treatment, or dry etching treatment can be performed after wet etching treatment, for example.

Next, the conductive film 242A is etched using a resist mask, so that the conductor 242B functioning as the hard mask is formed (see FIG. 6). After the formation of the conductor 242B, the oxide films may be processed after removal of the resist mask or without removal of the resist mask. In the latter case, the resist mask sometimes disappears during the etching. The hard mask may be removed by etching after the oxide films are etched; however, since the conductor 242B is further processed to form the source electrode and the drain electrode in this embodiment, the conductor 242B is not removed.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Then, the oxide film 230A and the oxide film 230B are processed into island shapes with the use of the conductor 242B as a hard mask to form the oxide 230a and the oxide 230b (see FIG. 6). Note that the insulator 224 is partly removed by the processing in some cases.

Here, the oxide 230a and the oxide 230b are formed to at least partly overlap with the conductor 205. It is preferable that the side surfaces of the oxide 230a and the oxide 230b be tapered with respect to a top surface of the insulator 222 or a top surface of the substrate. When the side surfaces of the oxide 230a and the oxide 230b are tapered with respect to the top surface of the insulator 222 or the top surface of the substrate, coverage with a film to be formed on the side surfaces of the oxide 230a and the oxide 230b in a later step is improved. On the other hand, in the case where an ALD method, a CVD method, or the like that enables deposition of film with favorable coverage is used for the film to be formed on the side surfaces of the oxide 230a and the oxide 230b in a later step, the side surfaces may have vertical shapes.

There is a curved surface between the side surfaces of the oxide 230a, the oxide 230b, and the conductor 242B and a top surface of the conductor 242B. That is, it is preferable that an end portion of the side surface and an end portion of the top surface be curved (hereinafter also referred to as a rounded shape). The radius of curvature of the curved surface at an end portion of the conductor 242B is greater than or equal to 3 nm and less than or equal to 10 nm, preferably greater than or equal to 5 nm and less than or equal to 6 nm, for example. When the end portions are not angular, coverage with films in a later deposition process can be improved.

Note that for the processing of the oxide films, the conductor 242B can be used as a hard mask and either a dry etching method or a wet etching method can be employed. Processing by a dry etching method is suitable for microfabrication.

In some cases, treatment such as dry etching described above makes impurities due to an etching gas or the like to attach to the side surface or to be diffused into the oxide 230a, the oxide 230b, and the like. Examples of the impurities include fluorine and chlorine.

In order to remove the impurities and the like, cleaning is performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, hydrogen peroxide water, a hydrofluoric acid, or the like with pure water or carbonated water. Alternatively, ultrasonic cleaning using pure water or carbonated water may be performed. In this embodiment, ultrasonic cleaning using pure water or water carbonate is performed.

Then, heat treatment may be performed. For the conditions of the heat treatment, the conditions for the above heat treatment can be used. Note that in the case where the heat treatment might cause oxidation of the conductor 242B, the heat treatment is preferably performed in an atmosphere containing no oxygen. In the case where the conductor 242B contains an oxidation-resistant material, the heat treatment may be performed in an oxygen-containing atmosphere.

Then, the insulator 256A and the insulator 256B are sequentially deposited over the insulator 224, the oxide 230a, the oxide 230b, and the conductor 242B (see FIG. 7). Note that the insulator 256A and the insulator 256B preferably function as an insulating barrier, and an insulator containing an oxide of one or both of aluminum and hafnium is preferably deposited. Note that as the insulator containing an oxide of one or both of aluminum and hafnium, aluminum oxide, hafnium oxide, an oxide containing aluminum and hafnium (hafnium aluminate), or the like is preferably used. Alternatively, silicon nitride or silicon nitride oxide can be used as the insulator functioning as the insulating barrier. Since the side surface of the oxide 230 is covered with the insulator 256A and the insulator 256B having a barrier property, entry of oxygen or impurities such as hydrogen or water from the side surface of the oxide 230 can be prevented. Furthermore, the insulator 256A and the insulator 256B can inhibit oxidation of the conductor 242B, and thus the selection range of the material that can be used for the conductor 242 can be wider. For example, silicon oxide can be used as the insulator 256A. The insulator 256A and the insulator 256B can be formed by a sputtering method, a CVD method, an MBE method, a PLD method, an ALD method, or the like.

Note that it is preferable that the insulator 256A and the insulator 256B be successively deposited without being exposed to the air. By the deposition without exposure to the air, impurities or moisture from the atmospheric environment can be prevented from being attached onto the insulator 256A and the insulator 256B, so that the vicinity of an interface between the insulator 256A and the insulator 256B can be kept clean. In this embodiment, silicon nitride is formed by an ALD method for the insulator 256A, and aluminum oxide is formed by an ALD method for the insulator 256B. Alternatively, silicon nitride is formed by a sputtering method for the insulator 256A, and aluminum oxide is formed by a sputtering method for the insulator 256B. Alternatively, silicon oxide may be formed by the above-described method for the insulator 256A.

Then, the insulator 280 is deposited over the insulator 256B (see FIG. 7). The insulator 280 preferably contains oxygen. The insulator 280 preferably includes an insulator with a low relative permittivity. For example, the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide, silicon oxynitride, silicon nitride oxide, and porous silicon oxide are preferably used for the insulator 280 because oxygen can be easily added to the insulator 280 in a later step. Silicon oxide and silicon oxynitride are preferable because of their thermal stability. The insulator 280 can be formed by a sputtering method, a CVD method, an MBE method, a PLD method, an ALD method, or the like. Alternatively, the insulator 280 can be formed by a spin coating method, a dipping method, a droplet discharging method (e.g., an ink-jet method), a printing method (e.g., screen printing or offset printing), a doctor knife method, a roll coater method, a curtain coater method, or the like. In this embodiment, silicon oxynitride is deposited as the insulator 280 by a CVD method.

Note that the insulator 280 is preferably formed to have a flat top surface. For example, the insulator 280 may have a flat top surface right after the formation. Alternatively, for example, the insulator 280 may have flatness by removing an insulator or the like from the top surface after the formation so that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment. Note that the insulator 280 does not necessarily have a flat top surface.

Next, processing is performed on the insulator 280, the insulator 256A, and the insulator 256B by a lithography method, so that the opening 263 that has a region at least overlapping with the conductor 205, the insulator 256a, and the insulator 256b are formed (see FIG. 8). Although a wet etching method may be employed for the processing of the insulator 280, a dry etching method is preferably employed because it enables microfabrication and enables a side surface of the insulator 280 to be processed substantially vertical.

In the processing of the insulator 280, the insulator 256B preferably functions as an etching stopper. That is, it is preferable that the insulator 280 be processed under conditions such that the etching rate of the insulator 256B be sufficiently lower than the etching rate of the insulator 280. In this manner, disappearance of the insulator 256B due to overetching of the insulator 280 can be inhibited. Furthermore, in the processing of the insulator 256B, the insulator 256A preferably functions as an etching stopper. A dry etching method or a wet etching method can be used for the processing of the insulator 256B. Alternatively, a combination thereof may be used. A dry etching method or a wet etching method can be used for the processing of the insulator 256A. Alternatively, a combination thereof may be used.

Next, the conductor 242B exposed in the opening 263 is processed, so that the conductor 242a and the conductor 242b are formed (see FIG. 9). For the processing of the conductor 242B, dry etching is preferably used. In order to inhibit oxidation of the side surfaces of the conductor 242a and the conductor 242b that are exposed by the processing, conditions not including oxygen are preferably used for the processing. It is preferable that no oxygen be introduced into an etching treatment chamber (etching chamber) before and after the processing. For example, in the case where the substrate is attached on a stage of the treatment chamber using an electrostatic chuck, it is preferable that a gas containing oxygen, plasma containing oxygen, or the like be not used also in an electricity removal step for a processed substrate. For example, the electricity removal step is performed using plasma containing nitrogen as a main component, so that the substrate is removed from the stage.

Here, heat treatment is preferably performed. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. In the case where the conductor 242 has oxidation resistance, the heat treatment may be performed in an oxygen-containing atmosphere. Alternatively, the heat treatment may be performed under reduced pressure. The heat treatment may be vacuum baking in which heat treatment is performed in vacuum with the reduced pressure of a treatment chamber to lower than or equal to $1\times10^{-2}$ Pa. The vacuum baking can reduce zinc atoms and oxygen atoms included in the weak Zn—O bonds, and thus can inhibit deterioration of the electrical characteristics of the transistor, particularly deterioration due to a thermal budget in the fabrication of the transistor and the module. The vacuum baking may be performed in a treatment chamber where the insulator 273A is formed. In this case, the insulator 273A can be formed after the vacuum baking in the treatment chamber. For example, as the heat treatment, treatment is performed at 400° C. in a nitrogen atmosphere for one hour.

Through the heat treatment, impurities such as hydrogen and water contained in the oxide 230a and the oxide 230b can be removed. Furthermore, damages that have been caused in the oxide 230a or the oxide 230b by the dry etching in the above processing can be recovered. In the case where the heat treatment is performed in an oxygen-containing atmosphere, oxygen can be added to the oxide 230a and the oxide 230b.

Through the heat treatment, the metal element included in the conductor 242 is diffused into the oxide 230; thus, the metal element can be added to the oxide 230. Moreover, oxygen in the oxide 230 is absorbed by the conductor 242 in some cases. As a result, the oxide 230 in the vicinity of the interface with the conductor 242 becomes a metal compound and the resistance thereof is reduced. At this time, part of the oxide 230 may be alloyed with the metal element.

When part of the oxide 230 is alloyed with the metal element, the metal element added to the oxide 230 is brought into a relatively stable state; therefore, a highly reliable semiconductor device can be provided. Note that in FIG. 9(B), the region 253 (the region 253a and the region 253b) is shown by dotted lines as an example of the above-described low-resistance region of the oxide 230.

The example shows that in the oxide 230b and the oxide 230a, the region 253a and the region 253b are provided to spread in the depth direction from the conductor 242; however, the present invention is not limited thereto. The region 253a and the region 253b may be formed only in the oxide 230b near the conductor 242 in the depth direction, may be formed in the entire of the oxide 230b, or may be formed not only in the oxide 230b but also at part of the oxide 230a. This example shows that the region 253a and the region 253b are formed only in regions overlapping with the conductor 242 in the horizontal direction; however, the present invention is not limited thereto. The region 253a and the region 253b may spread in the horizontal direction, or may be formed to be spread in the region 232a and the region 232b in FIG. 4 or may be formed in a region overlapping with part of the conductor 260 formed in a later step.

In the case where hydrogen in the oxide 230 is diffused into the region 253 and enters an oxygen vacancy in the region 253, the hydrogen becomes relatively stable. Hydrogen in an oxygen vacancy in the region 234 shown in FIG. 4 is released from the oxygen vacancy by heat treatment at higher than or equal to 250° C. and diffused into the region 253, enters an oxygen vacancy in the region 253, and becomes relatively stable. Thus, by the heat treatment, the resistance of the region 253 is further reduced, and the region 234 is highly purified (reduction of impurities such as water and hydrogen) and the resistance of the region 234 is further increased.

Alternatively, heat treatment may be performed in a nitrogen or inert gas atmosphere, and then another heat treatment may be performed in an atmosphere containing an oxidizing gas at 10 ppm or more, 1% or more, or 10% or more. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. Oxygen is preferably added to the region 234 in the oxide 230 by the heat treatment.

After the deposition of the conductive film 242A or during the heat treatment following the formation of the conductor 242, the conductive film 242A or the conductor 242 sometimes absorbs oxygen in the region 253 of the oxide 230, which causes oxygen vacancies in the region 253 in some cases. Entry of hydrogen in the oxide 230 to the oxygen vacancy increases the carrier density of the region 253. Therefore, the region 253 of the oxide 230 becomes n-type and has a reduced resistance.

The oxygen concentration in the region 253 is lower than the oxygen concentration in the region 234 in some cases. The hydrogen concentration in the region 253 is higher than the hydrogen concentration in the region 234 in some cases.

Next, the insulator 273A is formed in the opening 263 and over the insulator 280 (see FIG. 10). A metal oxide containing one kind or two or more kinds selected from hafnium, aluminum, gallium, yttrium, zirconium, tungsten, titanium, tantalum, nickel, germanium, magnesium, and the like can be used as the insulator 273A. The insulator 273A can be formed by a sputtering method, a CVD method, an MBE method, a PLD method, an ALD method, or the like using a nitride of silicon or a nitride of silicon containing oxygen, i.e., silicon nitride, silicon nitride oxide, or the like.

Oxygen may be added to the oxide 230 and the insulator 280. As a method for adding oxygen, one or more methods selected from an ion injection method, an ion doping method, plasma treatment, and a plasma immersion ion implantation method can be employed. In particular, an ion implantation method by which an ionized source gas is subjected to mass separation and then added is preferably used, in which case oxygen can be supplied to the oxide 230 and the insulator 280 with high controllability. By addition of oxygen to the oxide 230, the oxygen concentration of the region 234 is increased and the oxygen vacancies are reduced; thus, the resistance of the region 234 is increased. By addition of the oxygen into the insulator 280, hydrogen contained in the insulator 280 is trapped by the added oxygen, so that water molecules are formed and are released from the insulator 280 by heat treatment performed in a later step in some cases. Thus, the hydrogen concentration of the insulator 280 is lowered, and the favorable insulator 280 with fewer impurities can be obtained.

The crystallinity of the oxide 230 might be disordered by collision of oxygen (an oxygen atom, an oxygen molecule, a molecule containing oxygen, an ion or a radical thereof) in the addition of oxygen. Therefore, oxygen is preferably added to the oxide 230 after the insulator 273A is formed. In this case, oxygen is added to the oxide 230 and the insulator 280 by passing through the insulator 273A. In the case where the crystallinity of the oxide 230 or the characteristics of the transistor are not affected, oxygen may be added before the insulator 273A is formed.

Then, the insulator 273A is subjected to anisotropic etching, so that the insulator 273A on the bottom portion of the opening 263, the insulator 273A over the insulator 280, and the like are removed, and the insulator 273 is formed (see FIG. 11). The insulator 273 is provided to be in contact with the top surface of the oxide 230b and cover the side surface of the insulator 280, the side surface of the insulator 256, and the side surface of the conductor 242. As illustrated in FIG. 11(A), the insulator 273 is formed along a side surface of the opening 263 and thus is provided in contact with part of the side surfaces of the oxide 230a and the oxide 230b on the A3 side and the A4 side.

After the insulator 273 is formed, oxygen addition to the oxide 230 and the insulator 280 described above may be performed.

Furthermore, heat treatment may be performed after the formation of the insulator 273. For the heat treatment, the conditions for the above heat treatment can be used. The heat treatment can reduce the moisture concentration and hydrogen concentration in the insulator 280.

Next, an oxide film 230C, an insulator 250A, a conductive film 260A, and a conductive film 260B are formed in the opening 263 and over the insulator 280 with the insulator 273 provided therebetween (FIG. 12).

The oxide film 230C can be deposited by a sputtering method, a CVD method, an MBE method, a PLD method, an ALD method, or the like. The oxide film 230C is deposited by a sputtering method using a target with In:Ga:Zn=1:3:4 [atomic ratio] or In:Ga:Zn=4:2:4.1 [atomic ratio]. The oxide film 230C may have a stacked-layer structure; an oxide film may be formed using the target with In:Ga:Zn=1:3:4 [atomic ratio] over the oxide film formed using the target with In:Ga:Zn=4:2:4.1 [atomic ratio].

The insulator 250A can be deposited by a sputtering method, a CVD method, an MBE method, a PLD method, an ALD method, or the like. Silicon oxynitride is preferably deposited by a CVD method as the insulator 250A. Note that the deposition temperature at the time of the deposition of the insulator 250A is preferably higher than or equal to 350° C. and lower than 450° C., particularly preferably approximately 400° C. When the insulator 250A is deposited at 400° C., an insulator having few impurities can be deposited.

The conductive film 260A and the conductive film 260B can be formed by a sputtering method, a CVD method, an MBE method, a PLD method, an ALD method, or the like. Titanium nitride may be deposited for the conductive film 260A, and tungsten may be deposited for the conductive film 260B, for example.

For the conductive film 260A, a metal nitride is preferably formed by a CVD method or a sputtering method. With the use of a metal nitride for the conductive film 260A, the conductivity of the conductive film 260B can be prevented from being lowered because of oxidation due to oxygen contained in the insulator 250A.

Furthermore, when a low-resistance metal film is stacked as the conductive film 260B, a transistor with a low driving voltage can be provided.

Subsequently, heat treatment can be performed. For the heat treatment, the conditions for the above heat treatment can be used. Heat treatment may be performed after the formation of one or both of the oxide film 230C and the insulator 250A. Note that the heat treatment is not necessarily performed in some cases. Through this heat treatment, a low-resistance region (the region 253) is sometimes formed in the oxide 230b.

Next, the conductive film 260B, the conductive film 260A, the insulator 250A, and the oxide film 230C are processed to form the conductor 260b, the conductor 260a, the insulator 250, and the oxide 230c (see FIG. 13). For the processing, a CMP method or an etch-back method can be used.

At this time, the conductor 260 (the conductor 260a and the conductor 260b) is formed so that at least part of the conductor 260 overlaps with the conductor 205, the oxide 230a, and the oxide 230b. The width of the conductor 260 in the channel length direction depends on the width of the opening 263 provided in the insulator 280, the thickness of the insulator 273, the thickness of the oxide 230c, and the thickness of the insulator 250. The conductor 260 with a desired width can be formed by adjusting the above widths and thicknesses in accordance with the performance required for the transistor 200 or the semiconductor device.

Through the above steps, the conductor 260 is formed to be embedded in the opening of the insulator 280 and the region interposed between the conductor 242a and the conductor 242b. The conductor 260 is formed in a self-aligned manner without employing a lithography method; thus, an alignment margin for the conductor 260 is unnecessary. Therefore, the area occupied by the transistor 200 can be reduced and the miniaturization and high integration of the semiconductor device can be achieved. Furthermore, since the lithography process is not necessary, an improvement in productivity due to simplification of the process is expected.

The gate length needs to be short for miniaturization of the semiconductor device, but it is necessary to prevent reduction in the conductivity of the conductor 260. When the conductor 260 is made thick to achieve this, the conductor 260 might have a shape with a high aspect ratio. In this embodiment, the conductor 260 is provided to be embedded in the opening of the insulator 280; hence, even when the conductor 260 has a shape with a high aspect ratio, the conductor 260 can be formed without collapsing during the process.

Here, heat treatment may be performed. For the heat treatment, the conditions for the above heat treatment can be used. By the heat treatment, damage to the oxide 230b due to the formation of the insulator 273, the oxide 230c, the insulator 250, or the conductor 260 can be recovered. Through this heat treatment, a low-resistance region (the region 253) is sometimes formed in the oxide 230.

Next, the insulator 274 is formed to cover the insulator 280, the insulator 273, the oxide 230c, the insulator 250, the conductor 260a, and the conductor 260b (see FIG. 14). By the formation of the insulator 274, oxygen is preferably supplied to the insulator 280, and in this embodiment, aluminum oxide is formed as the insulator 274 by a sputtering method. When the insulator 274 is formed using a gas containing oxygen or by using a target containing oxygen, oxygen can be supplied to the insulator 280. After the formation of the insulator 274, heat treatment may be performed to supply oxygen contained in the insulator 274 to the insulator 280. The heat treatment is performed after the formation of the insulator 274 and may be performed after the formation of the insulator 281.

Then, the insulator 281 is formed over the insulator 274 (see FIG. 14). The insulator 281 can be formed using an apparatus and a material that are similar to those used for the insulator 280. For example, the insulator 281 containing silicon oxynitride is formed by a CVD method.

Then, openings that reach the conductor 242a and the conductor 242b are formed in the insulator 256, the insulator 280, the insulator 274, and the insulator 281. The openings may be formed by a lithography method.

Next, an insulating film to be the insulator 241 illustrated in FIG. 1 is deposited and the insulating film is subjected to anisotropic etching, so that the insulator 241 is formed. The conductive film can be deposited by a sputtering method, a CVD method, an MBE method, a PLD method, an ALD method, or the like. An insulating film having a function of inhibiting the passage of oxygen is preferably used as the insulating film to be the insulator 241. For example, an aluminum oxide film is preferably deposited by an ALD method. Alternatively, a silicon nitride film may be deposited by an ALD method or a CVD method. In the case where a silicon nitride film is deposited by an ALD method, a precursor containing silicon and halogen or a precursor of aminosilanes can be used. As the precursor containing silicon and a halogen, $SiCl_4$, $SiH_2Cl_2$, $Si_2Cl_6$, $Si_3Cl_8$, or the like can be used. As the precursor of aminosilanes, monovalent, divalent, or trivalent aminosilanes can be used. As the nitriding gas, ammonia or hydrazine can be used. In addition, for the anisotropic etching, a dry etching method or the like may be employed, for example. When sidewall portions of the openings have such structures, the passage of oxygen from the outside can be inhibited and oxidation of the conductor 240a and the conductor 240b to be formed next can be prevented. Furthermore, impurities such as water and hydrogen can be prevented from being diffused from the conductor 240a and the conductor 240b to the outside.

Next, a conductive film to be the conductor 240a and the conductor 240b illustrated in FIG. 1 is deposited. The conductive film desirably has a stacked-layer structure that includes a conductor having a function of inhibiting diffusion of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Next, part of the conductive film is removed by CMP treatment, so that the insulator 281 is exposed. As a result, the conductive film remains only in the openings, so that the conductor 240a and the conductor 240b having flat top surfaces can be formed (see FIG. 1). Note that the insulator 281 is partly removed by the CMP treatment in some cases.

Through the above process, the semiconductor device including the transistor 200 illustrated in FIG. 1 can be manufactured. As illustrated in FIG. 5 to FIG. 14, with the use of the method of manufacturing the semiconductor device described in this embodiment, the transistor 200 can be manufactured.

According to one embodiment of the present invention, it is possible to provide a semiconductor device with a high on-state current. Alternatively, according to one embodiment of the present invention, it is possible to provide a semiconductor device with high frequency characteristics. Alternatively, according to one embodiment of the present invention, it is possible to provide a highly reliable semiconductor device. Alternatively, according to one embodiment of the present invention, it is possible to provide a semiconductor device that can be miniaturized or highly integrated. Alternatively, according to one embodiment of the present invention, it is possible to provide a semiconductor device with favorable electrical characteristics. Alternatively, according to one embodiment of the present invention, it is possible to provide a semiconductor device with a low off-state current. Alternatively, according to one embodiment of the present invention, it is possible to provide a semiconductor device with reduced power consumption. Alternatively, according to one embodiment of the present invention, it is possible to provide a semiconductor device with high productivity.

<Modification Example 1 of Semiconductor Device>

An example of a semiconductor device including the transistor 200 of one embodiment of the present invention that is different from the semiconductor device described in the above <Structure example of semiconductor device> is described below with reference to FIG. 2.

Figure 2A:
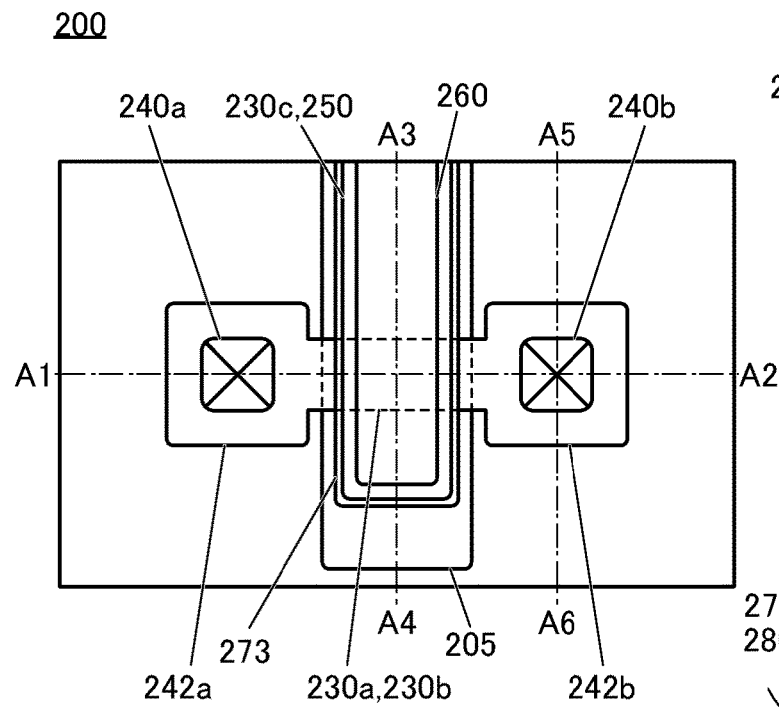
FIGS. 2A to 2D A top view and cross-sectional views of a semiconductor device of one embodiment of the present invention.
Figure 2C:
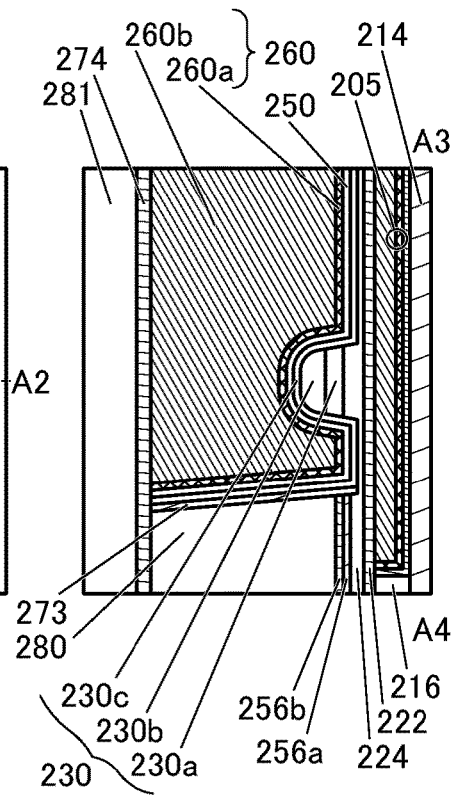
Figure 2B:
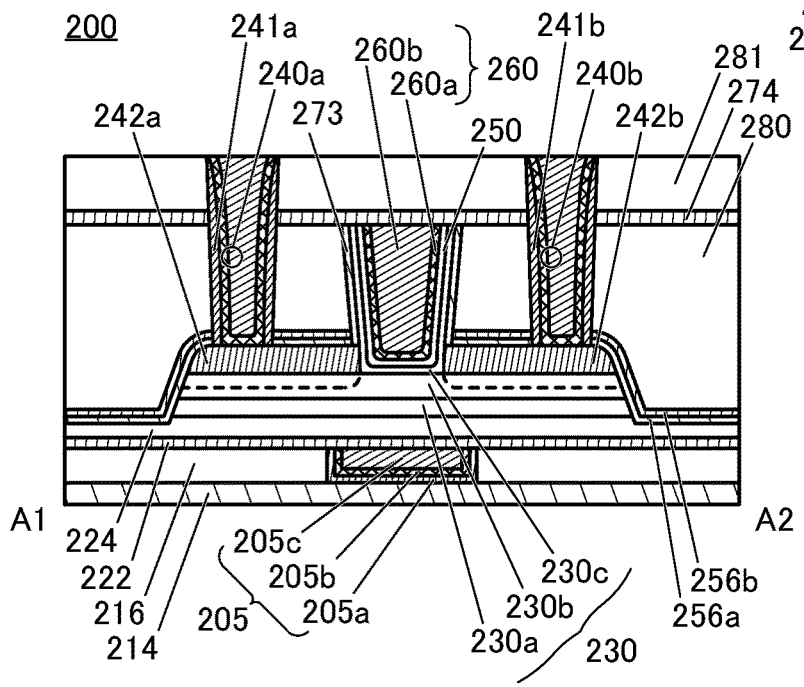
Figure 2D:
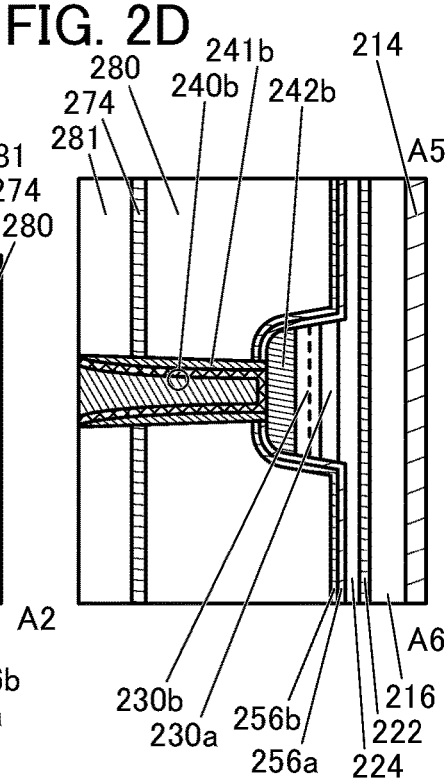

FIG. 2(A) is the top view of the semiconductor device including the transistor 200. FIG. 2(B), FIG. 2(C), and FIG. 2(D) are cross-sectional views of the semiconductor device. Here, FIG. 2(B) is a cross-sectional view of a portion indicated by a dashed-dotted line A1-A2 in FIG. 2(A), and is a cross-sectional view in the channel length direction of the transistor 200. FIG. 2(C) is a cross-sectional view of a portion indicated by a dashed-dotted line A3-A4 in FIG. 2(A), and is a cross-sectional view of the transistor 200 in the channel width direction. FIG. 2(D) is a cross-sectional view of a portion indicated by a dashed-dotted line A5-A6 in FIG. 2(A), and is also a cross-sectional view of a portion where the transistor 200 is connected to the conductor 240b. Note that for simplification of the drawing, some components are not illustrated in the top view in FIG. 2(A).

Note that in the semiconductor device shown in FIG. 2, structures having the same functions as the structures in the semiconductor device described in <Structure example of semiconductor device> (see FIG. 1) are denoted by the same reference numerals.

A structure of the transistor 200 is described with reference to FIG. 2 below. Note that also in this section, the materials described in detail in <Structure example of semiconductor device> can be used as the materials for the transistor 200.

The semiconductor device illustrated in FIG. 2 is different from the semiconductor device described in <Structure example of semiconductor device> (see FIG. 1) in that the insulator 273 in contact with the side surfaces of the insulator 256 and the insulator 280 is in contact with the top surfaces of the conductor 242a and the conductor 242b.

Note that as illustrated in FIG. 2(A), FIG. 2(B), and FIG. 2(C), the insulator 273 is formed along the side surface of the opening formed in the insulator 280; therefore, the insulator 273 is provided in contact with part of the side surfaces of the oxide 230a, the oxide 230b, and the conductor 242 on the A3 side and the A4 side.

The insulator 273 is provided in contact with at least the insulator 256 and the insulator 274. Thus, the insulator 280 can be surrounded by the insulator 256, the insulator 273, and the insulator 274, and diffusion of impurities such as hydrogen and water contained in the insulator 280 to the oxide 230 and the insulator 224 and the insulator 250 that each function as a gate insulating film can be inhibited.

Next, a method for manufacturing the transistor 200 illustrated in FIG. 2 is described. Note that the description that is the same as that in the above <Method for manufacturing semiconductor device> is omitted.

As illustrated in FIG. 8, the above <Method for manufacturing semiconductor device> can be referred to for the steps up to the step of performing processing treatment on the insulator 280, the insulator 256A, and the insulator 256B to form the opening 263, and the description thereof is omitted.

Next, the insulator 273A is formed in the opening 263 and over the insulator 280 (see FIG. 15). Note that the material that can be used for the insulator 273A and the forming method can be referred to the above <Method for manufacturing semiconductor device>.

Then, the insulator 273A is subjected to anisotropic etching to remove the insulator 273A on the bottom portion of the opening 263, the insulator 273A over the insulator 280, and the like, so that the insulator 273 is formed (see FIG. 16). The insulator 273 is in contact with a top surface of the conductor 242B and covers the side surface of the insulator 280 and the side surface of the insulator 256. As illustrated in FIG. 16(A), the insulator 273 is formed along the side surface of the opening 263, and thus is provided in contact with part of the side surfaces of the conductor 242B, the oxide 230a, and the oxide 230b on the A3 side and the A4 side.

Then, the conductor 242B exposed from the insulator 273 in the opening 263 is processed, so that the conductor 242a and the conductor 242b are formed (see FIG. 17). The above <Method for manufacturing semiconductor device> can be referred to for the method for processing the conductor 242B. After the formation of the conductor 242a and the conductor 242b, the region 253 (the region 253a and the region 253b) is formed in some cases.

Next, the oxide film 230C, the insulator 250A, the conductive film 260A, and the conductive film 260B are formed in the opening 263 with the insulator 273 provided therebetween and over the insulator 280. FIG. 12 to FIG. 14, and the above <Method for manufacturing semiconductor device> can be referred to for the following steps. Addition of oxygen to the oxide 230 and the insulator 280 may be performed as appropriate.

<Modification Example 2 of Semiconductor Device>

An example of a semiconductor device including the transistor 200 of one embodiment of the present invention that is different from the semiconductor device described in the above <Structure example of semiconductor device> is described below with reference to FIG. 3.

Figure 3A:
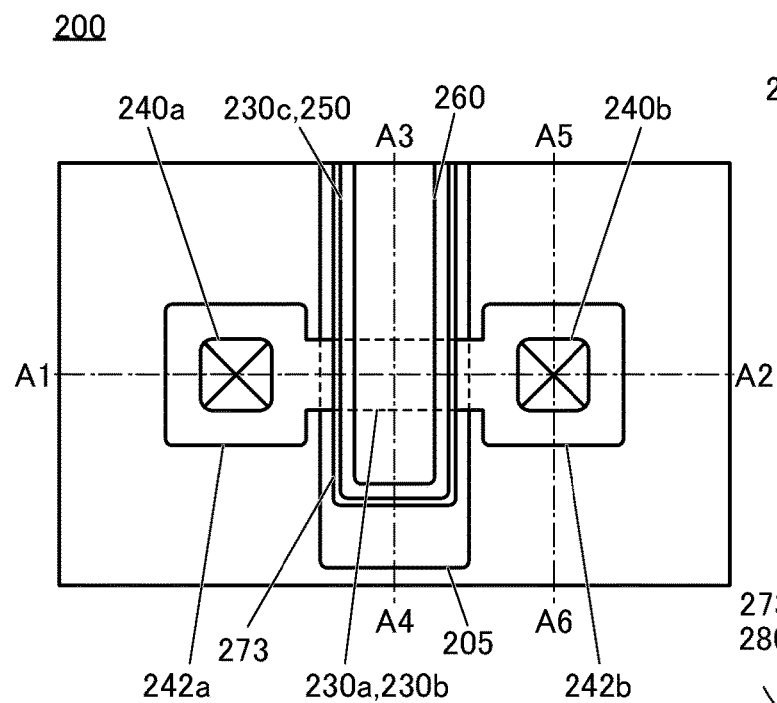
FIGS. 3A to 3D A top view and cross-sectional views of a semiconductor device of one embodiment of the present invention.
Figure 3C:
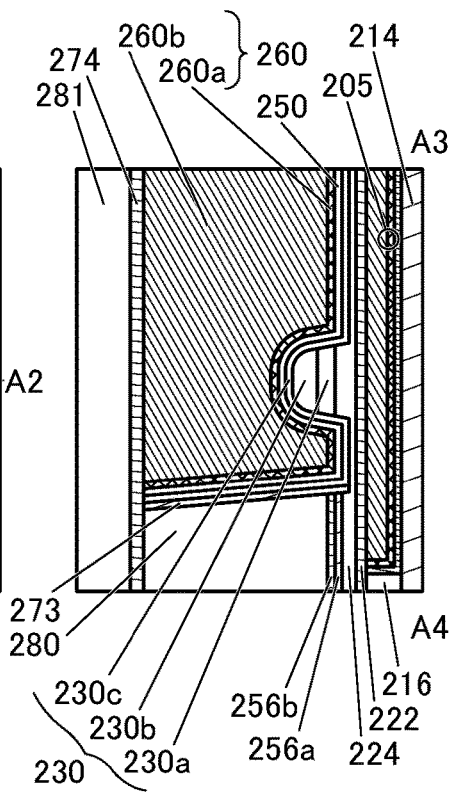
Figure 3B:
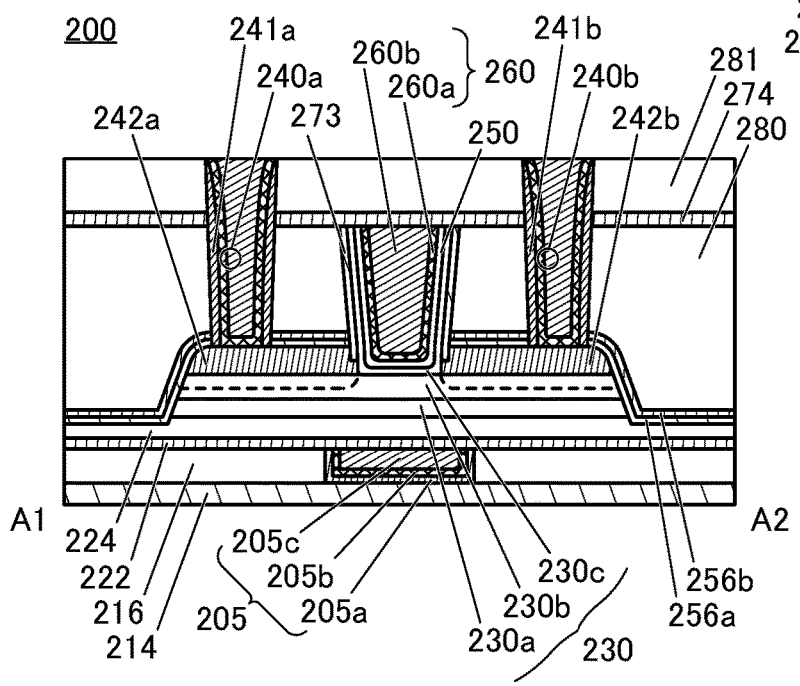
Figure 3D:
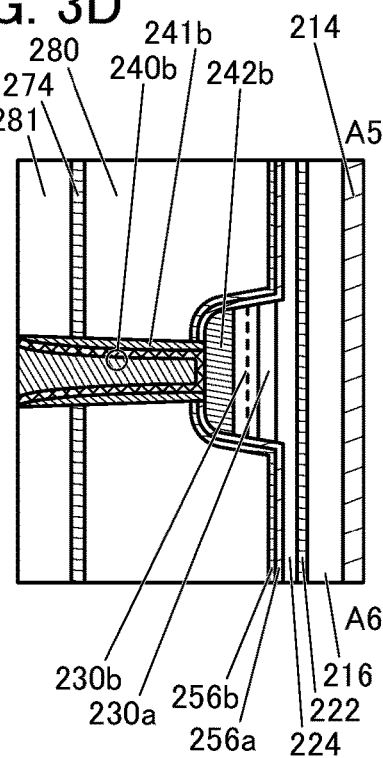

FIG. 3(A) is a top view of a semiconductor device including the transistor 200. FIG. 3(B), FIG. 3(C), and FIG. 3(D) are cross-sectional views of the semiconductor device. Here, FIG. 3(B) is a cross-sectional view of a portion indicated by a dashed-dotted line A1-A2 in FIG. 3(A), and is a cross-sectional view in the channel length direction of the transistor 200. FIG. 3(C) is a cross-sectional view of a portion indicated by a dashed-dotted line A3-A4 in FIG. 3(A), and is a cross-sectional view in the channel width direction of the transistor 200. FIG. 3(D) is a cross-sectional view of a portion indicated by a dashed-dotted line A5-A6 in FIG. 3(A), and is also a cross-sectional view of a portion where the transistor 200 is connected to the conductor 240b. For clarity of the drawing, some components are not illustrated in the top view of FIG. 3(A).

Note that in the semiconductor device shown in FIG. 3, structures having the same functions as the structures in the semiconductor device described in <Structure example of semiconductor device> (see FIG. 1) are denoted by the same reference numerals.

A structure of the transistor 200 is described with reference to FIG. 3 below. Note that also in this section, the materials described in detail in <Structure example of semiconductor device> can be used as the materials for the transistor 200.

The semiconductor device illustrated in FIG. 3 is different from the semiconductor device described in <Structure example of semiconductor device> (see FIG. 1) in that the insulator 273 provided in contact with the side surfaces of the insulator 256 and the insulator 280 is in contact with part of the top surfaces and part of the side surfaces of the conductor 242a and the conductor 242b. At this time, the conductor 242a has a step portion at the side surface facing the conductor 242b. The conductor 242a has a first thickness in the first region overlapping with the insulator 256 and has a second thickness in the second region that does not overlap with the insulator 256. Here, the second thickness is smaller than the first thickness. The insulator 273 is in contact with a top surface of the second region and a side surface of the first region on the conductor 242b side. Moreover, the conductor 242b has a step portion at the side surface facing the conductor 242a. The conductor 242b has a first thickness in the third region overlapping with the insulator 256 and has a second thickness in the fourth region that does not overlap with the insulator 256. The insulator 273 is in contact with a top surface of the fourth region and a side surface of the third region on the conductor 242a side.

Note that as illustrated in FIG. 3(A), FIG. 3(B), and FIG. 3(C), the insulator 273 is formed along the side surface of the opening formed in the insulator 280; thus, the insulator 273 is provided in contact with part of the side surfaces of the oxide 230a, the oxide 230b, and the conductor 242 on the A3 side and the A4 side.

The insulator 273 is provided in contact with at least the insulator 256 and the insulator 274. Thus, the insulator 280 can be surrounded by the insulator 256, the insulator 273, and the insulator 274, and diffusion of impurities such as hydrogen and water contained in the insulator 280 to the oxide 230 and the insulator 224 and the insulator 250 that each function as a gate insulating film can be inhibited.

Next, a method for manufacturing the transistor 200 illustrated in FIG. 3 is described. Note that description that is same as that in the above <Method for manufacturing semiconductor device> is omitted.

As illustrated in FIG. 7, the above <Method for manufacturing semiconductor device> can be referred to for the steps up to the steps of forming the insulator 256A, the insulator 256B, and the insulator 280 over the insulator 224, the oxide 230a, the oxide 230b, and the conductor 242B, and the description thereof is omitted.

Next, processing is performed on the insulator 280, the insulator 256A, and the insulator 256B by a lithography method, so that the opening 263 that has a region at least overlapping with the conductor 205 is formed. In that case, the conductor 242B is partly etched in the opening in some cases (see FIG. 18). The conductor 242B is probably etched by overetching during the processing of the insulator 256A or after the processing of the insulator 256A.

Next, the insulator 273A is formed in the opening 263 and over the insulator 280 (see FIG. 19). Note that the above <Method for manufacturing semiconductor device> can be referred to for the material and the forming method that can be used for the insulator 273A.

Then, the insulator 273A is subjected to anisotropic etching to remove the insulator 273A on the bottom portion of the opening 263, the insulator 273A over the insulator 280, and the like, so that the insulator 273 is formed (see FIG. 20). The insulator 273 is in contact with a top surface of the conductor 242B and covers the side surface of the insulator 280 and the side surface of the insulator 256. As illustrated in FIG. 20(A), the insulator 273 is formed along the side surface of the opening 263, and thus is provided in contact with part of the side surfaces of the conductor 242B, the oxide 230a, and the oxide 230b on the A3 side and the A4 side.

Then, the conductor 242B exposed from the insulator 273 in the opening 263 is processed, so that the conductor 242a and the conductor 242b are formed (see FIG. 21). The above <Method for manufacturing semiconductor device> can be referred to for the method for processing the conductor 242B. After the formation of the conductor 242a and the conductor 242b, the region 253 (the region 253a and the region 253b) is formed in some cases.

Next, the oxide film 230C, the insulator 250A, the conductive film 260A, and the conductive film 260B are formed in the opening 263 with the insulator 273 provided therebetween and over the insulator 280. FIG. 12 to FIG. 14, and the above <Method for manufacturing semiconductor device> can be referred to for the following steps. Addition of oxygen to the oxide 230 and the insulator 280 may be performed as appropriate.

The structure, composition, method, and the like described above in this embodiment can be used in appropriate combination with the structures, compositions, methods, and the like described in the other embodiments and examples.

Embodiment 2

In this embodiment, one embodiment of a semiconductor device is described with reference to FIG. 22 and FIG. 23.
[Memory Device 1]

Figure 22:
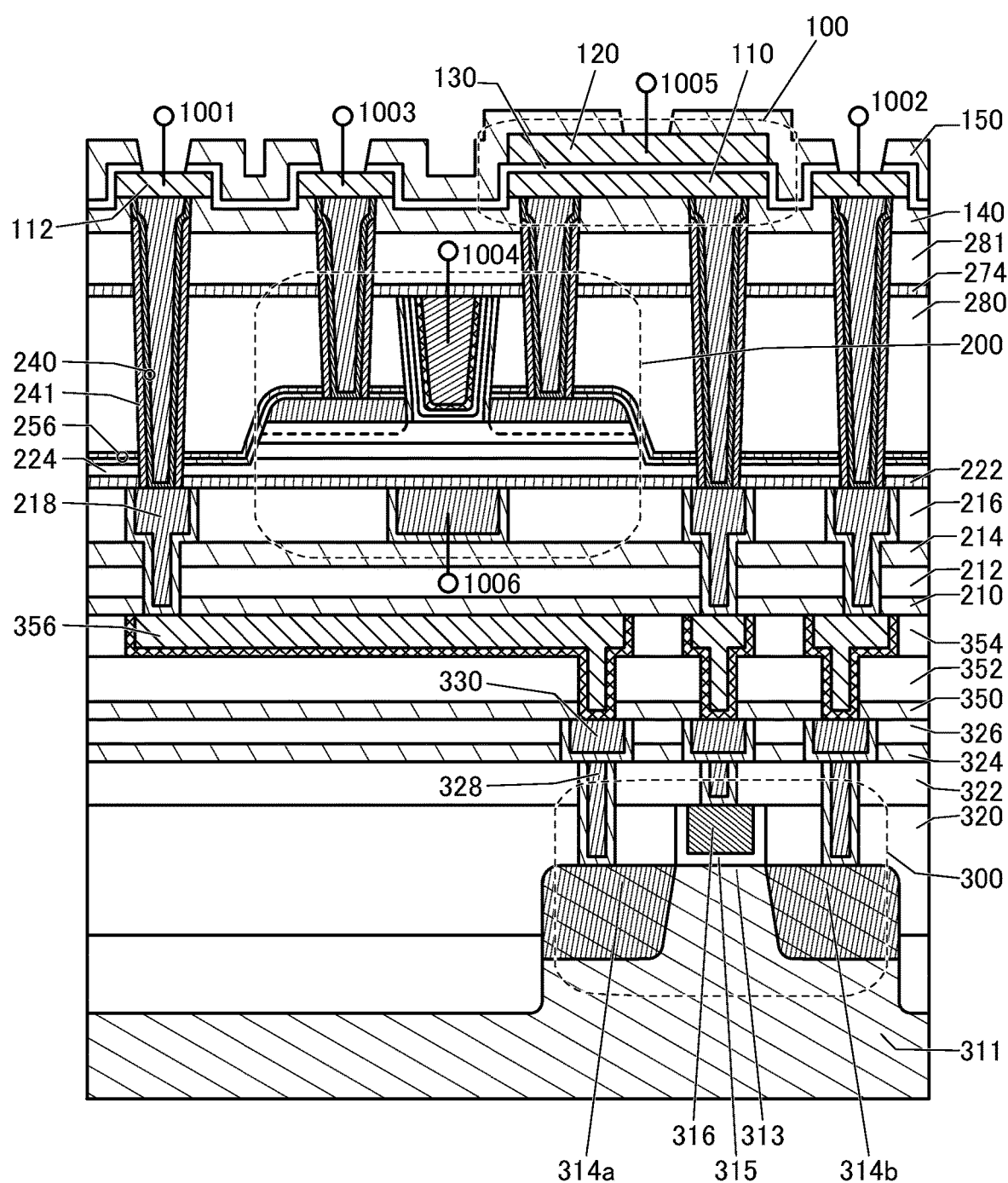
FIG. 22 A cross-sectional view illustrating a structure of a memory device of one embodiment of the present invention.

FIG. 22 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200, for example.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 22, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 22 in a matrix, a memory cell array can be formed.
<Transistor 300>

The transistor 300 is provided over a substrate 311 and includes a conductor 316 functioning as a gate electrode, an insulator 315 functioning as a gate insulator, a semiconductor region 313 that is part of the substrate 311, a low-resistance region 314a functioning as the source region, and a low-resistance region 314b functioning as the drain region. The transistor 300 is of either a p-channel type or an n-channel type.

In the transistor 300 illustrated in FIG. 22, the semiconductor region 313 (part of the substrate 311) in which a channel is formed has a convex shape. Furthermore, the conductor 316 is provided so as to cover a side surface and a top surface of the semiconductor region 313 with the insulator 315 positioned therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 22 is an example and the structure is not limited thereto; an appropriate transistor is used in accordance with a circuit configuration or a driving method.
<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 22, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength such as silicon oxynitride and a high permittivity (high-k) material. In the capacitor 100 having such a structure, a sufficient capacitance can be provided owing to the high permittivity (high-k) insulator, and the dielectric strength can be increased owing to the insulator with high dielectric strength, so that the electrostatic breakdown of the capacitor 100 can be prevented.

Examples of the insulator with a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are sequentially stacked over the substrate 311 as interlayer films. The insulator 315 and the conductor 316 are embedded in an insulator 320. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 22, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, the parasitic capacitance generated between wirings can be reduced. Thus, a material is preferably selected depending on the function of an insulator.

For example, as the insulator 212, the insulator 352, the insulator 354, and the like, an insulator having a low relative permittivity is preferably used. For example, the insulators each preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic It is preferable that one or both of the insulator 130 over the conductor 112 and the insulator 150 over the conductor 120 have a resistivity higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. It is preferable to use an insulator having resistivity described above for one or both of the insulator 130 and the insulator 150 because while maintaining insulating properties, the insulator can disperse electric charges accumulated in the transistor 200, the transistor 300, and the capacitor 100 and between wirings such as the conductor 112 and the conductor 120; accordingly a transistor or a memory device including the transistor does not suffer from poor characteristics and electrostatic breakdown due to the electric charge. As such an insulator, silicon nitride or silicon nitride oxide can be used.

As the insulator having resistivity described above, an insulator 140 may be provided under the conductor 112. In this case, the insulator 140 may be formed over the insulator 281, and openings may be formed in the insulator 140, the insulator 281, the insulator 274, the insulator 280, the insulator 256, and the like. Then, the insulator 241 and the conductor 240 that is electrically connected to the transistor 200, the conductor 218, and the like may be formed in the openings. The insulator 140 can be formed using a material similar to that used for forming the insulator 130 or the insulator 150.

When the transistor using an oxide semiconductor is surrounded by an insulator that has a function of inhibiting the passage of oxygen and impurities such as hydrogen, the electrical characteristics of the transistor can be stable. Thus, an insulator having a function of inhibiting the passage of oxygen and impurities such as hydrogen is preferably used for the insulator 210, the insulator 350, and the like.

As an insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 110, the conductor 120, and the like, a single layer or a stacked layer of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 241 is preferably provided between the insulator 224 and the conductor 240 in FIG. 22. In particular, the insulator 241 is preferably provided in contact with the insulator 222 and the insulator 256 between which the insulator 224 containing an excess oxygen region is provided. Since the insulator 241 is provided in contact with the insulator 222 and the insulator 256, the insulator 224 can be sealed by the insulators having a barrier property. It is also preferable that the insulator 241 be in contact with part of the insulator 280 and part of the insulator 281. When the insulator 241 extends to the insulator 280 and the insulator 281, diffusion of oxygen and impurities can be further inhibited.

That is, when the insulator 241 is provided, absorption of excess oxygen contained in the insulator 224 by the conductor 240 can be inhibited. In addition, when the insulator 241 is included, diffusion of hydrogen, which is an impurity, into the transistor 200 through the conductor 240 can be inhibited.

For the insulator 241, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

[Memory Device 2]

Figure 23:
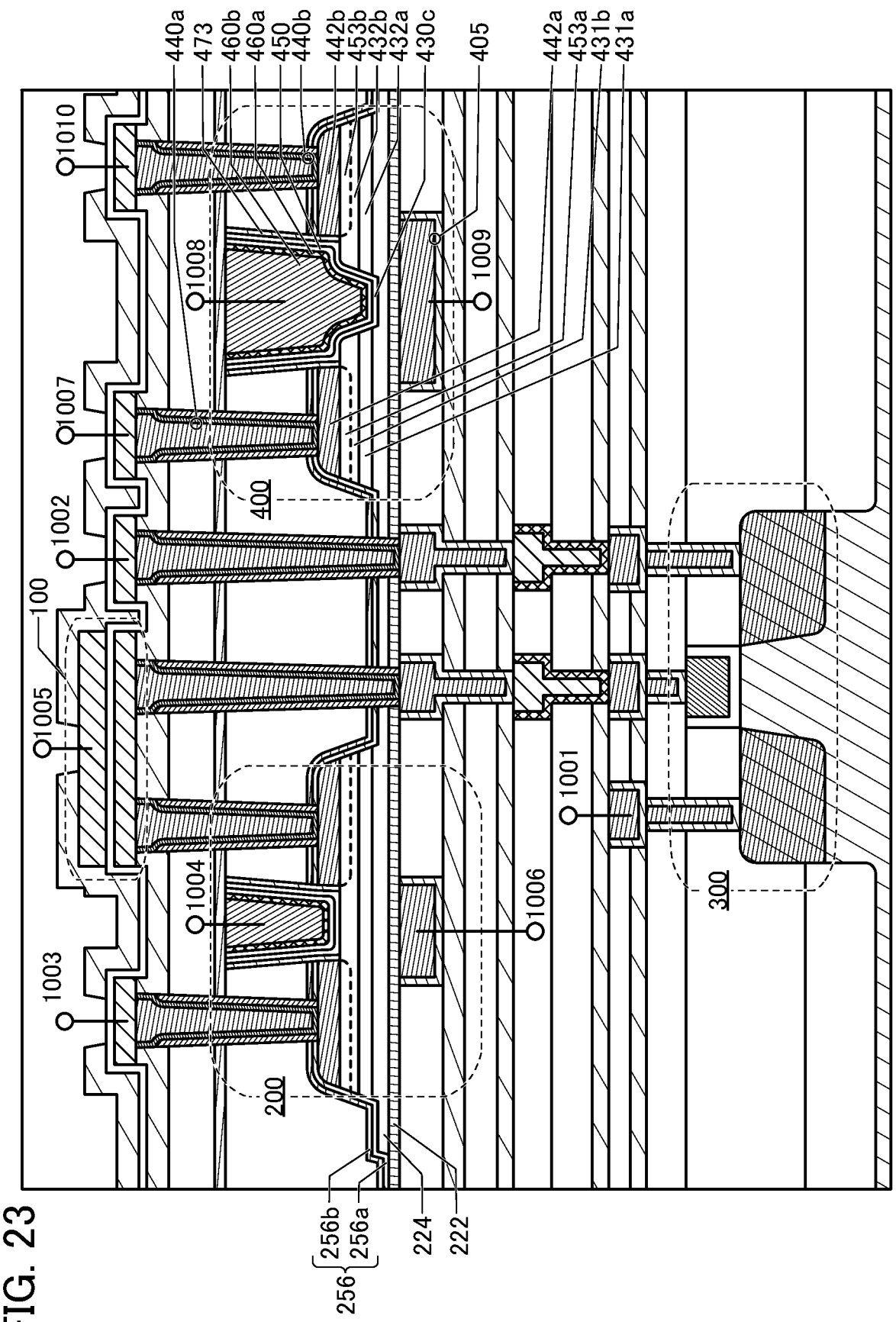
FIG. 23 A cross-sectional view illustrating a structure of a memory device of one embodiment of the present invention.

FIG. 23 illustrates an example of a memory device using the semiconductor device of one embodiment of the present invention. The memory device illustrated in FIG. 23 includes a transistor 400 in addition to the semiconductor device including the transistor 200, the transistor 300, and the capacitor 100 illustrated in FIG. 22.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 23, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400.

The wiring 1006, the wiring 1007, the wiring 1008, and the wiring 1009 are electrically connected to each other.

When the memory devices illustrated in FIG. 23 are arranged in a matrix like the memory devices illustrated in FIG. 22, a memory cell array can be formed. Note that one transistor 400 can control second gate voltages of the transistors 200. For this reason, the number of provided transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode; a conductor 405 functioning as a second gate electrode; the insulator 222, the insulator 224, and an insulator 450 each functioning as a gate insulating layer; an oxide 430c including a region where a channel is formed; an insulator 473; a conductor 442a functioning as one of a source and a drain; a region 453a; an oxide 431a and an oxide 431b; a conductor 442b functioning as the other of the source and the drain; a region 453b; an oxide 432a and an oxide 432b; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442a and the conductor 442b are in the same layer as the conductor 242a and the conductor 242b. The region 453a and the region 453b are layers formed in the same steps as the region 253a and the region 253b. The oxide 430c is in the same layer as the oxide 230c. The insulator 450 is in the same layer as the insulator 250. The insulator 473 is in the same layer as the insulator 273. The conductor 460a and the conductor 460b are in the same layer as the conductor 260a and the conductor 260b, respectively.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<<Dicing Line>>

A dicing line (also referred to as a scribe line, a dividing line, or a cutting line in some cases) that is provided when a large-sized substrate is divided into semiconductor elements so that a plurality of semiconductor devices are each formed in a chip form is described below. Examples of a dividing method include the case where a groove (dicing line) for dividing the semiconductor elements is formed on the substrate, and then the substrate is cut along the dicing line to divide (split) it into a plurality of semiconductor devices.

Here, for example, as illustrated in FIG. 23, it is preferable to perform design so that a region in which the insulator 256 (insulator 256a) and the insulator 222 are in contact with each other is the dicing line. That is, an opening is provided in the insulator 224 in the vicinity of the region to be the dicing line that is provided in an outer edge of the transistor 400 and the memory cell including a plurality of transistors 200. The insulator 256 is provided to cover the side surface of the insulator 224.

That is, in the opening provided in the insulator 224, the insulator 222 is in contact with the insulator 256. For example, the insulator 222 and the insulator 256 may be formed using the same material and the same method. When the insulator 222 and the insulator 256 are formed using the same material and the same method, the adhesion therebetween can be increased. For example, aluminum oxide or hafnium oxide is preferably used.

With such a structure, the insulator 224, the transistor 200, and the transistor 400 can be enclosed with the insulator 222, the insulator 256, the insulator 273, the insulator 473, and the insulator 274. Since the insulator 222, the insulator 256, the insulator 273, the insulator 473, and the insulator 274 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 and the transistor 400 can be inhibited.

Furthermore, in the structure, excess oxygen in the insulator 224 can be inhibited from being diffused into the outside of the insulator 256 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistor 200 or the transistor 400 can be inhibited and reliability can be improved.

This embodiment can be implemented in an appropriate combination with the structures described in the other embodiments and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 24 and FIG. 25. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 24A:
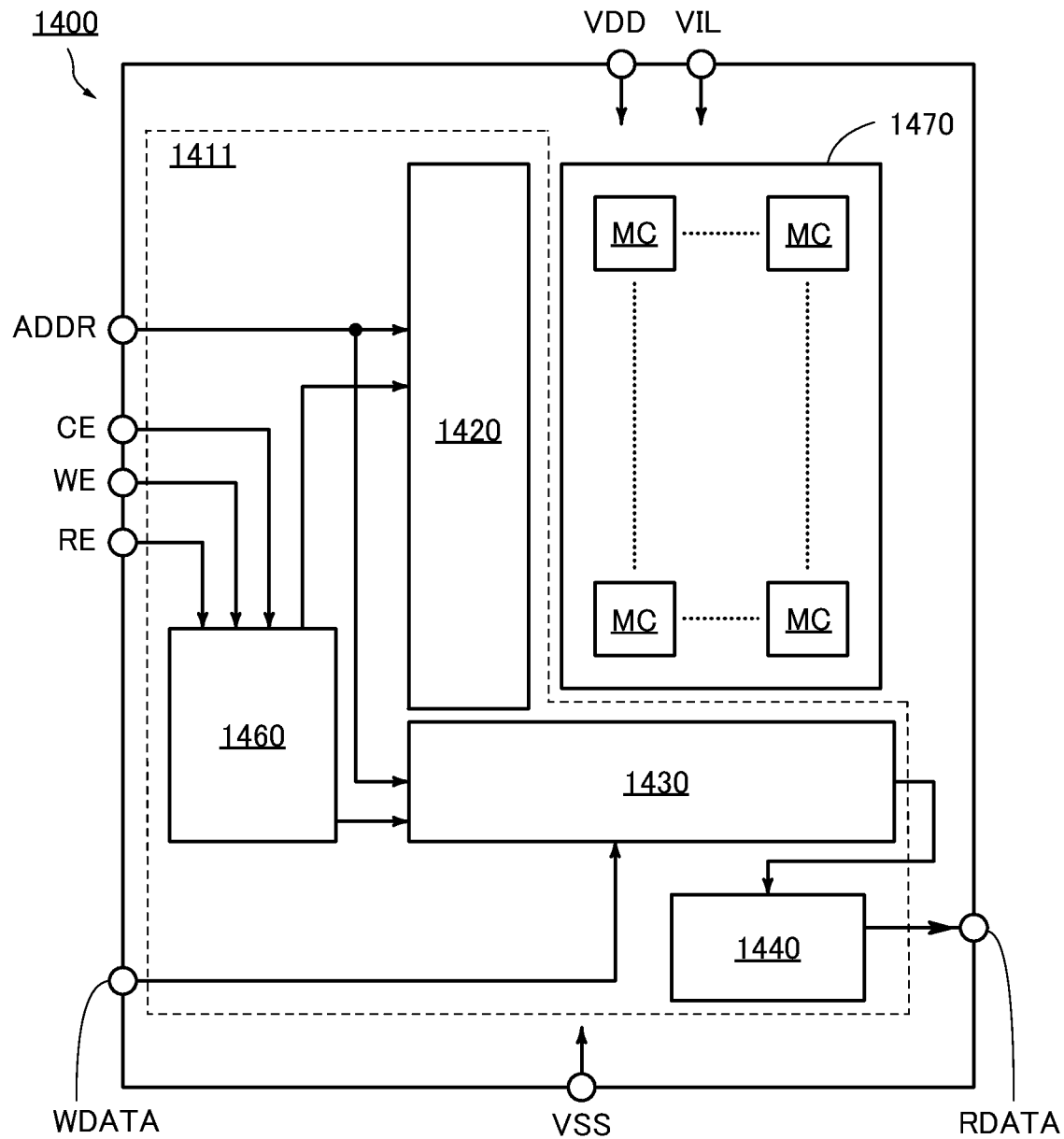
FIGS. 24A and 24B Diagrams illustrating a structure example of a memory device of one embodiment of the present invention.

FIG. 24(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the WDATA is input to the write circuit.

The control logic circuit 1460 processes the signals (CE, WE, and RE) input from the outside, and generates control signals for the row decoder and the column decoder. The CE is a chip enable signal, the WE is a write enable signal, and the RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 24B:
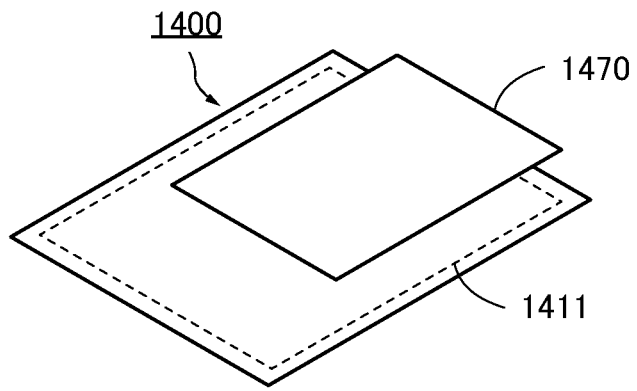

Note that FIG. 24(A) illustrates an example in which the peripheral circuit 1411 and the memory cell array 1470 are formed on the same plane; however, this embodiment is not limited thereto. For example, as illustrated in FIG. 24(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 25 illustrate structure examples of a memory cell applicable to the memory cell MC.

[DOSRAM]

Figure 25A:
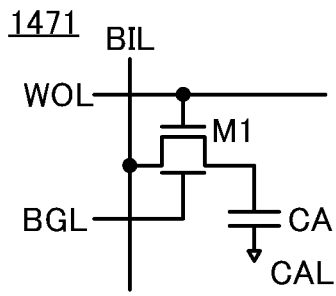
FIGS. 25A to 25H Circuit diagrams illustrating configuration examples of a memory device of one embodiment of the present invention.
Figure 25B:
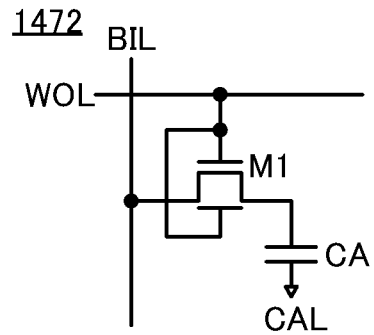
Figure 25C:
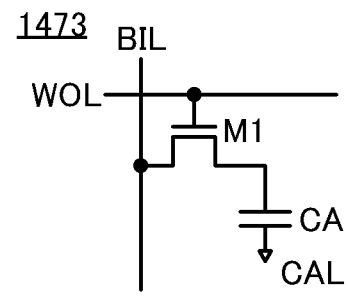
Figure 25D:
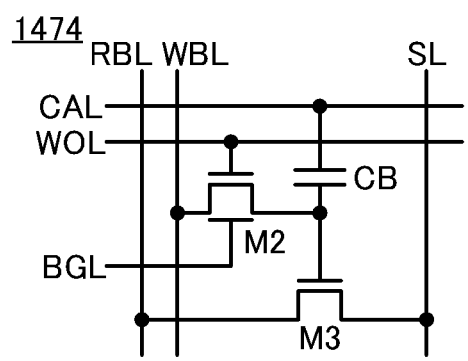
Figure 25E:
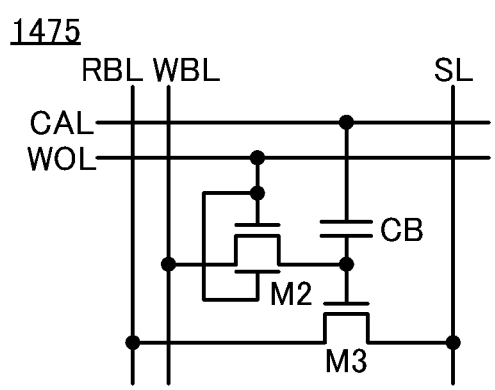
Figure 25F:
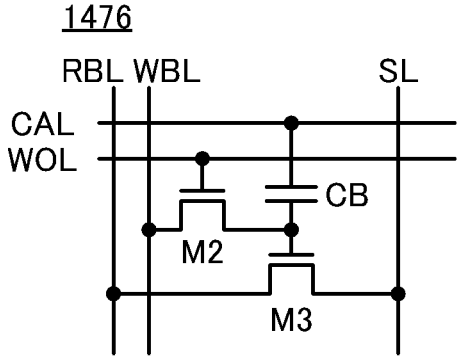
Figure 25G:
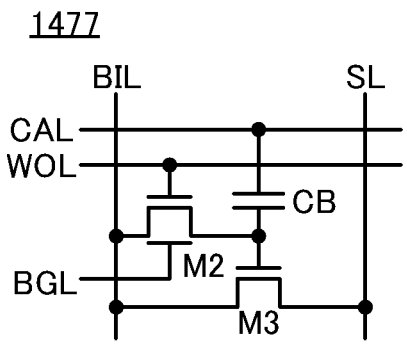

FIGS. 25(A) to 25(C) each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 25(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and the circuit structure can be changed. For example, as in a memory cell 1472 illustrated in FIG. 25(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 25(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 25(D) to 25(H) each illustrate a circuit structure example of a gain-cell memory cell including two transistors and one capacitor. A memory cell 1474 illustrated in FIG. 25(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 25(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 25(F). Alternatively, for example, in the memory cell MC, the wiring WBL and the wiring RBL may be combined into one wiring BIL, as in a memory cell 1477 illustrated in FIG. 25(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 25H:
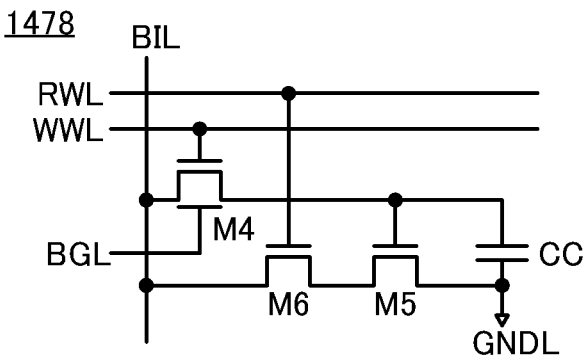

FIG. 25(H) illustrates an example of a gain-cell memory cell including three transistors and one capacitor. A memory cell 1478 illustrated in FIG. 25(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, and wirings, circuit elements, and the like connected to the circuits can be changed, deleted, or added as needed.

The structure described in this embodiment can be used in an appropriate combination with the structures described in the other embodiments and the like.

Embodiment 4

In this embodiment, examples of electronic components and electronic devices in which the memory device or the like described in the above embodiment is incorporated are described.

<Electronic Components>

First, examples of an electronic component incorporating the memory device described in the above embodiment are described with reference to FIGS. 26(A) and 26(B).

Figure 26A:
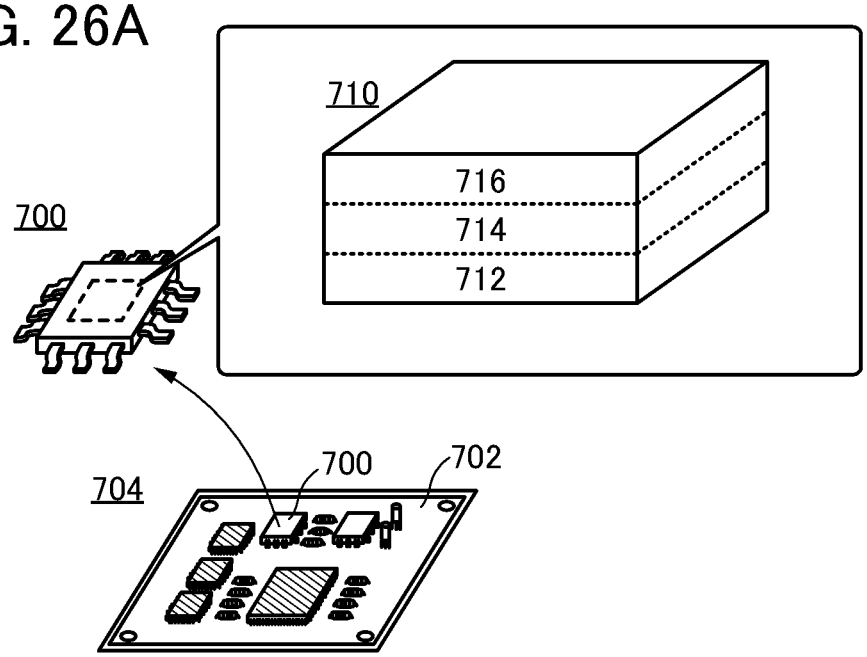
FIGS. 26A and 26B Diagrams each illustrating an example of an electronic component of one embodiment of the present invention.

FIG. 26(A) is a perspective view of an electronic component 700 and a substrate (mounting board 704) on which the electronic component 700 is mounted. The electronic component 700 illustrated in FIG. 26(A) is an IC chip including a lead and a circuit portion 710. The electronic component 700 is mounted on a printed circuit board 702, for example. A plurality of such IC chips are combined and electrically connected to each other on the printed circuit board 702, whereby the mounting board 704 is completed.

In the circuit portion 710, the various circuits described in the above embodiments are provided on one die. The circuit portion 710 has a stacked-layer structure as described in the above embodiment, and is broadly divided into a Si transistor layer 712, a wiring layer 714, and an OS transistor layer 716. Since the OS transistor layer 716 can be provided to be stacked over the Si transistor layer 712, the size of the electronic component 700 can be easily reduced.

The memory device described in the above embodiment is provided as the circuit portion 710 of the electronic component 700. Although a QFP (Quad Flat Package) is used as the package of the electronic component 700 in FIG. 26(A), the mode of the package is not limited thereto.

Figure 26B:
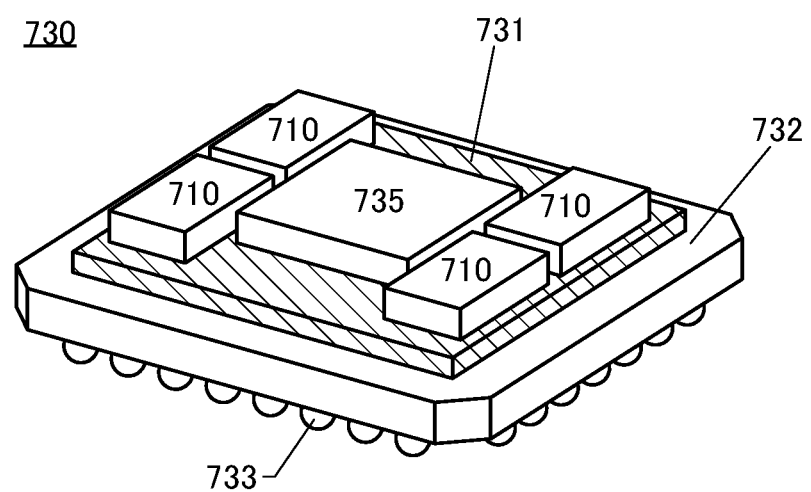

FIG. 26(B) is a perspective view of an electronic component 730. The electronic component 730 is an example of a SiP (System in package) or an MCM (Multi Chip Module). In the electronic component 730, an interposer 731 is provided on a package substrate 732 (printed circuit board), and a semiconductor device 735 and a plurality of circuit portions 710 are provided on the interposer 731.

In an example of the electronic component 730, the memory device described in the above embodiment is used in the circuit portion 710 as high bandwidth memory (HBM). An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the circuit portion 710 and the semiconductor device 735 are preferably equal to each other.

To mount the electronic component 730 on another substrate, an electrode 733 may be provided on the bottom portion of the package substrate 732. FIG. 26(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Devices>

Figure 27:
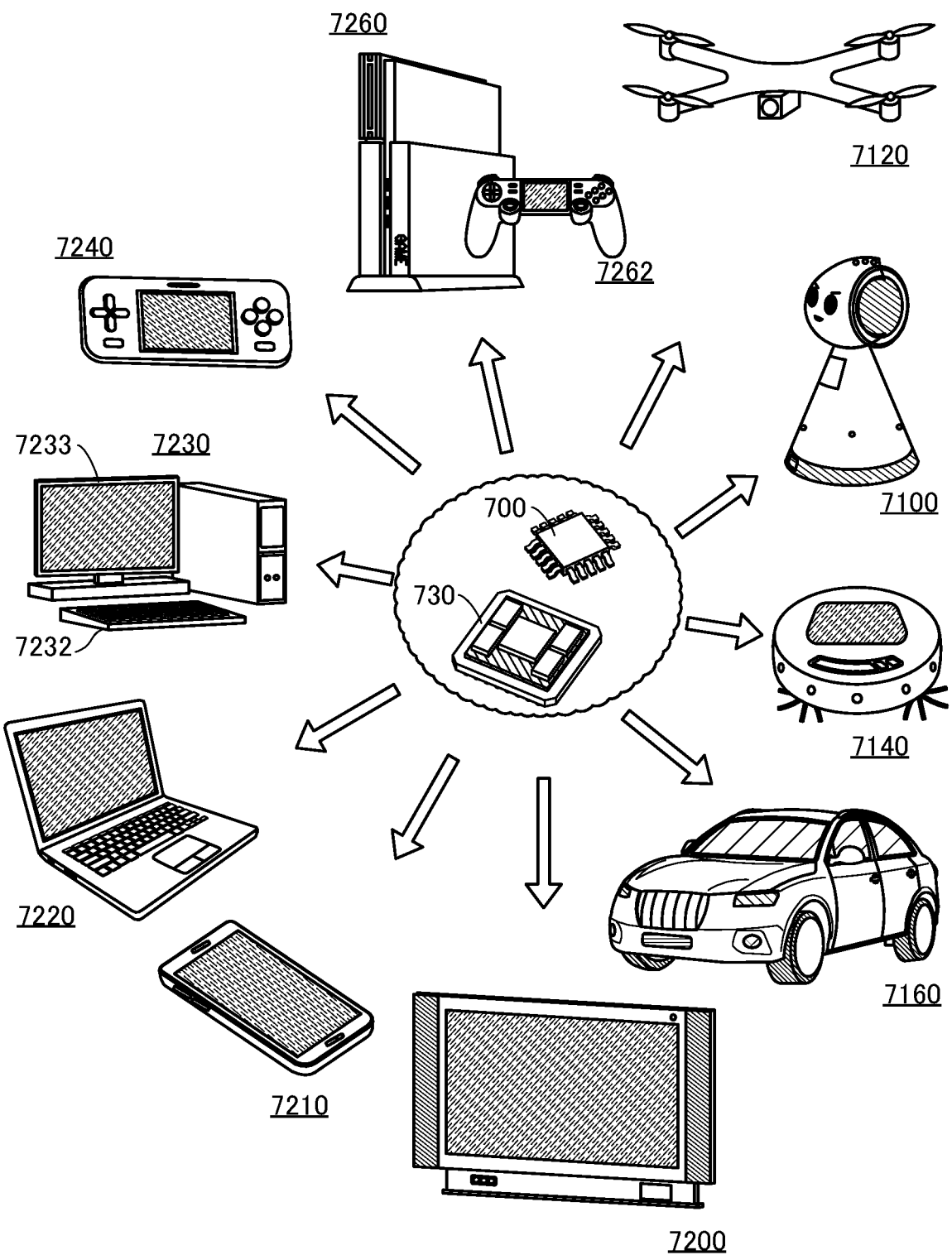
FIG. 27 Diagrams each illustrating an example of an electronic device of one embodiment of the present invention.

Next, examples of electronic devices including the above electronic component are described with reference to FIG. 27.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on the bottom surface.

For example, the electronic component 730 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs 7220 (personal computers) and 7230, a game console 7240, a game console 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 700 and/or the electronic component 730 can be incorporated in the controller 7262.

This embodiment can be implemented in an appropriate combination with the structures described in the other embodiments and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 28 schematically illustrates some structure examples of removable memory devices. The semiconductor device described in the above embodiment is processed into a packaged memory chip and used in a variety of storage devices and removable memories, for example.

Figure 28A:
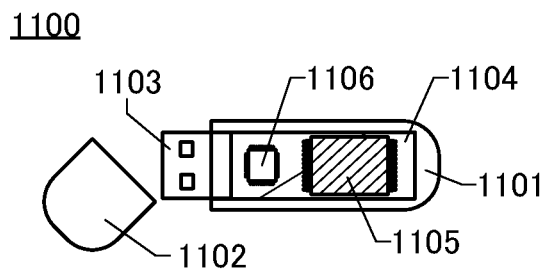
FIGS. 28A to 28E Diagrams illustrating application examples of a memory device of one embodiment of the present invention.

FIG. 28(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 28B:
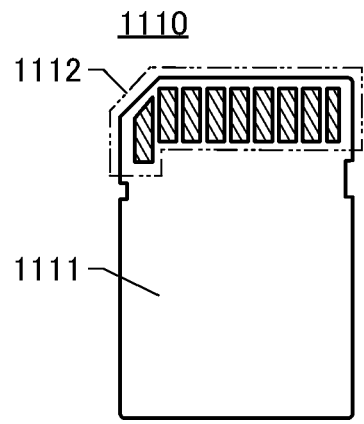
Figure 28C:
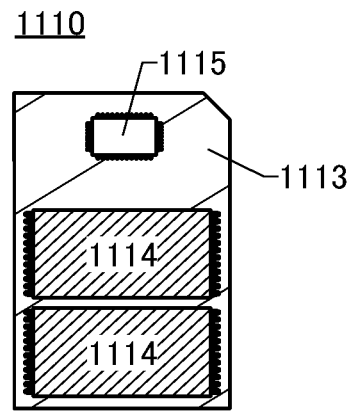

FIG. 28(B) is a schematic external view of an SD card, and FIG. 28(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 28D:
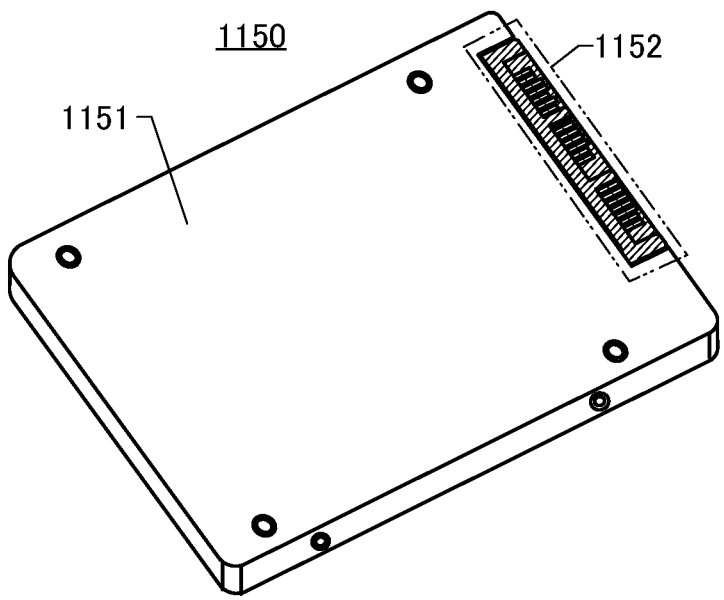
Figure 28E:
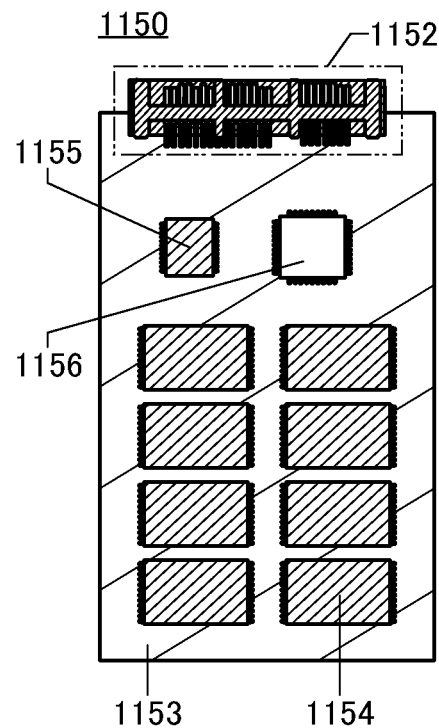

FIG. 28(D) is a schematic external view of an SSD, and FIG. 28(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

REFERENCE NUMERALS

200: transistor, 205: conductor, 210: insulator, 212: insulator, 214: insulator, 216: insulator, 218: conductor, 220: insulator, 222: insulator, 224: insulator, 230: oxide, 231: region, 232: region, 234: region, 240: conductor, 241: insulator, 242: conductor, 250: insulator, 253: region, 256: insulator, 260: conductor, 263: opening, 273: insulator, 274: insulator, 280: insulator, 281: insulator

The invention claimed is:

1. A semiconductor device comprising:
a first insulator;
a first oxide over the first insulator;
a first conductor and a second conductor over the first oxide, the first conductor and the second conductor being apart from each other;
a second insulator covering the first insulator, the first oxide, the first conductor, and the second conductor;
a third insulator over the second insulator;
a fourth insulator in contact with the first conductor, a side surface of the second conductor, a side surface of the second insulator, and a side surface of the third insulator;
a fifth insulator over the first oxide, the fifth insulator on an inner side of the fourth insulator;
a third conductor on an inner side of the fifth insulator; and
a sixth insulator over the third insulator, the fourth insulator, the fifth insulator, and the third conductor, the sixth insulator in contact with a top surface of the fourth insulator,
wherein a first part and a second part of the fourth insulator are apart from each other over the first oxide.

2. The semiconductor device according to claim 1, wherein the fourth insulator is in contact with a side surface of the first conductor and the side surface of the second conductor.

3. The semiconductor device according to claim 1, wherein the fourth insulator is in contact with the first oxide.

4. The semiconductor device according to claim 1,
wherein the first oxide contains In, an element M, and Zn, and
wherein M is Al, Ga, Y, or Sn.

5. The semiconductor device according to claim 1, wherein the fourth insulator contains at least one of hafnium and aluminum.

6. The semiconductor device according to claim 1, wherein the sixth insulator is in contact with the third conductor.

7. The semiconductor device according to claim 1,
wherein the second insulator has a stacked-layer structure including a first layer and a second layer,
wherein the first layer is in contact with the first insulator, and
wherein the second layer is in contact with the third insulator.

8. The semiconductor device according to claim 7,
wherein the first layer contains silicon nitride, and
wherein the second layer contains aluminum oxide.

9. A semiconductor device comprising:
a first insulator;
a first oxide over the first insulator;

a first conductor and a second conductor over the first oxide, the first conductor and the second conductor being apart from each other;

a second insulator covering the first insulator, the first oxide, the first conductor, and the second conductor;

a third insulator over the second insulator;

a fourth insulator in contact with the first conductor, a side surface of the second conductor, a side surface of the second insulator, and a side surface of the third insulator;

a second oxide in contact with the first oxide and an inner side of the fourth insulator;

a fifth insulator on an inner side of the second oxide;

a third conductor on an inner side of the fifth insulator; and a sixth insulator over the third insulator, the fourth insulator, the second oxide, the fifth insulator, and the third conductor.

10. The semiconductor device according to claim 9, wherein the fourth insulator is in contact with a side surface of the first conductor and the side surface of the second conductor.

11. The semiconductor device according to claim 9, wherein the fourth insulator is in contact with the first oxide.

12. The semiconductor device according to claim 9, wherein the first oxide contains In, an element M and Zn, and wherein M is Al, Ga, Y, or Sn.

13. The semiconductor device according to claim 9, wherein the fourth insulator contains at least one of hafnium and aluminum.

14. The semiconductor device according to claim 9, wherein the sixth insulator is in contact with the third conductor.

15. The semiconductor device according to claim 9, wherein the second insulator has a stacked-layer structure including a first layer and a second layer, wherein the first layer is in contact with the first insulator, and wherein the second layer is in contact with the third insulator.

16. The semiconductor device according to claim 15, wherein the first layer contains silicon nitride, and wherein the second layer contains aluminum oxide.

* * * * *